US010879695B2

(12) United States Patent
Matan et al.

(10) Patent No.: US 10,879,695 B2
(45) Date of Patent: Dec. 29, 2020

(54) GRID NETWORK GATEWAY AGGREGATION

(71) Applicant: XSLENT Energy Technologies, LLC, Novato, CA (US)

(72) Inventors: Stefan Matan, Novato, CA (US); Fred C Horton, Santa Rosa, CA (US); Frank P Marrone, Cloverdale, CA (US); Clayton Borzini, Novato, CA (US)

(73) Assignee: Apparent Labs, LLC, Novato, CA (US)

( * ) Notice: Subject to any disclaimer, the term of this patent is extended or adjusted under 35 U.S.C. 154(b) by 841 days.

(21) Appl. No.: 14/791,438

(22) Filed: Jul. 4, 2015

(65) Prior Publication Data

US 2016/0204606 A1    Jul. 14, 2016

Related U.S. Application Data

(60) Provisional application No. 62/021,085, filed on Jul. 4, 2014.

(51) Int. Cl.
*G05B 15/02* (2006.01)
*H02J 3/00* (2006.01)
(Continued)

(52) U.S. Cl.
CPC ............ *H02J 3/00* (2013.01); *G01R 19/2513* (2013.01); *G05B 15/02* (2013.01); *H02J 3/01* (2013.01);
(Continued)

(58) Field of Classification Search
CPC ...... G01R 11/54; G05B 13/026; G05B 15/02; G05F 1/66; G06G 7/635; H02J 13/0006;
(Continued)

(56) References Cited

U.S. PATENT DOCUMENTS 4,315,248 A   2/1982   Ward
4,752,697 A   6/1988   Lyons et al.
(Continued)

FOREIGN PATENT DOCUMENTS

CN    101677184 A    3/2010
EP     2515406 A1   10/2012
(Continued)

OTHER PUBLICATIONS

Australian Examination Report for Patent Application No. 2015283878, dated Feb. 2, 2018, 5 pages.
(Continued)

*Primary Examiner* — Abdelmoniem I Elamin
(74) *Attorney, Agent, or Firm* — Compass IP Law PC

(57) ABSTRACT

Distributed grid network intelligence enables data aggregation at a local control node. In a consumer node, a meter is on a consumer side of a point of common coupling (PCC). The meter can receive one or more external grid inputs and one or more local sensor inputs. The grid inputs can come from sources outside the PCC, and the local sensor inputs monitor conditions at the PCC and/or within the PCC. The meter can identify power demand within the PCC and calculate an output power to generate with a local power converter. The calculation is not simply based on power demand, but on aggregation information, including the one or more external grid inputs, the one or more local sensor inputs, and the power demand for the local load. The local power converter can then output power in accordance with the calculated output power.

20 Claims, 16 Drawing Sheets

(51) Int. Cl.
  *H02J 3/18* (2006.01)
  *G01R 19/25* (2006.01)
  *H02J 3/38* (2006.01)
  *H02J 3/01* (2006.01)
  *H02J 13/00* (2006.01)
  *H02J 3/46* (2006.01)
  *G01R 21/133* (2006.01)

(52) U.S. Cl.
  CPC .............. *H02J 3/1892* (2013.01); *H02J 3/38* (2013.01); *H02J 3/381* (2013.01); *H02J 3/46* (2013.01); *H02J 13/0079* (2013.01); *G01R 21/1331* (2013.01); *H02J 3/003* (2020.01); *Y02E 40/40* (2013.01); *Y02E 40/70* (2013.01); *Y04S 10/12* (2013.01)

(58) Field of Classification Search
  CPC ........ H02J 3/00; H02J 3/01; H02J 3/06; H02J 3/12; H02J 3/18; H02J 3/28; H02J 3/382; H02J 3/383; H02M 1/42; Y02B 70/3216; Y02E 40/40; Y02E 40/72; Y04S 10/123; Y04S 20/221; Y04S 20/224
  See application file for complete search history.

(56) References Cited

U.S. PATENT DOCUMENTS

| | | | |
|---|---|---|---|
| 5,731,965 A | 3/1998 | Cheng et al. | |
| 5,798,631 A | 8/1998 | Spee et al. | |
| 6,219,623 B1 | 4/2001 | Wills | |
| 6,281,601 B1 | 8/2001 | Edelman et al. | |
| 6,323,620 B1 | 11/2001 | Miyoshi et al. | |
| 6,697,951 B1 | 2/2004 | Sinha et al. | |
| 6,925,361 B1 | 8/2005 | Sinnock | |
| 7,633,284 B2 | 12/2009 | Ingram et al. | |
| 8,121,741 B2 | 2/2012 | Taft et al. | |
| 8,352,091 B2 | 1/2013 | Haugh | |
| 8,406,019 B2 | 3/2013 | Garces et al. | |
| 8,423,194 B2 | 4/2013 | Besore et al. | |
| 8,432,052 B2 | 4/2013 | Lu et al. | |
| 8,768,528 B2 | 7/2014 | Millar et al. | |
| 8,810,202 B2 | 8/2014 | Nomura | |
| 8,922,056 B2 | 12/2014 | Thisted | |
| 8,933,572 B1 | 1/2015 | Abdur-Rahim et al. | |
| 8,990,114 B2 * | 3/2015 | Terano | G06Q 30/06 307/24 |
| 9,046,077 B2 * | 6/2015 | Kirchner | F03D 7/0284 |
| 9,168,839 B2 | 10/2015 | Paupert | |
| 9,244,446 B2 * | 1/2016 | Bhageria | G05B 15/02 |
| 9,318,947 B2 | 4/2016 | Schauder et al. | |
| 9,325,173 B2 | 4/2016 | Varma et al. | |
| 9,368,968 B2 | 6/2016 | Schrock et al. | |
| 9,418,393 B2 | 8/2016 | Forbes | |
| 9,455,577 B2 * | 9/2016 | Bhageria | H02J 4/00 |
| 9,457,680 B2 | 10/2016 | Shinzaki et al. | |
| 9,469,203 B2 | 10/2016 | Momose et al. | |
| 9,473,042 B1 | 10/2016 | Chu et al. | |
| 9,515,491 B2 * | 12/2016 | Bhageria | H02J 4/00 |
| 9,639,074 B2 * | 5/2017 | Hibiya | G05B 15/02 |
| 9,640,997 B2 * | 5/2017 | Kurthakoti Chandrashekhara | H02J 3/382 |
| 9,656,567 B2 | 5/2017 | Kothavale et al. | |
| 9,685,887 B2 | 6/2017 | Martin | |
| 2002/0072868 A1 | 6/2002 | Bartone et al. | |
| 2002/0149953 A1 | 10/2002 | Smedley et al. | |
| 2003/0020333 A1 | 1/2003 | Ying | |
| 2003/0047209 A1 * | 3/2003 | Yanai | H02J 3/32 136/244 |
| 2003/0187550 A1 | 10/2003 | Wilson et al. | |
| 2004/0071000 A1 | 4/2004 | Escobar et al. | |
| 2004/0111226 A1 | 6/2004 | Brewster et al. | |
| 2004/0260488 A1 | 12/2004 | Al-Hamrani | |
| 2005/0212688 A1 | 9/2005 | Chung | |
| 2007/0005195 A1 | 1/2007 | Pasquale et al. | |
| 2007/0073445 A1 | 3/2007 | Gonzalez et al. | |
| 2007/0135970 A1 | 6/2007 | Zhou et al. | |
| 2008/0106098 A1 | 5/2008 | Miller et al. | |
| 2008/0143290 A1 | 6/2008 | Chavakula | |
| 2008/0167756 A1 | 7/2008 | Golden et al. | |
| 2008/0211230 A1 | 9/2008 | Gurin | |
| 2009/0096211 A1 | 4/2009 | Stiesdal | |
| 2009/0200988 A1 | 8/2009 | Bridges et al. | |
| 2009/0200994 A1 | 8/2009 | Fornage | |
| 2010/0076613 A1 | 3/2010 | Imes | |
| 2010/0138063 A1 | 6/2010 | Cardinal et al. | |
| 2010/0179704 A1 | 7/2010 | Ozog | |
| 2010/0187914 A1 | 7/2010 | Rada et al. | |
| 2010/0208501 A1 | 8/2010 | Matan et al. | |
| 2010/0217451 A1 | 8/2010 | Kouda et al. | |
| 2010/0238003 A1 | 9/2010 | Chan et al. | |
| 2010/0306027 A1 | 12/2010 | Haugh | |
| 2010/0308585 A1 | 12/2010 | Jorgensen et al. | |
| 2011/0074152 A1 | 3/2011 | Yasugi | |
| 2011/0088748 A1 | 4/2011 | Lee | |
| 2011/0103110 A1 | 5/2011 | Godridge et al. | |
| 2011/0130889 A1 | 6/2011 | Khajehoddin et al. | |
| 2011/0198846 A1 | 8/2011 | Wakasa et al. | |
| 2011/0202418 A1 | 8/2011 | Kempton et al. | |
| 2011/0204717 A1 | 8/2011 | Shaffer | |
| 2011/0285130 A1 | 11/2011 | Thisted | |
| 2011/0316480 A1 | 12/2011 | Mills-Price et al. | |
| 2012/0029720 A1 | 2/2012 | Cherian et al. | |
| 2012/0049629 A1 | 3/2012 | Miller et al. | |
| 2012/0053741 A1 | 3/2012 | Beyerle et al. | |
| 2012/0059527 A1 | 3/2012 | Beaston et al. | |
| 2012/0086273 A1 | 4/2012 | Rognli | |
| 2012/0197449 A1 | 8/2012 | Sanders | |
| 2012/0205981 A1 | 8/2012 | Varma et al. | |
| 2012/0245744 A1 | 9/2012 | Prosser et al. | |
| 2012/0249048 A1 | 10/2012 | Nishibayashi et al. | |
| 2012/0271470 A1 | 10/2012 | Flynn et al. | |
| 2012/0310559 A1 | 12/2012 | Taft | |
| 2012/0326503 A1 | 12/2012 | Birkelund | |
| 2013/0015708 A1 | 1/2013 | Ukita et al. | |
| 2013/0015713 A1 | 1/2013 | Hagihara | |
| 2013/0018516 A1 | 1/2013 | Chee et al. | |
| 2013/0043725 A1 * | 2/2013 | Birkelund | G06Q 10/04 307/24 |
| 2013/0076140 A1 | 3/2013 | Darden et al. | |
| 2013/0111494 A1 * | 5/2013 | Hyser | G06F 9/5094 718/105 |
| 2013/0131878 A1 | 5/2013 | Wilkins et al. | |
| 2013/0154570 A1 | 6/2013 | Nomura | |
| 2013/0162215 A1 | 6/2013 | Cooper | |
| 2014/0012427 A1 | 1/2014 | Katayama et al. | |
| 2014/0052310 A1 | 2/2014 | Baba et al. | |
| 2014/0070617 A1 | 3/2014 | Detmers et al. | |
| 2014/0078625 A1 | 3/2014 | Zheng et al. | |
| 2014/0094985 A1 * | 4/2014 | Hibiya | H01M 10/44 700/297 |
| 2014/0103727 A1 | 4/2014 | Taimela et al. | |
| 2014/0114844 A1 | 4/2014 | Forbes | |
| 2014/0121849 A1 | 5/2014 | Ansari et al. | |
| 2014/0129160 A1 | 5/2014 | Tran | |
| 2014/0156095 A1 | 6/2014 | Rouse et al. | |
| 2014/0159485 A1 | 6/2014 | Daniel et al. | |
| 2014/0176090 A1 | 6/2014 | Harjeet et al. | |
| 2014/0225457 A1 | 8/2014 | Elliott | |
| 2014/0265695 A1 * | 9/2014 | Thompson | H02K 47/00 310/113 |
| 2014/0306533 A1 | 10/2014 | Paquin et al. | |
| 2014/0376278 A1 | 12/2014 | Fornage et al. | |
| 2014/0379156 A1 | 12/2014 | Kamel et al. | |
| 2015/0120070 A1 | 4/2015 | Tarnowski | |
| 2015/0186904 A1 * | 7/2015 | Guha | G06Q 50/06 705/7.26 |
| 2015/0236510 A1 | 8/2015 | Recio et al. | |
| 2015/0270712 A1 | 9/2015 | Kanayama et al. | |
| 2015/0357815 A1 | 12/2015 | Luh et al. | |
| 2015/0364919 A1 | 12/2015 | Schumer et al. | |
| 2016/0087439 A1 | 3/2016 | Matan et al. | |

(56) References Cited

U.S. PATENT DOCUMENTS

| | | | |
|---|---|---|---|
| 2016/0091912 A1 | 3/2016 | Stanlake | |
| 2017/0005515 A1 | 1/2017 | Sanders et al. | |
| 2017/0155249 A1* | 6/2017 | Thompson | H02J 3/383 |

FOREIGN PATENT DOCUMENTS

| | | | |
|---|---|---|---|
| JP | 2012130243 A | 7/2012 | |
| JP | 2013544063 A | 12/2013 | |
| WO | 2009083448 A2 | 7/2009 | |
| WO | 2011032265 A1 | 3/2011 | |
| WO | 2012015507 A1 | 2/2012 | |
| WO | 2012058114 A2 | 5/2012 | |
| WO | 2014019055 A1 | 2/2014 | |

OTHER PUBLICATIONS

Australian Examination Report for Patent Application No. 2015283879, dated Feb. 17, 2017, 3 pages.
Extended European Search Report for Patent Application No. 15814562.3, dated Jan. 31, 2018, 6 pages.
Extended European Search Report for Patent Application No. 15814617.5, dated Jan. 31, 2018, 6 pages.
Final Office Action for U.S. Appl. No. 14/791,429, dated Dec. 20, 2017, 14 pages.
Final Office Action for U.S. Appl. No. 14/791,435, dated Mar. 2, 2018, 16 pages.
Final Office Action for U.S. Appl. No. 14/791,436, dated Mar. 5, 2018, 18 pages.
Final Office Action for U.S. Appl. No. 14/791,437, dated Mar. 8, 2018, 12 pages.
Final Office Action for U.S. Appl. No. 14/791,439, dated Jan. 25, 2018, 47 pages.
Final Office Action for U.S. Appl. No. 14/791,440, dated Jan. 25, 2018, 62 pages.
Final Office Action for U.S. Appl. No. 14/791,441, dated Feb. 5, 2018, 63 pages.
Final Office Action for U.S. Appl. No. 14/791,442, dated Feb. 2, 2018, 68 pages.
International Preliminary Report on Patentability, PCT/US2015/039230, dated Jan. 19, 2017, 15 pages.
International Preliminary Report on Patentability, PCT/US2015/039232, dated Jan. 19, 2017, 13 pages.
International Search Report and Written Opinion for PCT Patent Application No. PCT/US2015/039230, dated Sep. 30, 2015, 16 pages.
International Search Report and Written Opinion for PCT Patent Application No. PCT/US2015/039232, dated Sep. 24, 2015, 14 pages.
Korean and English Translation of Korean Office Action for Patent Application No. 10-2017-7003169, dated Mar. 15, 2018, 6 pages.
Korean and English Translation of Korean Office Action for Patent Application No. 10-2017-7003170, dated Mar. 15, 2017, 3 pages.
Moroccan Search Report for Patent Application No. 39560, dated Oct. 24, 2017, 6 pages.
Moroccan Search Report for Patent Application No. 39561, dated Sep. 21, 2017, 6 pages.
Notice of Allowance for U.S. Appl. No. 14/791,432, dated Dec. 26, 2017, 8 pages.
Notice of Allowance for U.S. Appl. No. 14/791,434, dated Feb. 16, 2018, 10 pages.
NPL—P. Sheaffer, et al., Universal Interconnection Technology Workshop Proceedings, [on line]. NREL/ BK-560-32865. Colorado: National Renewable Energy Laboratory, U.S. Department of Energy Laboratory Operated by Midwest Research Institute, 2002 [retrieved on Jun. 7, 2017]. Retrieved from the Internet:< URL: https://www.researchgate.net/publication/25519894.
Office Action for U.S. Appl. No. 14/791,429, dated Aug. 30, 2017, 13 pages.
Office Action for U.S. Appl. No. 14/791,431, dated Oct. 3, 2017, 7 pages.
Office Action for U.S. Appl. No. 14/791,432, dated Aug. 31, 2017, 12 pages.
Office Action for U.S. Appl. No. 14/791,433, dated Jan. 8, 2018, 8 pages.
Office Action for U.S. Appl. No. 14/791,434, dated Sep. 25, 2017, 12 pages.
Office Action for U.S. Appl. No. 14/791,435, dated Sep. 21, 2017, 24 pages.
Office Action for U.S. Appl. No. 14/791,436, dated Oct. 10, 2017, 16 pages.
Office Action for U.S. Appl. No. 14/791,437, dated Oct. 13, 2017, 10 pages.
Office Action for U.S. Appl. No. 14/791,439, dated Jun. 1, 2017, 39 pages.
Office Action for U.S. Appl. No. 14/791,440, dated Jun. 15, 2017, 68 pages.
Office Action for U.S. Appl. No. 14/791,441, dated Jun. 26, 2017, 73 pages.
Office Action for U.S. Appl. No. 14/791,442, dated Jun. 27, 2017, 74 pages.
Office Action for U.S. Appl. No. 14/791,422, dated Jun. 28, 2018, 82 pages.
Office Action for U.S. Appl. No. 14/791,429, dated May 24, 2018, 14 pages.
Office Action for U.S. Appl. No. 14/791,435, dated Jul. 6, 2018, 14 pages.
Office Action for U.S. Appl. No. 14/791,436, dated Jul. 23, 2018, 19 pages.
Office Action for U.S. Appl. No. 14/791,437, dated Aug. 1, 2018, 12 pages.
Office Action for U.S. Appl. No. 14/791,439, dated Jul. 11, 2018, 47 pages.
Office Action for U.S. Appl. No. 14/791,440, dated Jun. 28, 2018, 65 pages.
Office Action for U.S. Appl. No. 14/791,441, dated Jun. 28, 2018, 74 pages.
Australian Second Examination Report for Patent Application No. 2015283878, dated Jan. 21, 2019, 3 pages.
Australian Second Examination Report for Patent Application No. 2015283879, dated Nov. 12, 2018, 3 pages.
Chinese Translation of P.R. China State Intellectual Property Office First Office Action for Patent Application No. 201880047630.7, dated Jun. 21, 2019, 15 pages.
European Office Action for Patent Application No. 15814562.3, dated Aug. 30, 2018, 3 pages.
European Office Action for Patent Application No. 15814617.5, dated Aug. 30, 2018, 3 pages.
European Second Office Action for Patent Application No. 15814562.3, dated Apr. 16, 2019, 4 pages.
European Second Office Action for Patent Application No. 15814617.5, dated Apr. 16, 2019, 4 pages.
Final Office Action for U.S. Appl. No. 14/791,429, dated Oct. 22, 2018, 13 pages.
Final Office Action for U.S. Appl. No. 14/791,435, dated Nov. 9, 2018, 11 pages.
Final Office Action for U.S. Appl. No. 14/791,439, dated Feb. 28, 2019, 46 pages.
Final Office Action for U.S. Appl. No. 14/791,440, dated Jan. 10, 2019, 64 pages.
Final Office Action for U.S. Appl. No. 14/791,441, dated Jan. 10, 2019, 67 pages.
Final Office Action for U.S. Appl. No. 14/791,442, dated Jan. 10, 2019, 75 pages.
Korean and English Translation of Korean Second Office Action for Patent Application No. 10-2017-7003170, dated Sep. 28, 2018, 26 pages.
Korean Second Office Action for Patent Application No. 10-2017-7003169, dated Sep. 28, 2018, 19 pages.
Mexico First Office Action for Patent Application No. MX/a/2017/000207, dated Mar. 28, 2019, 4 pages.

(56) References Cited

OTHER PUBLICATIONS

Australian First Examination Report for Patent Application No. 2019200738, dated Dec. 20, 2019, 3 pages.
European Third Office Action for Patent Application No. 15814562. 3, dated Dec. 20, 2019, 4 pages.
European Third Office Action for Patent Application No. 15814617. 5, dated Dec. 17, 2019, 4 pages.
English Translation of Japanese First Office Action for Patent Application No. 2017-500031, dated Oct. 3, 2019, 3 pages.
Examiners Answer to Appeal Brief for U.S. Appl. No. 14/791,440, dated Nov. 13, 2019, 19 pages.
Examiners Answer to Appeal Brief for U.S. Appl. No. 14/791,441, dated Nov. 13, 2019, 19 pages.
Examiners Answer to Appeal Brief for U.S. Appl. No. 14/791,442, dated Nov. 13, 2019, 19 pages.
First Office Action for U.S. Appl. No. 16/413,387, dated Oct. 24, 2019, 16 pages.
Japanese and English Translation of Japanese First Office Action for Patent Application No. 2017-500018, dated Sep. 11, 2019, 5 pages.

* cited by examiner

GRID NETWORK GATEWAY AGGREGATION

PRIORITY

The present application is a nonprovisional application based on U.S. Provisional Application No. 62/021,085, filed Jul. 4, 2014, and claims the benefit of priority of that provisional application. The provisional application is hereby incorporated by reference.

The present application is related to the following U.S. patent applications filed concurrently herewith, and having common ownership: Pending U.S. patent application Ser. No. 14/791,429, entitled "HIERARCHICAL AND DISTRIBUTED POWER GRID CONTROL," U.S. patent application Ser. No. 14/791,431, now U.S. Pat. No. 10,063,055, entitled "DISTRIBUTED POWER GRID CONTROL WITH LOCAL VAR CONTROL," U.S. patent application Ser. No. 14/791,432, now U.S. Pat. No. 9,960,601, entitled "DISTRIBUTED POWER GRID CONTROL WITH LOCAL VAR GENERATION" U.S. patent application Ser. No. 14/791,433, now U.S. Pat. No. 10,158,232, entitled "TOTAL HARMONIC CONTROL," U.S. patent application Ser. No. 14/791,434, now U.S. Pat. No. 10,003,196, entitled "ENERGY SIGNATURES TO REPRESENT COMPLEX CURRENT VECTORS," Pending U.S. patent application Ser. No. 14/791,435, entitled "POWER GRID SATURATION CONTROL WITH DISTRIBUTED GRID INTELLIGENCE," Pending U.S. patent application Ser. No. 14/791,436, entitled "VIRTUAL POWER GRID," and Pending U.S. patent application Ser. No. 14/791,437, entitled "MODULAR POWER GRID".

The present application is related to the following U.S. patent applications filed concurrently herewith, and having common ownership: Pending U.S. patent application Ser. No. 14/791,439, entitled "INTELLIGENT BATTERY BACKUP AT A DISTRIBUTED GRID NODE," Pending U.S. patent application Ser. No. 14/791,440, now abandoned, entitled "LOCAL METERING RESPONSE TO DATA AGGREGATION IN DISTRIBUTED GRID NODE," Pending U.S. patent application Ser. No. 14/791,441, now abandoned, entitled "DATA AGGREGATION WITH OPERATION FORECASTS FOR A DISTRIBUTED GRID NODE," Pending U.S. patent application Ser. No. 14/791,442, now abandoned, entitled "DATA AGGREGATION WITH FORWARD PREDICTION FOR A DISTRIBUTED GRID NODE."

FIELD

Embodiments of the invention are generally related to an electrical power grid, and more particularly to a power grid gateway that generates control decision based on aggregation of data.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2015, Apparent Inc., All Rights Reserved.

BACKGROUND

Traditional utility power grids include a centralized power source (such as a coal-powered generator, a nuclear-power generator, a hydroelectric dam generator, wind farm, or others) and centralized management. The "grid" may connect to other power sources as well so that power can be shared across grid infrastructure from different power sources at a macro-level. However, traditionally, the grid includes a substantial amount of infrastructure, such as utility power lines with associated poles and towers, as well as substations to distribute the power. The grid is traditionally based on a massive generator that can provide enough power to satisfy peak demand of interconnected consumers. A consumer can include a dwelling place, a business, a cellphone tower or other utility box, or other user of power. The different consumers can have different peak demands, from the smallest user of energy to large businesses that have high power demands for heavy commercial equipment.

Traditional grid infrastructure is expensive to build and maintain. Furthermore, it requires the pushing of energy out from the central power source to the consumers, which can be hundreds of miles away. The substations and other infrastructure such as neighborhood transformers are controlled by the centralized management to keep voltages in-phase with current delivered on the grid, and keep voltage levels at regulated levels. Typically, motorized equipment drawing power from the grid will cause a degradation of power factor of the grid. On a macro scale, the grid management has attempted to control the power factor disturbance of the grid due to such motorized equipment. Newer switching power supply designs in modern electronics further complicate the power factor and voltage regulation of the grid by requiring reactive power and introducing noise back onto the grid.

Power delivered by the grid generally consists of a real power component and a reactive power component. Real power is power delivered where the voltage waveform and current waveform are perfectly aligned in-phase. Reactive power is power delivered where the voltage waveform and current waveform are not phase-aligned. Reactive power can be leading or lagging, based on the phase difference between the current and voltage waveforms.

Power as seen by a consumer can be understood differently from energy itself provided to calculate the power. Power is typically represented by W dot h or Watt-hours. Multiplying the Watt-hours by the rate charged by the utility provides the dollar amount owed by the consumer to the utility. But energy can be represented in different ways, and can be measured in multiple different ways. Examples include (VA) V dot I (voltage vector multiplied by current vector for volt-amps), V dot I dot PF (voltage vector multiplied by current vector times the power factor for Watts), and the square root of W^2 (square root of Watts squared for volt-amps-reactive). The consumer typically sees the power in Watt-hours which gives the cost of the energy delivered to the premises. Utilities have also started to measure and charge for reactive power consumption at the user premises.

There has been a significant increase in grid consumers adding renewable sources locally at the consumer locale to produce power. The renewable energy sources tend to be solar power and/or wind power, with a very significant number of solar systems being added. One limitation to customer power sources is that they tend to produce power at the same time, and may produce more power than can be used on the grid. The grid infrastructure is traditionally a one-way system, and the real power pushed back from the customer premises toward the central management and the central power source can create issues of grid voltage control and reactive power instability on the grid. These issues have caused grid operators to limit the amount of renewable energy that can be connected to the grid. In some cases, additional hardware or grid infrastructure is required at or near the consumer to control the flow of power back onto the grid.

In addition to the issues caused by renewable sources, the increase in use of air conditioning units and other loads that draw heavily on reactive power create additional strain for the grid management to keep voltage levels at needed levels. Recent heat waves have resulted in rolling brownouts and blackouts. Other times there are temporary interruptions on the grid as equipment interfaces are reset to deal with the changes in load when people return home from work and increase power consumption there. Traditionally, the central management must maintain compliance of grid regulations (such as voltage levels). Whenever something connected to the grid enters an overvoltage scenario, it shuts off from the grid, which can then create additional load on surrounding areas, resulting in larger areas of the grid coming down before the central management can restore grid stability.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
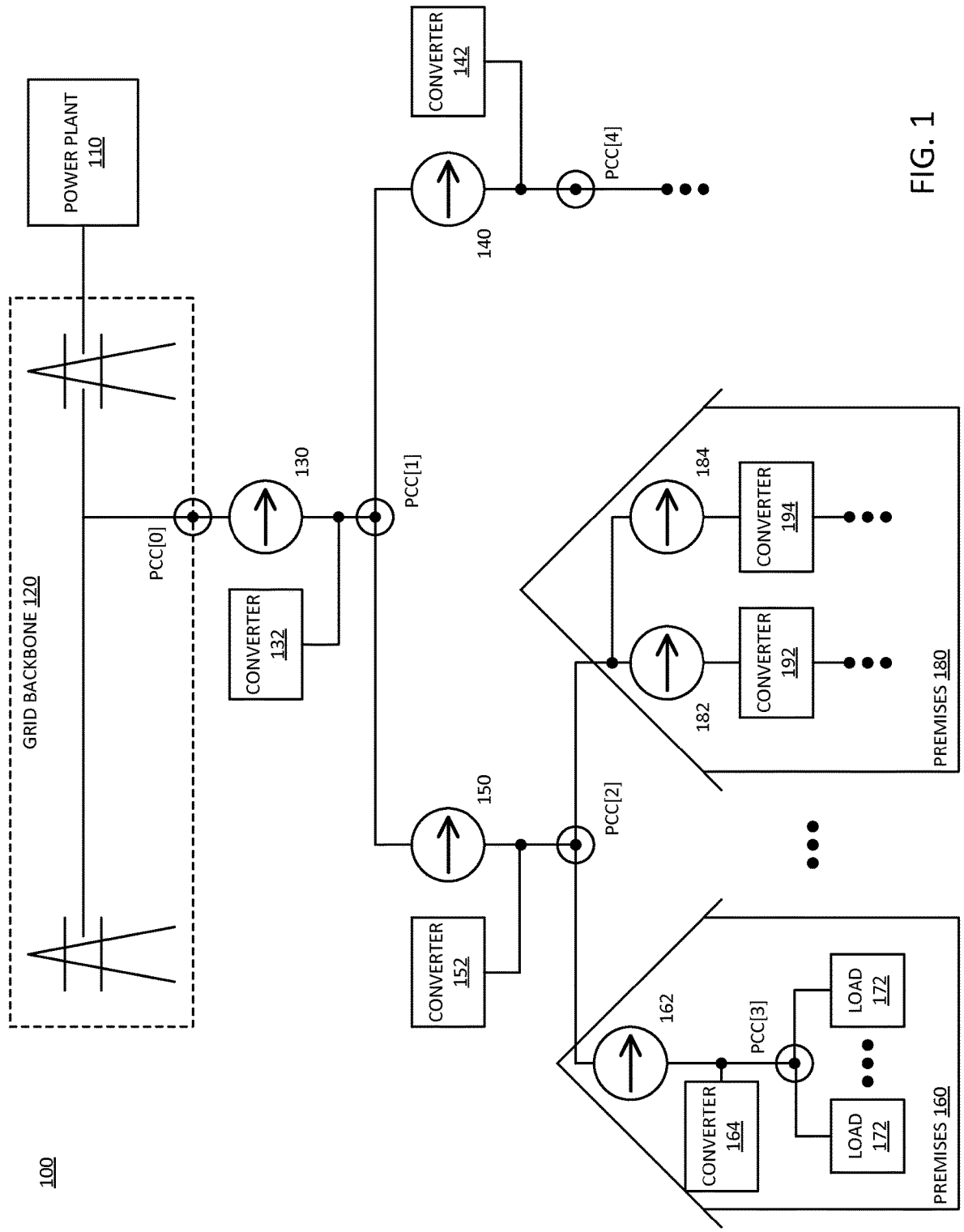
FIG. 1 is a block diagram of an embodiment of a system with tiered grid control.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, distributed grid network intelligence enables data aggregation at a local control node. In a consumer node, a meter is on a consumer side of a point of common coupling (PCC). The meter can receive one or more external grid inputs and one or more local sensor inputs. The grid inputs can come from sources outside the PCC, and the local sensor inputs monitor conditions at the PCC and/or within the PCC. The meter can identify power demand within the PCC and calculate an output power to generate with a local power converter. The calculation is not simply based on power demand, but on aggregation information, including the one or more external grid inputs, the one or more local sensor inputs, and the power demand for the local load. The local power converter can then output power in accordance with the calculated output power.

In one embodiment, a control node enables distributed grid control. Multiple independent control nodes can be distributed throughout the grid. The control nodes can be hierarchically organized by connecting multiple control nodes to a common control node of the multiple control nodes. Each control node manages a point of common coupling (PCC) to the grid. A PCC is an interconnection point where multiple downstream loads and/or local power sources connect to the grid. For purposes herein, each control node couples to multiple loads and/or energy sources, and is thus associated with a PCC. Because each control node manages its interface or interconnection to the grid independently of any other control node, grid control intelligence can be distributed throughout the grid.

In one embodiment, each control node operates independently of other control nodes by monitoring and managing power generation and power demand at its PCC between a utility power grid and all devices downstream from the PCC or from the control node. The downstream devices can include energy sources such as solar and/or wind power generation, loads such as real and/or reactive power consumers (e.g., consumer nodes), as well as other PCCs or other control nodes. In one embodiment, each control node manages its interface or interconnection to the grid to maintain compliance with grid regulations. In one embodiment, the control node has any number of consumer nodes and any number of energy sources connected downstream. A consumer node can be a customer premises. In one embodiment, a customer premises can include multiple consumer nodes. In one embodiment, a consumer node can include multiple customer premises. In one embodiment, one control node manages multiple customer premises. Each control node can monitor power generation and power demand from downstream and ensure that demand on the grid is within accepted levels. The control node can provide grid control by adjusting the interface between the control node and the central grid management via the PCC to maintain compliance with grid regulations at the PCC.

In one embodiment, the control node adjusts downstream active power consumption. In one embodiment, the control node adjusts downstream reactive power consumption. In one embodiment, the control node adjusts downstream reactive power generation. In one embodiment, the control node adjusts downstream active power generation. In one embodiment, the control node controls energy at the PCC to manage the amount and types of power seen at the PCC from the perspective of the grid (i.e., from the grid side or as seen from central grid management or the grid infrastructure looking downstream through the PCC).

FIG. 1 is a block diagram of an embodiment of a system with tiered grid control. System 100 represents a power grid with tiered control. In one embodiment, system 100 includes power plant 110 and grid backbone 120, although in one embodiment, the tiered grid can be applied without connection to a central grid management and central grid power plant. System 100 represents a grid system in which power consumers are connected to each other and to power sources.

Power plant 110 represents a large-scale power plant that powers grid backbone 120. Power plant 110 is traditionally a hydroelectric dam generator, a nuclear power plant, a coal-powered generator plant, or a large wind farm. Recent large-scale solar farms have also been added. Grid backbone 120 includes towers, lines, transformers, substations, and other infrastructure to interconnect consumers to power plant 110. Grid backbone 120 includes grid infrastructure with high voltage power lines that transport power many miles. In practice, multiple power sources or power plants can be connected to the same grid backbone 120, but all are large scale and typically designed to generate as much power and service as many consumers as possible. Grid backbone 120 is traditionally designed for one-way distribution of power from power plant 110 to the consumers. Reference to "the grid" or a "utility grid" can refer to power plant 110 and the infrastructure of grid backbone 120.

In one embodiment, the grid can be thought of as a network that can be hierarchically separated into various different segments of the grid. Each grid segment can be controlled by a separate control node. In one embodiment, system 100 includes control nodes 130, 140, and 150. Each control node can manage a PCC or point of common coupling point where multiple loads and/or multiple sub-segments of the grid couple together. The PCCs can connect each segment and sub-segment to each other and/or to the grid.

It will be understood that a PCC can be both an electrical-equivalency point as well as or instead of a geographical connection. At the top of the hierarchy illustrated is PCC[0], which directly connects all downstream segments and portions to each other. PCC[0] can also connect all downstream point to grid backbone 120. Reference to "downstream" refers to devices or items that are farther away along the path of distribution. Thus, a residence or customer premises can be at one point on the distribution path of the grid, and a customer premises further along the distribution path is downstream. It will be understood that other grid segments with additional structure can be downstream from PCC[0] by virtue of being farther away from power plant 110 and thus farther down a distribution path as seen from central grid management.

System 100 can be referred to as a grid network, which may or may not include grid backbone 120 and power plant 110. The grid network can be hierarchical in that each PCC can aggregate multiple lower-level PCCs. Each PCC provides a connection point for all downstream devices. PCC[0] is at the top of the hierarchy of system 100. In one embodiment, multiple additional devices that are not shown can connect to PCC[0]. Such other devices not shown would be coupled in parallel with node 130 to PCC[0]. It will be understood that a lowest level of the grid network hierarchy is a control node at a customer premises, such as node 162 at customer premises 160, with PCC[3]. In one embodiment, there are one or more control nodes at a customer premises. In one embodiment, there are customer premises with no control nodes in system 100.

In system 100, two customer premises are illustrated, customer premises 160 and customer premises 180. The customer premises can also be referred to as consumers or consumer nodes. In one embodiment, customer premises can include homes, businesses, parks, loads, thermostats, pumps, vehicle charging stations, and/or other consumers of power. Each customer premises includes one or more loads or devices that rely on electrical power to operate. In one embodiment, customer premises 160 includes a single control node, 162. In one embodiment, customer premises 180 includes multiple control nodes, 182 and 184. There can be zero or more control nodes at a customer premises. There may be many control nodes at a single customer premises, depending on the design of the grid network and the number of loads and power sources at the customer premises. Other customer premises can be included in system 100. Zero or more of the customer premises can include energy generation, which is described in more detail below with respect to other drawings.

In one embodiment, each PCC is associated with a control node. The control node associated with the PCC manages or controls the electrical operation at that control node. For example, in one embodiment, in system 100, control node 130 is associated with PCC[1], and manages load demand and power generation downstream from PCC[1] as seen at PCC[1] from the grid side. Reference to looking from the grid side, or seeing from the grid side refers to what net power demand (either power needed or power produced) exists at that point. Seeing from the grid side can also refer to what phase offset or reactive power net exists at that point looking downstream from that point. The PCCs are aggregation points for generation and demand. A net power demand can be a difference in real and reactive power needed based on load demand against real and reactive power generated within the same segment or area of the PCC. Within the same segment can be referred to as being "within" a PCC, meaning within a downstream network connected to the PCC.

In one embodiment, each control node can independently control its own PCC. Thus, control node 130 controls PCC[1], control node 150 controls PCC[2], control node 140 controls PCC[4], and control node 162 controls PCC[3]. In one embodiment, independent control refers to the fact that each control node monitors and controls operation at its PCC to maintain the PCC as close to compliance with grid rules as possible. It may not always be possible for each control node to achieve full compliance. In one embodiment, the control nodes operate based on what neighboring control nodes output, such as what demand is seen looking toward the neighboring control node from the present control node. However, controlling operation by looking at the operation of another control node does not imply that the operation of each control node is dependent on each other. To the contrary, in one embodiment, each control node seeks to make sure that the node as a whole (everything connected "underneath" or downstream from it) complies with all requirements, regardless of the operation of others. Monitoring the performance or operation of neighboring control nodes or neighboring PCCs can be a consideration to determine how to operate, and whether to provide support upstream to the grid. In one embodiment, each control node is capable of receiving and responding to input from a central data center and/or from central grid management, but can operate with or without such input. Thus, each control node operates independently to control the net power operation as seen at its connection point.

In one embodiment, each control node includes a converter or inverter device and a metering device. In one embodiment, the converter is referred to as a power conversion device or simply conversion device. Reference to a converter can include one or multiple converters that can operate together to control operation and/or an interface at a PCC. In one embodiment, the control node and converter are separate devices. Thus, converter 132 can be part of control node 130, or simply connected to it at PCC[1]. Similarly, converter 142 is associated with control node 140, converter 152 is associated with control node 150, converter 164 is associated with control node 162, converter 192 is associated with control node 182, and converter 194 is associated with control node 184. Other network configurations are possible. It will be understood that the entirety of system 100 is not illustrated.

As mentioned, each customer premises can be or include a load. Customer premises 160 includes one or more loads 172. Each load 172 consumes power. Loads 172 can generate a demand for power that has a real power component to the demand and a reactive power component to the demand. Traditionally reactive power has been provided by the grid, with the exception of heavy equipment (e.g., capacitor banks and/or inductive motors) on-site at the customer premises. Loads 172 can be any form of load, such as lighting, computer equipment, entertainment devices, motors, HVAC (heating, ventilation, and air conditioning) equipment, household and kitchen appliances, or any other type of device that requires electricity to operate. Such devices can include rechargeable devices that are charged by plugging to a power outlet. Many of these devices generate reactive demand. That demand for reactive power will be seen at the PCC for the load, and can be seen upstream at other PCCs unless the demand is satisfied. In one embodiment, node 162 and converter 164 can provide reactive power for loads 172.

It will be understood that there are loads (not specifically shown) within customer premises 180. In one embodiment, converter 164 is coupled to PCC[3] where loads 172 are coupled. In one embodiment, converter 192 and converter 194 can be coupled between the loads and the PCC (PCC [2]). Converter 164 is coupled to PCC[3], and can be configured to operate to maintain certain performance parameters at PCC[3]. In one embodiment, in practice, converter 164 is coupled between PCC[3] and a meter of control node 162. The performance parameters can be associated with controlling real and reactive power at the PCC. In one embodiment, when a converter is coupled between the loads and the PCC, the converter is configured to maintain the particular load or loads coupled to it.

In one embodiment, each control node includes a metering device or energy meter built into or associated with or part of the control node. More details about embodiments of a metering device are provided below. The metering device measures energy usage at the PCC and can determine a net power demand or power generation from downstream. In one embodiment, the metering device enables monitoring the operation of the grid network at the PCC. In one embodiment, the metering device can measure energy signatures. Each converter can control the power usage at the PCC. In one embodiment, the converter controls the use of real and/or reactive power at the PCC.

In one embodiment, the grid hierarchy of system 100 can include one or more control nodes at a consumer premises, one or more control nodes within a neighborhood, one or more control nodes at a substation, or other hierarchy. Each control node in the hierarchy independently controls operation below it and reports upstream. Thus, each control node can independently manage compliance of the grid. If a segment of the grid network experiences a failure, a node higher up the hierarchy or higher upstream can attempt to adjust operation to prevent the failure from being seen or experienced outside the subnetwork below its PCC. Thus, a distributed grid can recover more quickly and efficiently from failures, and can reduce the risk that other segments of the grid will experience failure. For example, each distributed control node of the grid network can dynamically adjust reactive and real power consumption to maintain the connection at its PCC in compliance with connection requirements for the grid.

In one embodiment, each distributed control node of system 100 can control how the grid or grid network sees the segment of the grid via the associated PCC. Thus, control node 130 can control how the grid sees everything downstream from PCC[1], control node 150 can control how the grid or grid network sees everything downstream from PCC[3], and so on. The ability to control how the grid sees a segment of the grid via a PCC can allow more adaptive behavior within a segment of the grid network. For example, whereas current regulations would require certain inverters to drop offline because of the violation of certain conditions (overvoltage, overcurrent, islanding, and/or other condition(s)), controlling the connection of the PCC to the grid allows the grid to see the segment only through the PCC. Thus, each control node can control its connection to the grid network at the PCC, which can allow inverters to stay online longer to try to recover. Each inverter downstream from a PCC could in theory temporarily violate the passthrough requirements and/or overvoltage requirements for a period if collectively the devices connected to the PCC comply. In one embodiment, if the control node and converter at a PCC can cause support from other converters to be provided, or behavior changed at those converters to alter the net condition at the PCC, each inverter could similarly temporarily violate grid conditions while the control node maintains the PCC within compliance by changing operation of other devices within the PCC.

In one embodiment, distributed control or a grid or grid network includes pushing the point of common coupling out in the case of a disruption to the grid. Consider a problem at PCC[2] that would normally cause a failure of the grid at that point. In one embodiment, control nodes 150 and 130 can detect the condition. Control node 150 can attempt to change the grid condition at PCC[2] via operation of converter 152, such as by changing reactive power control. Control node 150 can also notify control node 130 of the condition. In one embodiment, control node 130 responds to the condition by signaling control node 140 to change its operation (e.g., via converter 142) to balance the net condition seen at PCC[1]. Control node 130 can also change the operation of converter 132 in response to the condition. Based on the operation of the control nodes, while PCC[2] may experience a failure condition for longer than is permissible by standard, the condition at PCC[1] can be made to comply with standards and regulations. Thus, PCC[2] and its equipment can stay up to attempt to correct the problem.

Thus, distribution of control nodes and distribution of control operations via those nodes can push the point of compliance as far towards the generator and/or grid backbone as possible to minimize the impact of a local disturbance. Thus, in one embodiment, each point in a hierarchy of grid network 100 is a separate point of control for compliance. In one embodiment, system 100 provides distributed redundant compliance up and down the hierarchy. In one embodiment, each control node attempts to operate within compliance. Such operation can normally ensure that each segment and sub-segment of the grid operates towards compliance, but if there is a failure at one level, it will not result in the grid going down if a higher level is able to correct for it. For example, if control node 130 can adjust operation in response to a failure at PCC[2], then control node 150 and everything downstream from it can remain online to attempt to correct the error condition. With such operation, a segment of the grid will not go down unless and until there is a last point of control and compliance that cannot compensate for the condition.

Figure 2:
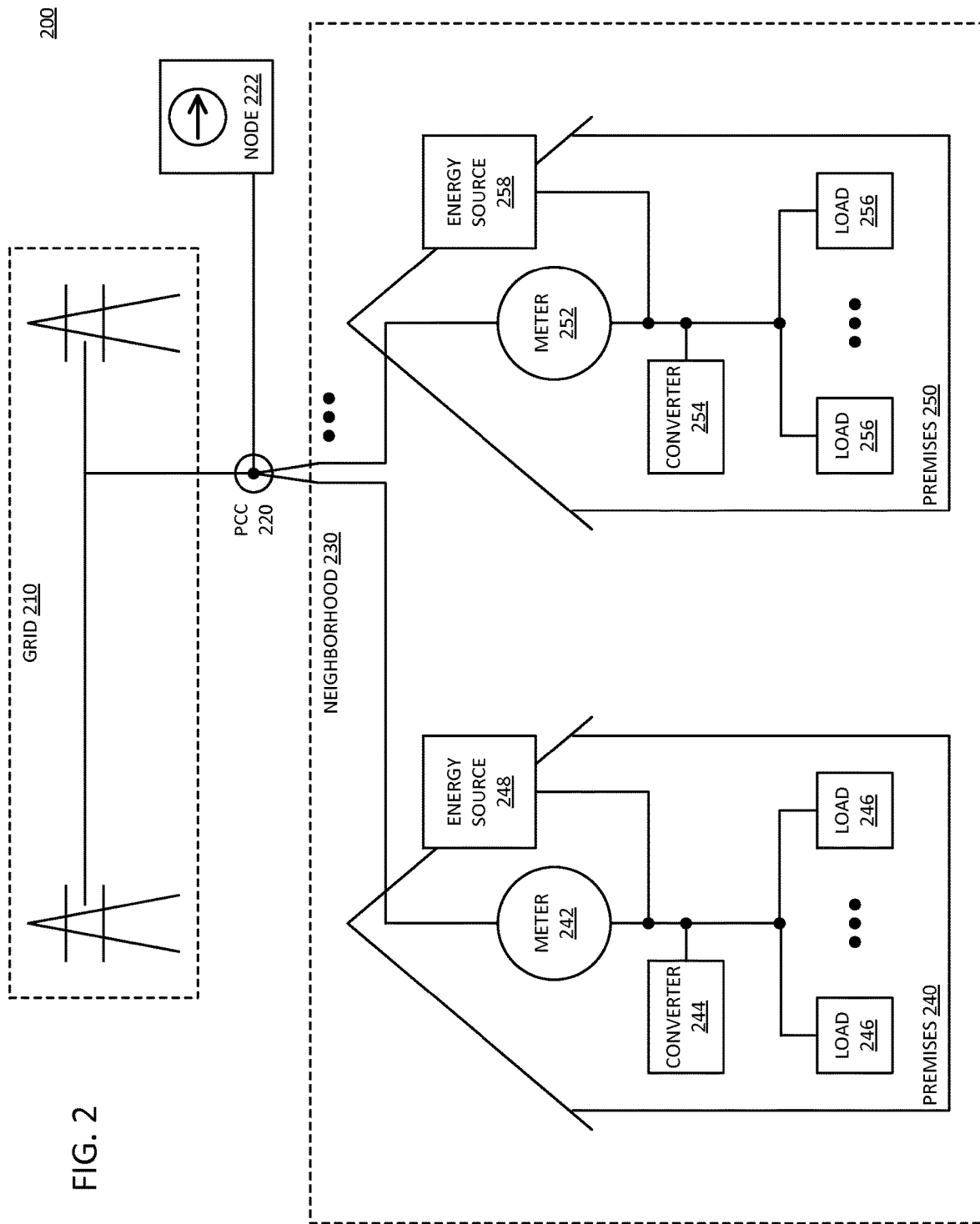
FIG. 2 is a block diagram of an embodiment of a system with monitoring and control at a point of common coupling within a neighborhood.

FIG. 2 is a block diagram of an embodiment of a system with monitoring and control at a point of common coupling within a neighborhood. System 200 includes a grid network, and can be one example of a grid network and/or system in accordance with an embodiment of system 100 of FIG. 1. Grid 210 represents the grid infrastructure, which can include a central generator or power plant and central grid control (not specifically shown).

Neighborhood 230 represents a segment or sub-segment of the grid network. Neighborhood 230 couples to grid 210 via PCC 220. PCC 220 has associated control node 222. Control node 222 can be a control node in accordance with any embodiment described herein, and can include processing logic to control the performance of the grid at PCC 220. In one embodiment, control node 222 includes a converter to control the operation of the PCC. In one embodiment, neighborhood is one level within a hierarchy of distributed control for system 200. Other levels of the hierarchy are not specifically shown. However, PCC 220 can couple to grid 210 via other PCC with distributed control nodes.

In one embodiment, neighborhood 230 can be any segment or sub-segment of the grid. Neighborhood 230 generally represents a collection or grouping of customer premises of the grid. The grouping can be any arbitrary grouping controlled by a control node. In one embodiment, the grouping can be, for example, all customer premises served by one transformer, one substation, or some other grouping. In one embodiment, neighborhood can be a large customer premises with multiple building and/or loads and power generation that couples to grid 210 via a common point (PCC 220). In such a scenario, there can be groupings within a single customer premises. In one embodiment, everything attached to a control meter or downstream from the same control meter and/or control node can be a separately controlled by other devices (loads) coupled to a different control meter. The control meters can control the connection of all their attached loads to the grid.

Consider customer premises 240. In one embodiment, customer premises 240 includes meter 242, converter 244, loads 246, and energy source 248. Loads 246 can include any type and number of loads. Converter 244 can be a converter in accordance with any embodiment described herein. Energy source 248 can include any type of local source of energy. Solar and wind generation are common local power sources. Such sources are typically referred to as "power" sources because they generate power that can be used locally and/or returned to the grid. However, traditional systems regulate the output of the sources in terms of power, or voltage times current (P=VI). Such traditional operation fails to consider that energy can be more flexibly used if not fixed to a specific current and/or voltage. Regulation of the power necessarily results in wasting power.

In contrast to traditional approaches, converter 244 can convert the energy generated by source 248 into any type of power needed by loads 246, whether real, reactive, or a mix. Furthermore, converter 244 can return energy back to grid 210 via PCC 220 as real and/or reactive power. Thus, source 248 is more properly referred to as an "energy" source in the context of system 200, seeing that it transfers the energy without regulating the output to specific voltages or currents. More details on such a converter are provided below.

Just as power is limiting in the sense of generation, power metering can be limiting in the sense of monitoring and metering the operation of customer premises 240. There are multiple ways to perform measurement of energy. In general, it will be assumed that it is possible to accurately measure energy without going into detail about the ways to perform energy measurement. Thus, meter 242 can perform energy measurement. In one embodiment, meter 242 is a control meter that measures energy instead of Watt-hours (W-h). In one embodiment, the operation of meter 242 can be used be controlling energy consumption and energy transfer in system 200. In one embodiment, meter 242 can track energy signatures of loads 246 to determine how to control a point of common coupling. While not specifically shown and labeled as such, it will be understood that the combination of meter 242 and converter 244 can provide a control node at customer premises 240. Thus, the connection point of loads 246 to converter 244 and meter 246 can be a PCC. The PCC of customer premises 240 includes the generation of power via energy source 248 in addition to the consumption of power or power demand from loads 246.

In one embodiment, neighborhood 230 includes an additional customer premises 250 that similarly includes meter 252, converter 254, loads 256, and energy source 258. There is no requirement that the amount and type of loads 256 and/or energy source 258 be the same as loads 246 or energy source 248. Rather, each customer premises can have any number of loads and/or power generation. In one embodiment, neighborhood 230 can have any number of customer premises with energy sources. In one embodiment, neighborhood 230 can include one or more customer premises that do not have energy sources. In one embodiment, a customer premises without an energy source can still be fitted with a control node, such as a meter and a power converter, in accordance with more details below.

In meters within neighborhood 230 (e.g., meter 242 and meter 252, and others) can talk to each other to share metering and/or control information. In one embodiment, such sharing of information between meters or between control nodes can enable the meters and/or control nodes to control how the point of common coupling (PCC) for the neighborhood (PCC 220) moves in the network or how control via different PCCs occurs in the network or grid as a whole. Any medium can be used for communication between the metering nodes. The ability to share information with each other and/or with a central data center can enable the network or grid to adaptively operate based on what is happening on the grid. Thus, in one embodiment, system 200 enables distributed realtime data monitoring and sharing. Other devices that receive the data can provide reactive power compensation to give voltage support and/or change real power operation within their control to change net operation at a PCC.

As mentioned above, in one embodiment, one or more customer premises coupled to a PCC includes an energy source, such as a solar system. As illustrated, both customer premises 240 and customer premises 250 include respective energy sources 248 and 258. Each customer premises within neighborhood 230 that includes an energy source can include a respective power converter 246 and 256 to control distribution of the energy from the source. In one embodiment, each converter enables the customer premises to provide real and/or reactive power from the energy source to the local loads (such as 246 and 256). In one embodiment, each converter can provide real and/or reactive power from the energy source back to the grid (e.g., to grid 210 via PCC 220 at which neighborhood 230 connects to the grid). In one embodiment, the power provided by one converter at one consumer premises can affect the power usage as seen at the PCC. For example, power generated for local consumption and/or for return to the grid by converter 244 at customer premises 240 can change net power usage seen at PCC 220 by meter 252 and converter 254. In one embodiment, each converter can support the power use of a neighboring customer premises within the neighborhood. Thus, each customer premises 240 and 250 can operate to first be self-sufficient, and extend out to neighborhood 230, and then further up the grid hierarchy to other neighborhoods and/or to grid 210 as a whole.

As power can be provided up the hierarchy of system 200, system 200 can also achieve isolation at each different level of hierarchy or organization of the grid network. In one embodiment, each meter 242 and 252 monitors local operation within the segment of the grid downstream from the device itself and to local operation from neighboring meters. For example, meters within neighborhood 230 or within each hierarchy level of the grid can share or distribute monitoring information, which can include power demand and power generation information. Thus, each meter can listen to local operation and be aware of what is happening outside of its local area. In one embodiment, such operation enables system 200 to move the PCC based on what is happening on the grid as a whole. Similar to what is mentioned above, if something within neighborhood 230 went down or experienced an error condition, neighborhood 230 can reroute isolation to shift the reactions of the grid. Neighborhood 230 can reroute isolations via the individual operations of control nodes within the neighborhood, and via control node 222. Such operation will allow the grid to stay up longer. In one embodiment, neighborhood 230 can effectively control the reactive needs within its subgroup of the grid while possibly only taking real power from the grid as a whole. Such operation is possible via aggregation of information at PCC 220 and other PCCs within the grid network hierarchy. Thus, in one embodiment, neighborhood 230 itself responds to grid events at PCC 220 without needing or waiting for central dispatch or grid management operation of grid 210. In one embodiment, system 200 can dynamically redefine the scope of the PCC depending on the event(s) of the grid.

In one embodiment, in general, two neighborhoods can be coupled together as part of a distributed grid network. Neighborhoods can be at the same level of hierarchy within the grid network, or can be at different levels of hierarchy. In one embodiment where one neighborhood provides support (e.g., voltage support) to the other, the neighborhoods will have sufficient geographic or electrical proximity to allow control at one PCC to affect the performance at the other PCC as seen from the grid.

The grid network includes distributed control nodes. In one embodiment, distributed control nodes first seek compliance at their respective PCCs, such as within their respective neighborhoods, and then seek to support compliance of the grid as a whole. In one embodiment, each control node can be thought of as a gateway device. The gateway device can control the performance, power factor, load control, and/or harmonic distortion at its associated PCC. Each control node has an associated power converter to control the power output to upstream and the power consumption downstream.

In one embodiment, distributed control nodes are position-aware within the grid network. In one embodiment, each control node can know where it is in the hierarchy of the grid network. Furthermore, in one embodiment, each control node can know where it is relative to the grid from the power plant. In one embodiment, each node for each neighborhood first tries to manage the power consumption of its local neighborhood, and can also support the grid depending on conditions of the grid (e.g., what is happening at other neighborhoods). The conditions of the grid can include any performance parameter, such as voltage level, power factor, harmonic distortion, and/or other electrical parameter. Position awareness can enable the control node to factor conditions related to upstream operation of the grid to enable the control node to provide more specific support. In one embodiment, each control node can be enabled to provide support to the higher level PCC based on what is happening within the grid or the grid conditions. In this way, each control node can seek to ensure local compliance, and also provide support to achieve overall compliance.

In one embodiment, a control node is not associated with a PCC and/or is not a gateway device if it does not include disconnection management. For example, in one embodiment, a neighborhood has only a node associated with a PCC, and there are no sub-PCCs within the neighborhood. In such an implementation, the control node associated with the PCC can be considered a gateway device. In one embodiment, disconnection management executes only at a gateway device. The gateway device presents all downstream devices to the grid.

Position awareness within the grid can be referred to as string position awareness, referring to a circumstance where a device knows its position in a string of devices from the grid. Position awareness can enhance the utility of a microinverter or other power converter, by allowing it to provide support outside its own area. For example, microinverters or other power converters associated with control nodes may be better able to provide grid support with position awareness. In one embodiment, bulk inverters can use position awareness to adjust their operation for an overall desired output. Bulk inverters refer to inverters connected together in a star or cascade arrangement, or other network configuration. Bulk inverters refer to a group of multiple inverters that operate in connection to provide control over a consumer and/or power generation. Thus, any instance of a control node can include one or more power converters. In one embodiment, the head of a string of devices is a gateway device and controls the coupling for the entire string. Such a head of the string could represent the entire string to the grid.

Figure 3:
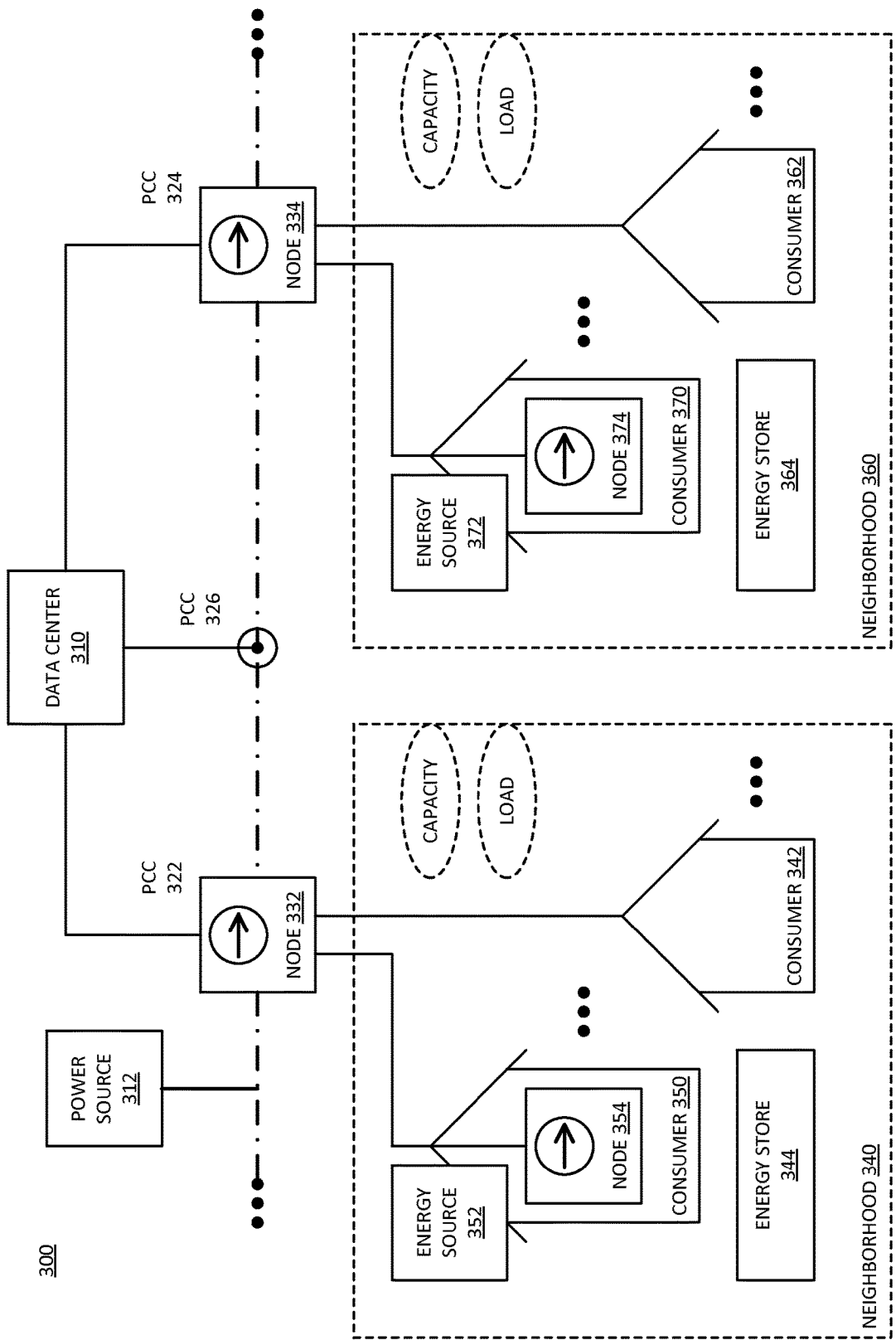
FIG. 3 is a block diagram of an embodiment of a distributed grid system.

FIG. 3 is a block diagram of an embodiment of a distributed grid system. System 300 includes a grid network, and can be one example of a grid network and/or system in accordance with an embodiment of system 100 of FIG. 1 and/or system 200 of FIG. 2. System 300 may be only a segment or portion of one of the previously-described systems. In one embodiment, system 300 can be an alternative to one of the previously-described systems. In one embodiment, system 300 is a grid network that operates without central grid management. In one embodiment, system 300 is a grid network that operates without a central power plant or other large-scale power source that provides power to the entire grid. In one embodiment, system 300 is a virtual grid and/or a modular grid. In one embodiment, system 300 is a virtual grid that can still connect to a traditional grid as an independent segment. In one embodiment, system 300 can connect to other virtual grid and/or modular grid segments.

System 300 illustrates neighborhood 340 and neighborhood 360, which can be neighborhoods in accordance with any embodiment described herein. More specifically, neighborhoods 340 and 360 can have any number of consumers that do and do not include local energy sources, and can include any number of consumers that do and do not include local control nodes. Neighborhood 340 couples to control node 332. Similarly, neighborhood couples to control node 334. Control odes 332 and 334 can represent control nodes in accordance with any embodiment described herein. Control nodes 332 and 334 are coupled to each other by some infrastructure, which may be the same as a grid infrastructure, or may simply be a power line having sufficient capacity to enable the control nodes to couple to each other and provide electrical support to each other.

In one embodiment, the control nodes are the PCCs. Thus, control node 332 can be PCC 322 and control node 334 can be PCC 324. In one embodiment, control nodes 332 and 334 are coupled to a central data center 310. Data center 310 can aggregate information about the operation of multiple distributed nodes within the grid network of system 300. Data center 310 is central in that control nodes 332 and 334 provide data to and receive information from the data center. In one embodiment, data center 310 includes processing and analysis engines that can determine what operation each node should take in response to grid conditions. In one embodiment, data center 310 is similar to central grid management, but it can be simpler. Whereas central grid management typically controls interconnection or interface of a central power plant to the grid and potentially the operation of a substation, data center can provide information to distributed nodes. The distributed nodes can independently operate within their segment of the grid network to respond to grid conditions. In one embodiment, data center 310 provides dispatch information to the distributed control nodes.

In one embodiment, neighborhood 340 includes one or more consumers 342 that do not have local energy sources. In one embodiment, neighborhood 340 includes one or more consumers 350 that include local energy source 352 and local control node 354. The energy source and local control node can be in accordance with any embodiment described herein. In general, neighborhood 340 has a total load that represents the power demand within the neighborhood, and a total capacity that represents the power generation within the neighborhood. The load minus the capacity can represent the net power demand, which can be positive or negative. A negative power demand can indicate that neighborhood 340 generates more energy than will be consumed by its local consumers. It will be understood that power demand fluctuates throughout the day and year as consumers use and generate different amounts of power. Control node 332 can continuously monitor the net power demand for its associated neighborhood 340.

In one embodiment, neighborhood 360 includes one or more consumers 362 that do not have local energy sources, and one or more consumers 370 that include local energy source 372 and local control node 374. The description of neighborhood 340 can apply equally well to neighborhood 360. Neighborhood 360 also has a total load that represents the power demand within the neighborhood, and a total capacity that represents the power generation within the neighborhood, which can be completely different from those of neighborhood 340.

In one embodiment, either or both of the neighborhoods can include local energy storage. For example, neighborhood 340 is illustrated with energy store 344, and neighborhood 360 is illustrated with energy store 364. In one embodiment, at least one neighborhood does not include energy storage. In one embodiment, all neighborhoods include energy storage. Energy store 344 and 364 represent any type of energy storage that can exist within the neighborhoods. Energy store 344 and 364 can represent a sum of all local energy storage resources of individual consumers within the neighborhood. In one embodiment, one or more neighborhood includes a neighborhood energy store. The neighborhood energy store can be in addition to or as an alternative to local energy storage at the individual consumers.

In one embodiment, energy store 344 and 364 can include battery resources, which can include any type of battery. A battery is a device that stores energy via chemical and/or electrical means which can later be accessed. However, energy storage is not limited to batteries. For example, in one embodiment, an energy store, either local to one consumer or shared among multiple consumers or the entire neighborhood, includes a mechanism to perform work to convert active energy into potential energy, which can then later be recovered via conversion back from potential energy to active energy. For example, consider a water storage system as an energy store. When excess capacity exists within a consume and/or within the neighborhood, the system can trigger a pump to operate on the excess power to pump water "uphill," essentially in any manner to pump against gravity. Recovery of the energy can include allowing the water to flow back downhill with gravity to turn a generator or mini-generator to generate energy. Another alternative can be to use energy to compress air, and then run a generator with the air as it is decompressed. It will be understood that other examples could also be used where energy storage is not limited to traditional battery resources.

In one embodiment, system 300 is a segment of a grid that includes distributed control. In such a scenario, each node within a grid network hierarchy can manage its own conditions at its PCC for compliance with standards or expectations of performance. In one embodiment, each node can also provide electrical support to neighboring segments or PCCs as it sees conditions at the grid network side (upstream from its segment) fall in performance. In one embodiment, each node can provide electrical support to neighboring segments or PCCs in response to receiving information from data center 310, from other nodes, and/or dispatch or control information from a central management.

In one embodiment, system 300 includes one or more power sources 312 coupled to provide power to the grid network. One or more power sources 312 can be in addition to local energy sources at consumers. In one embodiment, no single power source 312 has sufficient capacity to meet consumer power demands. For example, rather than an industrial or utility-scale power plant, one or more power sources 312 can be included local to a segment of the grid. The segment can be within a neighborhood or shared among multiple neighborhoods. Power sources 312 can include smaller scale generators that would be smaller than a full utility implementation, but larger than what would typically be used at a consumer or customer premises. Neighborhood-based power sources 312 can be directly associated with a control node (for example, power source 312 can be coupled to and controlled by control node 332). The control node can manage the output of the power source.

Without a large-scale power plant, and instead with smaller-scale energy generation (e.g., a neighborhood generator, a neighborhood solar installation, a small-scale hydro-electric generator, or other power sources), a grid network can be installed with minimal infrastructure compared to today's grids. Such a modular grid network can enable the building out of a grid based on current needs and then interconnecting to other independent grid network segments. Each segment can continue to operate independently, but can then benefit from being able to better distribute power generation and power demand based on availability to and from neighboring segments. Each interface or interconnection can include one or more control nodes, which can include one or more power converters each, to control the use of power and the presentation of power upstream. Thus, a local grid network can be built, and then later coupled with another local grid network as another layer of grid network hierarchy is added to interface the two independent segments.

In one embodiment, consider that neighborhood 340 has multiple customer premises 350 that have local energy sources 352. Traditionally grids are designed and built to be unidirectional, as they are designed to deliver power from a single large-scale power plant to the consumers. With power generation at customer premises 350, neighborhood 340 and up through a connected grid can effectively become a bidirectional system where power can be delivered from the central power source to the consumers, but then the consumers can also generate excess capacity that is placed back out onto the grid. If the power generation for the neighborhood and neighboring neighborhoods exceeds instant power demand, the generated power will be pushed back up the grid toward to the power plant. Such a condition can challenge the grid infrastructure.

Grid operators (e.g., utilities) typically set limits on how much local power generation can be coupled to the grid, to reduce the risk of a scenario where significant amounts of energy get pushed back up the grid to the power plant. Such a limit is often referred to as saturation, where there is a threshold amount of capacity that is permitted to be attached to the grid. If the saturation threshold has been reached, a consumer typically has to pay for additional grid infrastructure (additional equipment) that will enable the utility to selectively disconnect the consumer's power generation from the grid. Such scenarios also put consumers and utilities at odds with each other, as the consumer does not get to see the same levels of cost reduction because the power generation cannot be used by the grid, and so the grid operator does not pay the consumer for it.

In one embodiment, system 300 can provide an alternative mechanism to deal with grid saturation. In one embodiment, the distributed control in system 300 can provide dynamic control over power demand and power generation as seen at a PCC and/or as seen at a customer premises or anywhere downstream from a control node. In one embodiment, the control node includes a power converter to control real and reactive power demand and real and reactive power generation. More specifically, the control node can adjust operation to affect a real power component of power as seen downstream from the PCC, and a real power component as seen upstream from the PCC. The control node can adjust operation to affect a reactive power component of power as seen downstream from the PCC, and a reactive power component as seen upstream from the PCC. In one embodiment, the control node can include one or more inverters or one or more microinverters as power converters to apply control over demand and generation.

In one embodiment, node 332 includes a grid connector to connect upstream in a grid network. The grid connector can include known connectors and high voltage and low voltage signal lines. Node 332 is or connects to a PCC (PCC 322) for the grid network segment of neighborhood 340. Node 332 includes control logic, such as a controller or microprocessor or other logic to determine how to operate. In one embodiment, node 332 determines that a saturation threshold has been reached within neighborhood 340. Such a determination can be a result of dynamic monitoring to determine that power generation exceeds power demand. Such a determination can be in response to a notification from a data center or central grid management. Such a determination can be in response to data from other distributed control nodes. In one embodiment, each energy source 352 in neighborhood 340 is associated with a control node 354 within the neighborhood. In one embodiment, each control node 354 is configured with information about the capacity of its associated energy source 352. In one embodiment, each local control node 354 registers with control node 332, which can allow node 332 to know a total capacity for neighborhood 340.

In one embodiment, node 332 knows a total peak real power demand for neighborhood 340, such as by configuration and/or dynamic identification via communication with meters or other equipment distributed at the consumers. In one embodiment, there is a threshold percentage of the total peak real power demand that identifies a value of real power, and when real power generation capacity exceeds the value, neighborhood is considered to be in saturation. In response to the saturation condition, in one embodiment, node 332 dynamically adjusts operation of power converter(s) to adjust an interface between neighborhood 340 and the grid. In one embodiment, node 332 adjusts a ratio of real power to reactive power for neighborhood 340 as seen from upstream from PCC 322 (e.g., as seen from PCC 324 and/or as seen from central grid management or another part of the grid network).

In one embodiment, node 332 receives dispatch information from data center 310 or central grid management indicating a level of grid saturation for neighborhood 340. In one embodiment, node 332 receives information from downstream such as a via meters and/or node(s) 354 indicating levels of grid saturation downstream from PCC 322. In one embodiment, node 332 adjusts at least an amount of real power generation with neighborhood 340, such as by communicating to downstream control nodes 354 to adjust their real power output. In one embodiment, node 332 can communicate downstream to cause control nodes 354 to change a ratio of reactive to real power output upstream. In one embodiment, node 332 adjusts real and/or reactive power generation and/or demand at PCC 322 to adjust the electrical conditions as seen upstream from PCC 322. In one embodiment, node 332 and/or node(s) 354 adjust operation to divert at least a portion of real and/or reactive power to energy store 344.

In one embodiment, system 300 represents a virtual grid or virtual grid segment. As a virtual grid, system 300 does not require the traditional infrastructure, central power plant, or central grid management common to traditional utility grids. System 300 can be a virtual grid in that in one embodiment, each neighborhood 340, 360 can generate local power and satisfy local demand independent of other areas. Despite being independent, neighborhoods 340 and 360 can be coupled to each other to enable each neighborhood to provide support to and/or receive support from the other neighborhood. The interconnection between neighborhoods 340 and 360 can be minimal compared to requiring significant infrastructure in a traditional grid.

In one embodiment, nodes 332 and 334 are coupled together as a PCC and/or can be considered to couple together via another PCC. In one embodiment, PCC 322 and PCC 324 will couple together via PCC 326, which will have a separate control node (not explicitly shown). PCC 326 can be considered higher up a grid network hierarchy from PCCs 322 and 324. PCC 326 can be managed from the perspective of a control node seeking to control operation of all downstream connections and managing upstream connections. In one embodiment, nodes 332 and 334 are coupled together not via PCC 326, but are at a highest level of hierarchy of the grid network and can communicate and provide grid support to each other. In one embodiment, whatever power generation is available within neighborhood 340, even if sufficient to meet its own peak power demand, is not sufficient to meet peak power demands of neighborhoods 340 and 360. The same could be true with respect to power generation of neighborhood 360.

Control nodes 332 and 334 independently manage their local power sources. From the perspective of each neighborhood, the neighborhood as a whole appears to have a "power source" in that power generation resources within the neighborhood can generate power. Nodes 332 and 334 control distribution of the locally generated power, each from its respective neighborhood. It will be understood that while referred to as neighborhoods, the same principles can apply to two distinct consumers, each having local power generation and each having a control node. Coupling the two consumers together can generate a virtual grid. Thus, the virtual grid can operate at the level of individual consumers or large groups of consumer and neighborhoods. In one embodiment, each control node operates based on its local power demand and local power generation, as well as based on monitoring and/or communication regarding power demand and power generation from the coupled neighborhood or consumer.

In one embodiment, one or more virtual grid network segments can be connected to a utility power grid. In one embodiment, one or more additional consumers or neighborhoods can be coupled together as a virtual grid with consumers or neighborhoods that are coupled together. In one embodiment, each control node includes communication and control logic to discover the network structure. In one embodiment, one control node within system 300 can operate as a master node, such as node 332. A master control node can have one or more slave nodes coupled to it. For example, node 334 could be a slave node to node 332. In a master-slave scenario, control node 332 can control the operation of node 334 to cause node 334 to control its local or downstream resources in accordance with one or more commands or requests generated by master node 332. Thus, node 332 can provide control over its local segment and one or more sub-segments connected as slave segments. In such a scenario, node 332 can be responsible to ensure compliance of each grid network segment with regulations or requirements. Node 332 can thus control distribution of power and power demand throughout system 300.

In one embodiment, a grid network of system 300 can be modularly adjusted in size. Seeing that each neighborhood 340, 360, . . . , in the grid network can independently operate, neighborhoods, consumers, and/or other segments or groupings of the network, can be added and/or removed from the grid network dynamically. For example, in a developing area, a first neighborhood 340 can be built with its power generation to attempt to satisfy demand for its consumers. In one embodiment, a power source 312 can be connected, but it insufficient in itself to satisfy peak demand for neighborhood 340, but can provide demand when local energy sources are insufficient to meet demand. In one embodiment, neighborhood 360 can be further developed, and then connected to neighborhood 340 (e.g., coupling nodes 332 and 334). Other neighborhoods could similarly be added, via a higher level PCC and control node, and/or by coupling neighborhood control nodes. In one embodiment, power source 312 can then service both neighborhoods by distribution via the control nodes, and the neighborhoods would generally rely on local power generation, but can receive power from power source 312 as a support power source. In one embodiment, power is used from source 312 when local power generation including converting power from energy stores does not satisfy demand. In one embodiment, one control node supports the other control node by adjusting reactive power output to change voltages and power flow at the interconnection of the neighborhoods. Changing the reactive power or the phase offset of power generated and/or consumed locally at the neighborhood can cause an electrical condition that will cause power to flow a different direction, depending on whether the other neighborhood needs to receive additional power or offload it.

Figure 4:
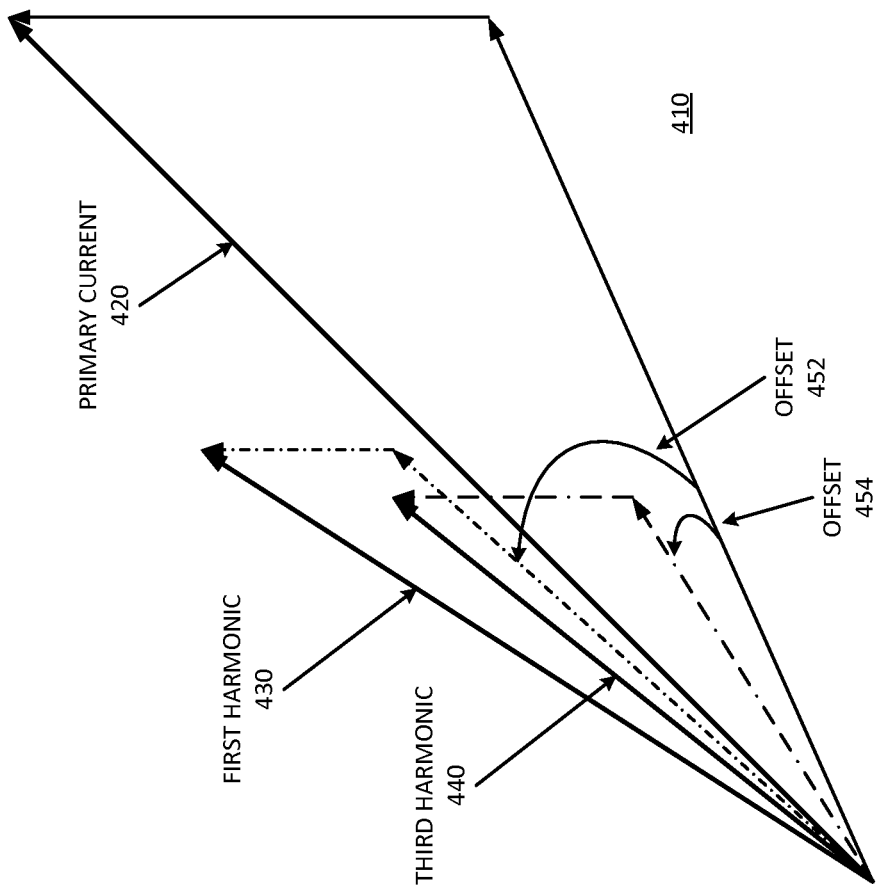
FIG. 4 is a graphical representation of an embodiment of components of a current in a system in which harmonic components of current have angular offsets with respect to a primary current component.

FIG. 4 is a graphical representation of an embodiment of components of a current in a system in which harmonic components of current have angular offsets with respect to a primary current component. Diagram 410 provides a complex vector representation of current. A vector has a magnitude and a direction. Instead of simply measuring power as traditionally done, in one embodiment, a meter and/or a control node can monitor power as an energy signature including a representation of a complex power vector. In one embodiment, each signature identifies characteristics to define and/or "name" the signature. Each signature includes a complex vector representation that provides a vector for primary current and a vector for one or more harmonics.

Vector 420 is the vector for primary current. In typical representation, the x-coordinate is the vector component that extends from left to right across the page. The y-component goes from bottom to top of the page. It will be understood that while not represented here for purposes of simplicity, a vector could have a negative y-component. The x-y coordinates define the end of the vector. Now assume that the x and y coordinates of primary current vector 420 define a plane. The most correct way to envision the harmonics, in accordance with research and work done by the inventors, is to represent the harmonics as a three-dimensional vector. Thus, if the x-y coordinates of vector 420 define a reference plane, one or more of the harmonics can have an angular offset relative to the plane of the primary current vector.

For example, consider the example of diagram 410. The first harmonic is illustrated as having vector 430, which includes an x component and a y component, where the magnitudes of the components can be any magnitude with respect to the primary current components. In addition to the x and y coordinates, first harmonic vector 430 includes a z coordinate component, which defines angular offset 452 of the vector with respect to the reference plane of primary current vector 420. It will be understood that the starting points of the primary current and the harmonics are the same. Thus, the third dimension of the harmonic vectors or the complex vectors is not necessarily an absolute z coordinate component, but an angular offset relative to the primary current.

As illustrated, third harmonic vector 440 also has an x component and a y component, and angular offset 454, which can be different (greater or less than) angular offset 452 of first harmonic vector 430. The angular shift of the angular offsets represents a magnetic effect on the current. The inventors have measured noticeable effects on power consumption up to the fortieth harmonic. Thus, the contribution of harmonic offsets should not be understated. The harmonics shift with respect to the angular offset due to the differing resonant effects of magnetic flux when trying to move a current. Primary current vector 420 is the current the consumer expects to see. However, the harmonic components can add significant (measurable) power consumption. The offsets of the harmonics can shift the simple expected two-dimensional current vector into a three-dimensional current vector (complex current vector). The traditional power triangle does not fully address the power usage by the consumer, as additional power will be required to overcome the magnetic components represented by the shifted or offset harmonic components.

Figure 5:
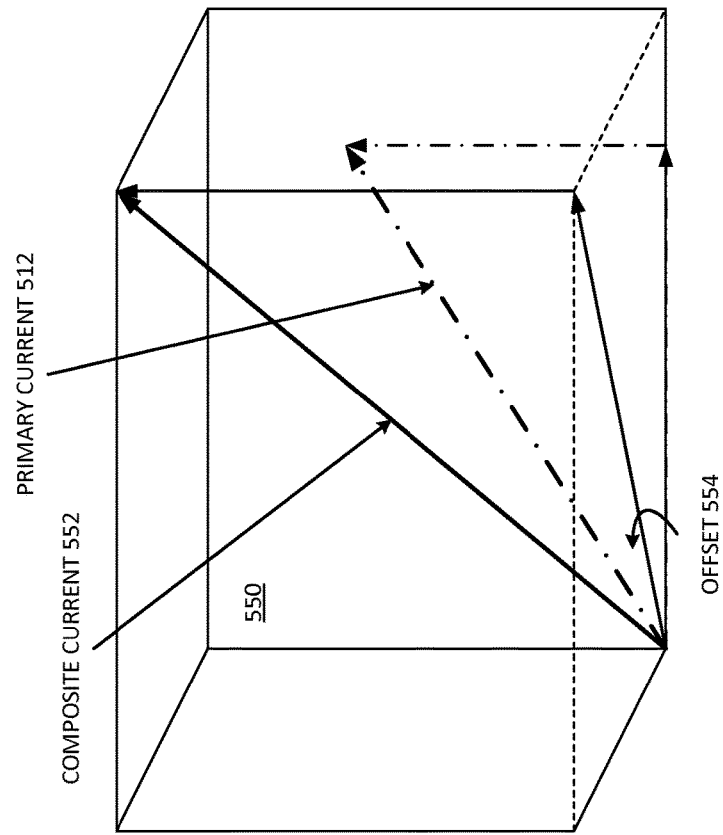
FIG. 5 is a graphical representation of an embodiment of components of a current in a system in which a current vector is a composite of a primary current component and harmonic current components.
Figure 5:
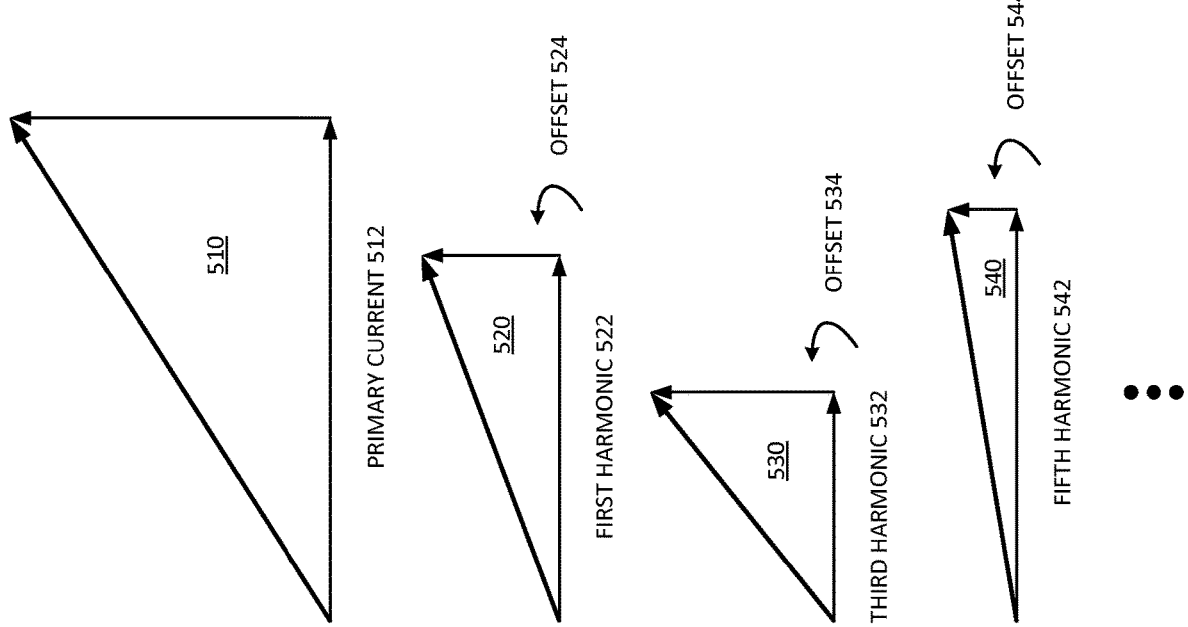

FIG. 5 is a graphical representation of an embodiment of components of a current in a system in which a current vector is a composite of a primary current component and harmonic current components. Diagrams 510, 520, 530, and 540 illustrate component parts of a complex current vector in accordance with an embodiment of diagram 410 of FIG. 4. As illustrated, diagram 510 represents the primary current vector 512. The primary current includes x and y components, and defines a reference frame for the harmonics.

Diagram 520 represents first harmonic vector 522, which includes x and y components and angular offset 524. Diagram 530 represents third harmonic vector 532, which includes x and y components and angular offset 534. Diagram 540 represents fifth harmonic vector 542, which includes x and y components and angular offset 544. Each of the primary current 512 and various harmonics (522, 532, 542) are shown as two-dimensional "power triangle" representations, which is what is traditionally expected for each one. However, as mentioned already, the harmonics are frequently at an angular offset with respect to the primary current component vector, and thus the resulting composite current vector will not be in the same plane as primary current vector 512.

Rather, consider the power triangle of the composite current vector as a triangle in a three dimensional box. Diagram 550 provides a simple illustration of this concept. It will be observed that primary current vector 512 is on a face of the three dimensional box of diagram 550. The harmonics push the triangle for the composite current "into" the box in some way. Composite current vector 552 is both larger in magnitude, and offset angularly with respect to primary current vector 512. Offset 554 represents the angular offset. It will be understood that primary current vector 512 and composite current vector 552 define the "shape" of the box. Depending on the amount of harmonic contribution, the box shape will be different. The composite current vector 552 can be a signature stored by the metering device. The reference plane of primary current 512 can be defined as a plane of the grid power (referring to the power condition as seen at the grid via the PCC.

With respect to the noise and harmonics generated, it will be understood that there are regulations on switching power supplies and magnetic resonance in general. Each device is tested for compliance (e.g., UL certification). When each device or load works individually as designed and tested, each one will comply as required per regulations. However, when there are multiple loads and/or devices coupled together, they tend to create unanticipated resonance. The inventors have measured contributions to the energy triangle from the first up to the 40th harmonic. Thus, there is typically a significant amount of harmonic noise happening on the power lines. Harmonic suppression traditionally includes filters that target specific noise components. However, the noise components can continue to vary as different devices come online and offline, and the electrical resonance structure of the network continually changes. In one embodiment, a meter detects the characteristics of each load or group of loads. The characteristics can be referred to as a signature of the harmonics.

In one embodiment, the power meter or energy meter can detect such shifts as the angular offsets of the harmonic current vectors, by measuring energy contributions. The power converter can compensate for the actual composite current by providing the reactive power needed to match the load and/or PCC to the grid. Thus, the current at the load can be adjusted by the converter to bring the composite current into alignment with the grid, not simply in power factor, but in complex vector. Such operation will naturally eliminate or at least reduce harmonic distortion caused by loading on the grid.

In one embodiment, what is described in reference to loading can also be performed with reference to energy generation. In one embodiment, the meter can determine an energy signature at the PCC and compute what current would be needed to offset the grid to a desired offset (if some power factor other than unity is desired) and/or to match to the grid in a case where unity power factor is desired. The converter can adjust operation to adjust the power output to not only match reactive power needs, but complex current vector shift as well to more efficiently match the interface of the grid with the downstream from the PCC.

It will be understood that the energy triangle represented in diagram 550 can be represented as a mathematical representation of the effect seen when looking at the current component of power drawn by a load or consumer. The effect is wasted energy, which usually manifests itself as heat. The problem traditionally is that systems do not match well, and there are significant noise components. In one embodiment, a control node matches not just impedance, but matches noise or harmonic correction to provide a specific energy signature connection to the grid. Thus, the control node can provide a "cleaner" connection to the grid network with respect to the power interface, whether outputting power onto the grid or receiving power from the grid.

Figure 6:
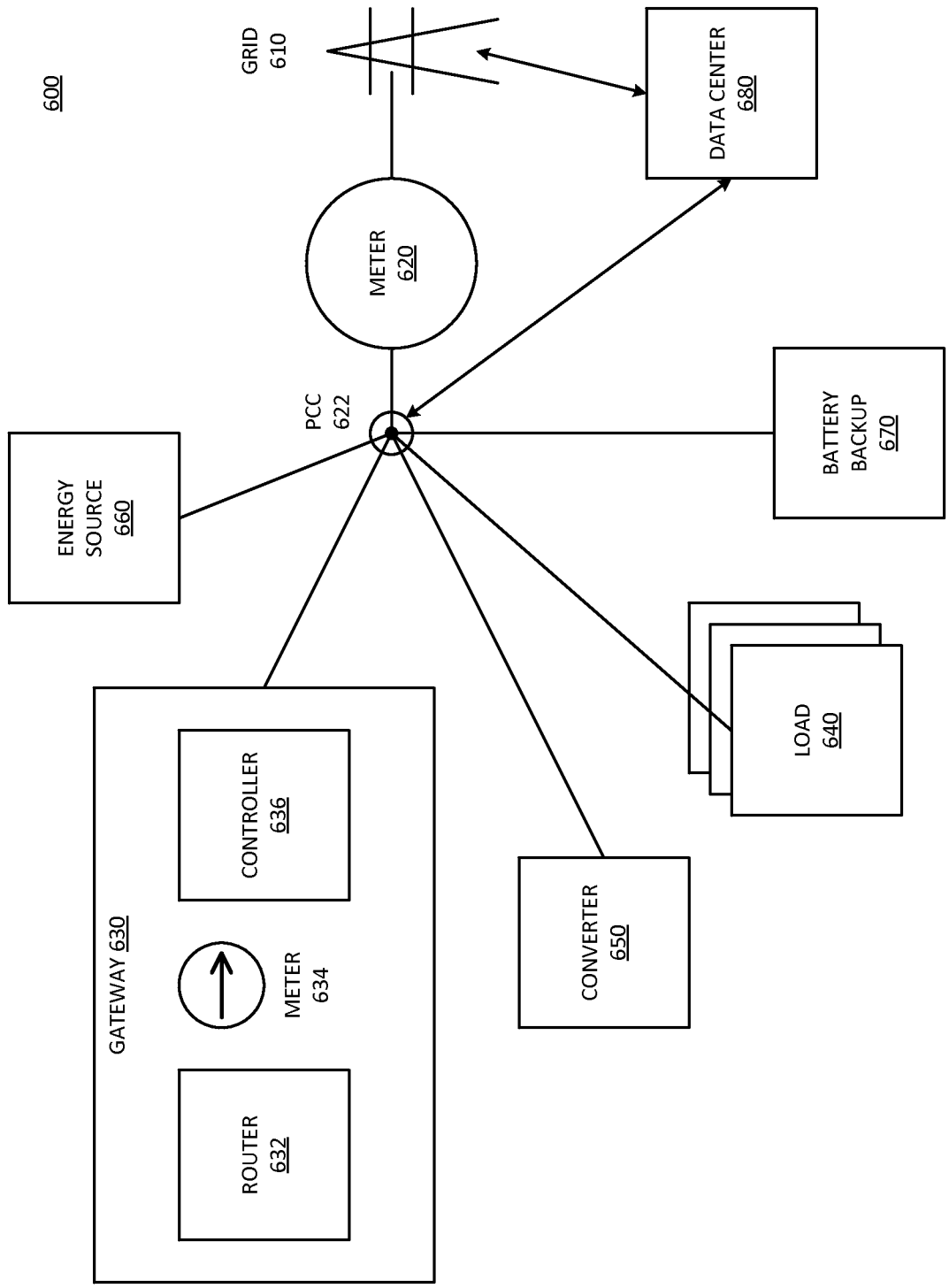
FIG. 6 is a block diagram of an embodiment of a gateway device in a distributed grid system.

FIG. 6 is a block diagram of an embodiment of a gateway device in a distributed grid system. System 600 represents one embodiment of a grid system, and can be a grid system in accordance with any embodiment described herein. For example, system 600 can be one example of a system in accordance with system 100, system 200, and/or system 300. Grid 610 represents a grid network, and can be any type of grid described herein, whether utility power grid, virtual grid, distributed hierarchical grid network, or a combination. Meter 620 represents a grid meter, or a meter used within the grid to measure and charge for power delivered by the grid. In one embodiment, meter 620 can be considered part of the grid infrastructure and can be referred to as an entrance meter. Meter 634 of gateway 630 is understood to be separate from meter 620. In one embodiment, meter 620 monitors power delivered by grid 610 to PCC 622, which represents a PCC in accordance with any embodiment described herein.

In one embodiment, system 600 includes gateway that can be and/or be part of a control node in accordance with any embodiment herein. In one embodiment, gateway 630 represents "the brains" of a control node. In one embodiment, gateway includes router 632 to enable gateway 630 to communicate with other devices, such as devices outside of the PCC. In one embodiment, router 632 enables gateway 630 to communicate with data center 680. Data center 680 can represent a central data location for a distributed grid network. In one embodiment, data center 680 represents central grid management. Thus, data center 680 represents a source of grid-based information, such as control, dispatch information, or other data about grid operation. Router 632 can include Ethernet connections or other connections that use Internet protocols. Router 632 can include grid interconnections. Router 632 can include proprietary connectors. Router 632 can represent a stack or protocol engine within gateway 630 to generate and process communication in addition to the hardware connectors that provide an interface or connection to the grid.

Figure 8:
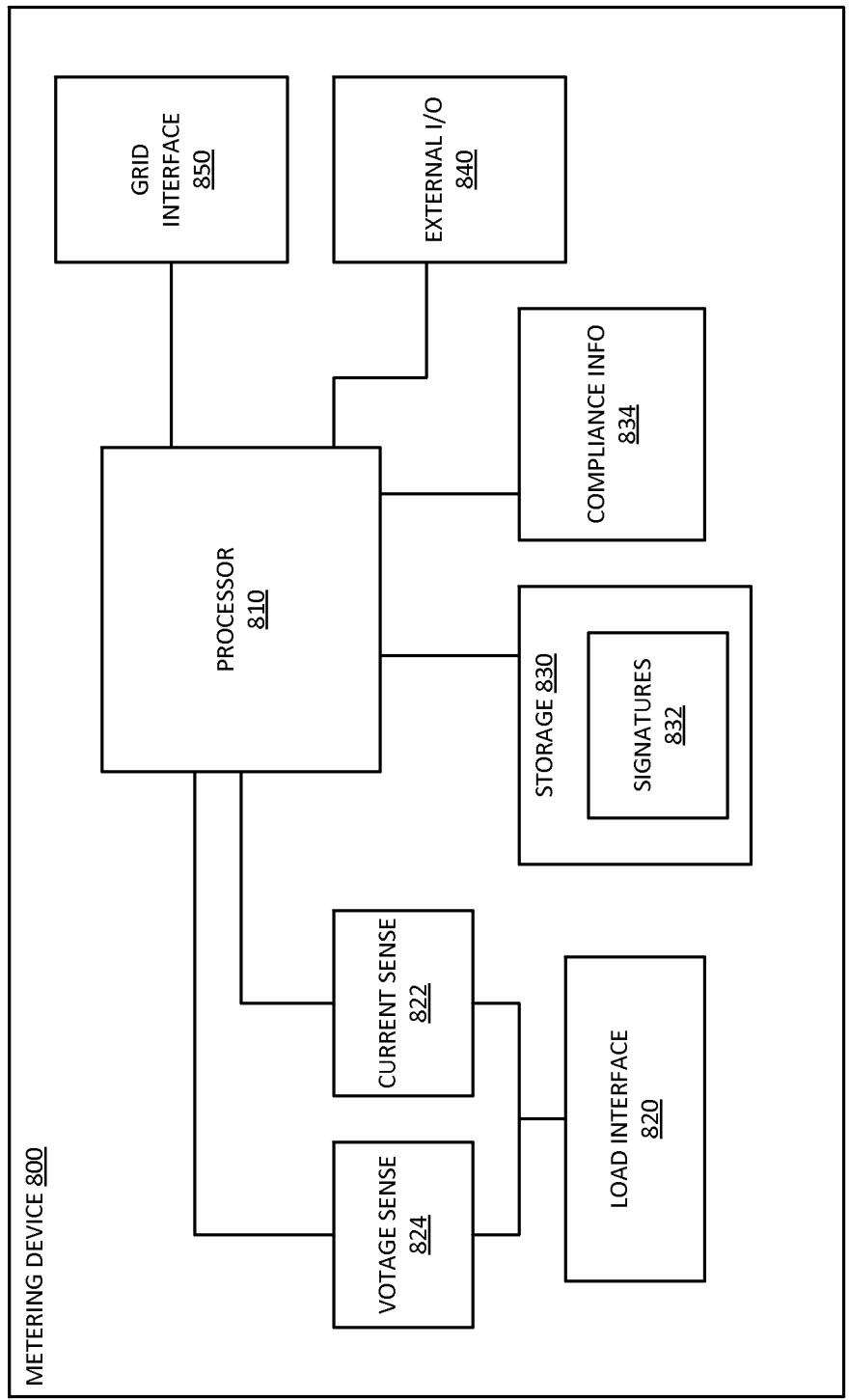
FIG. 8 is a block diagram of an embodiment of a metering device that monitors power at a PCC.

In one embodiment, gateway 630 includes meter 634, which represents a metering device in accordance with device 800 of FIG. 8. Meter 634 enables gateway 630 to monitor power demand and/or power generation on the consumer side of PCC 622. The consumer side of PCC 622 is the side opposite the grid. The consumer side is the electrical point of contact to the loads and/or load control for the consumer. Typically the PCC includes some type of fuse system and/or other disconnection mechanism. The fuse system can be soft fuses (e.g., switches or other mechanisms that can be electrically opened and closed) or hard fuses that must be mechanically or physically reset or replaced. In one embodiment, meter 634 stores and manages energy signatures. In one embodiment, meter 634 performs aggregation.

Gateway 630 includes controller 636, which represents hardware processing resources to control the operation of the gateway. Controller 636 can also represent software or firmware logic to control the operations of gateway 630. In one embodiment, controller 636 can be implemented by more than one hardware component. In one embodiment, controller 636 includes or is an embedded computer system. For example, controller 636 can include an embedded PC (personal computer) board and/or other hardware logic. Controller 636 generally controls the operation of gateway 630, such as controlling router 632 and/or meter 634. In one embodiment, if gateway 630 is said to do something, controller 636 can be considered to execute operations to perform what is said to be done.

In one embodiment, system 600 includes one or more loads 640 on the consumer side of PCC 622. In one embodiment, system 600 includes one or more energy sources 660. Energy source 660 represents a power generation resource at the consumer or on the consumer side of PCC 622. In one embodiment, energy source 660 is a renewable energy source, such as wind or solar power systems. In one embodiment, energy source 660 generates real power. In one embodiment, system 600 includes battery backup 670. Battery backup can be any form of energy store or energy storage described herein.

In one embodiment, the consumer includes local power converter 650. Converter 650 can be in accordance with any embodiment of a converter described herein. Converter 650 performs one or more operations to manage or control an interface. In one embodiment, the interface represents the interconnection of a device to PCC 622. In one embodiment, the interface represents the electrical interconnection or electrical coupling of a device to another point. For example, converter 650 can operate to adjust an interface between PCC 622 and loads 640, such as by changing how power or energy is transferred between the grid and the load. In one embodiment, converter 650 can operate to adjust an interface between energy source 660 and load 640, for example, to deliver power to the load from a local energy source. In one embodiment, converter 650 can operate to adjust an interface between energy source 660 and PCC 622, for example, to deliver power from the energy source to the grid. In one embodiment, converter 650 can operate to adjust an interface between battery backup 670 and PCC 622 and/or energy source 660, for example, to charge the energy store and/or provide power from the energy store to use for the load and/or the grid.

Figure 7:
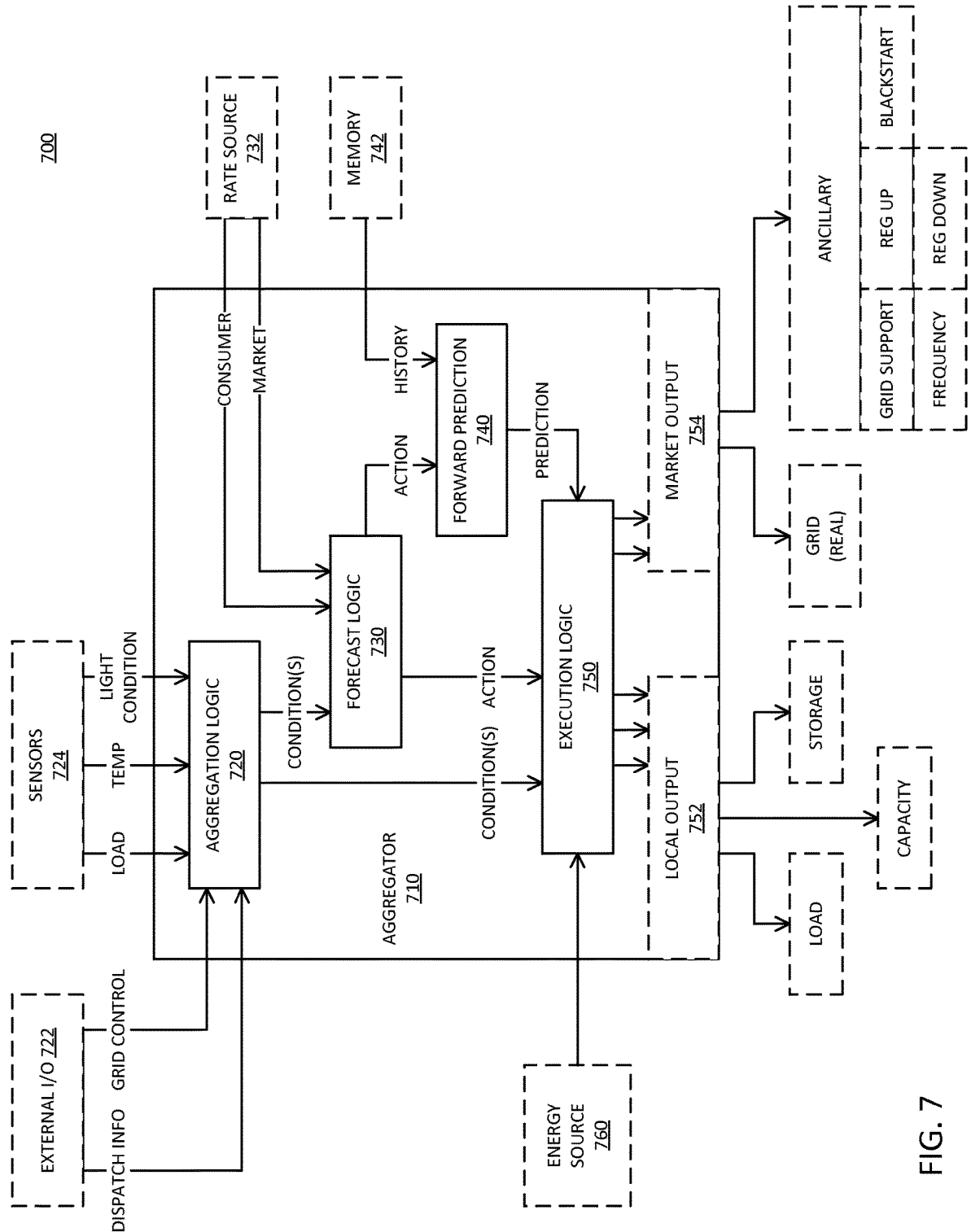
FIG. 7 is a block diagram of an embodiment of a gateway aggregator system.

FIG. 7 is a block diagram of an embodiment of a gateway aggregator system. System 700 is one embodiment of a gateway device, and can be or be included in a control node in accordance with any embodiment described herein. Aggregator 710 represents hardware and software logic to perform aggregation of data. Aggregator 710 can compute a determination of how to control an interface based on the aggregated information.

Aggregation logic 720 represents logic that enables aggregator 710 to gather multiple elements of data related to electrical grid conditions. External I/O 722 represents sources external to a PCC that can provide grid condition information. Typically such information is provided in light of conditions of the grid as a whole or of specific segments or sections of the grid that are larger than the consumer or neighborhood or portion managed by a control node associated with aggregator 710. Examples of external I/O 722 can include, but are not limited to, dispatch information and grid control signals. Dispatch information can be broadcast to a grid network or can be sent to specific areas in a grid network. Grid control represents specific signals indicating at least one electrical condition the PCC is supposed to comply with and/or address. For example, the PCC can be requested to provide specific output from the PCC. As another example, the PCC can be specifically requested to comply with a regulation based on conditions at another location of the grid network.

Sensors 724 represent sources of data within the PCC, for example, one or more sensors local to a control node or other gateway device or aggregation device. Examples of sensor data can include, but are not limited to, load information, local temperature, light conditions, and/or other information. In one embodiment, load information is gathered or monitored by a meter that determines what loads are drawing power, such as by energy signatures that indicate complex current vectors for the load. In one embodiment, load information can be configured into aggregator 710, which can be maximum load capacities allowed for specific load connections (e.g., breakers, outlets, or other connection). In one embodiment, the operation of a local energy source can be affected by temperature, or the temperature can be an indication of expected efficiency and/or demand for certain loads and/or energy sources. Light condition is specific to solar systems, but other sensors such as wind sensors could alternatively or additionally be used.

Each sensor can provide information to be considered when determining how to output power or otherwise control interfaces within the PCC and/or external to the PCC. In one embodiment, each sensor registers with aggregation logic 720. Aggregation logic 720 can include a sensor control hub to gather and aggregate information from the various sensors. In one embodiment, aggregator 710 stores aggregation data and/or raw data in memory 742. Memory 742 can be local to aggregator 710 and store sensor and/or grid control information.

In one embodiment, aggregation logic 720 includes weights to provide greater weight to certain data over other data. The weights can change based on time and/or based on other data received. For example, temperature data can be considered in determining what operations to perform, but can be weighted very low or ignored completely when grid control is received. Countless other examples are possible. In one embodiment, aggregation logic 720 operates as a type of complex state machine. In one embodiment, each condition output generated by aggregation logic 720 identifies a state as determined based on the various inputs. For example, aggregation logic 720 can make determinations based on ranges of data, such as when light conditions are within a given range and the temperature is within a specific range, and when the grid conditions are within certain ranges, then a particular condition output is generated. Other ranges will produce other condition outputs. The condition outputs can indicate what the state of aggregator 710 is to determine how to control a power converter to operate.

In one embodiment, aggregation logic 720 generates one or more conditions for execution by execution logic 750. In one embodiment, aggregator 710 can include zero or more other logic elements to make changes to the determined conditions. In one embodiment, aggregator 710 includes one or more of forecast logic 730 and/or forward prediction 740. In one embodiment, all logic blocks within aggregator 710 can be considered control logic for the aggregator. Thus, reference to the aggregator performing computations or calculations can include operations of aggregation logic 720, forecast logic 730, forward prediction logic 740, execution logic 750, and/or other logic not shown.

In one embodiment, forecast logic 730 can receive rate source information 732. Rate source information 732 can include consumer rate or price information and/or market rate or market price information. In one embodiment, consumer rates will include different rates for real and reactive power. In one embodiment, market rates will include different rates for real and reactive power. Reactive power can generally be delivered to the grid for an "ancillary market" or to provide ancillary services. Thus, reactive power rates can actually include many different rates depending on market conditions and the ancillary market selected. It will be understood that rate information can change throughout the day, and/or through the season or year. Thus, time of day and time of year can be information considered in computing operations to perform based on rate information. In one embodiment, rate source 732 is a realtime rate information source, and can provide data related to a deregulated energy market, such as rate contract information, instantaneous rates, and/or other information. In one embodiment, aggregator 710 couples to rate source 732 via external I/O 722.

In one embodiment, forecast logic 730 makes a determination or calculates an operation to perform based on the condition(s) identified by aggregation logic 720 and rate information. Forecast logic 730 can determine one or more actions to take based on combining rate information with condition information. For example, a determined condition as calculated by aggregation logic 720 can identify a specific state or zone of operation for an interface managed by aggregator 710. Aggregator 710 is associated with a control node that can provide power to local loads and to the grid. Thus, forecast logic 730 can determine the best use of locally generated energy, for example. Forecast logic 730 can determine how to best control interfaces based on where the maximum financial reward is for the consumer.

For example, in a given day market price might fluctuate between real power and ancillary services, depending on the conditions of the grid network. When real power rates are higher, forecast logic 730 can determine to cause an associated power converter to generate real power to transmit to the grid. If one or more ancillary market prices then goes higher than real power market rates, forecast logic 730 can determine to cause the power converter to generate reactive power to transmit to the grid. In another example, consider that the consumer has loads that have load demand. However, because market rates are currently higher than the value of consuming the energy locally, forecast logic 730 determines to transmit the energy to the grid, and draw power from the grid to power the loads. Similarly, when market rates drop, forecast logic 730 can determine to redirect more energy to the local load demand. Thus, aggregator 710 can dynamically monitor and control the interface to the grid from the local PCC to maximize the value of energy for the local consumer and for the grid.

In one embodiment, forward prediction 740 accesses historical information from memory 742. The historical information can include one or more conditions with associated operations performed, historical trend information for rates, electrical conditions, power demand, and/or other information. The history or historical information can enable aggregator 710 to identify trends or patterns based on previous operation. Thus, the longer a control node is operational, the more its historical data can inform operation. In one embodiment, aggregator 710 includes a period of data gathering prior to using history information. The time of data gathering can be variable for the different uses of an aggregator, but can be a matter of hours, days, weeks, or even months. In one embodiment, such information can be gradually "phased in" by gradually giving more weight to historical data analysis or evaluation or calculation of what operations to perform.

In one embodiment, historical data can identify particular states of operation and subsequent states of operation and how long elapsed between them. Thus, for example, forward prediction can determine whether or not to perform a determined action based on historical information indicating whether such a condition or state is likely to persist for long enough for economic benefit. In one embodiment, forward prediction 740 determines from selected actions or state and historical data what operations should be executed by a control node. In one embodiment, each prediction represents an estimate of what decision to make based on present conditions in light of past data of energy loads, energy prices, weather conditions, rates, and/or other information. In one embodiment, the historical data can be referred to as operating history or operational data, referring to operations within the monitored/controlled grid node.

In one embodiment, execution logic 750 receives one or more conditions, one or more actions, and/or one or more predictions, respectively, from aggregation logic 720, forecast logic 730, and forward prediction logic 740. Execution logic 750 can analyze the input data and compute or calculate one or more operations to perform based on the received data. In one embodiment, collectively, aggregator 710 can have knowledge of connected local energy sources, entrance meter information, energy store or energy backup system, local or onsite loads, and other information. In one embodiment, all the information gathered within a gateway device such as aggregator 710 is gathered by a local meter. Logic within aggregator 710 can receive the data from the multiple sources and make decisions based on the data. The aggregation of data itself is different from previous control nodes. Forecasting and/or prediction can be added to the aggregator. In one embodiment, execution logic 750 selectively generates an operation based on computed conditions, actions, and predictions.

Consider an example that a meter detects that a refrigeration load has turned on and more reactive power is needed. The meter could make such a determination, for example, by computing or processing different load energy signatures of the loads. For example, consider a composite current that is already present in the system. The addition of another load coming online will change the overall composite current. In one embodiment, the meter can compute a difference between the new composite current and the previous composite current to determine the energy signature of the new load(s). As such, the meter can identify the specific load and determine to effect a change in operation via aggregator 710 to respond to the power demands of the specific load. It will be understood that such computations could require vector analysis and/or calculations to distinguish specific loads. In one embodiment, aggregator 710 can keep historical data for one or more energy signatures, and can thus determine how long a given load is expected to be on, based on historical averages. Thus, energy signatures can be used with historical data and/or other determination data computed in aggregator to determine what operation(s) to execute.

Continuing with the example of the refrigeration load coming online, in one embodiment, the meter detects the increased demand for reactive power in the system. In one embodiment, the meter detects the energy signature of the refrigeration load. The gateway can have an attached solar system (local energy source) adjust its phase angle (e.g., via a converter and/or inverter coupled to the solar system) to produce more reactive power to address the refrigeration load. Once the refrigeration load turns off, the gateway can then tell the solar system to use the extra power to charge a battery backup system, or provide support to the grid. Again, the different possible examples are too numerous to address.

In one embodiment, execution logic 750 generates an operation and executes the operation. In one embodiment, execution logic 750 can generate an operation for local output 752 and/or for market output 754. Example local outputs can include, but are not limited to, providing real and/or reactive power to a load, providing real and/or reactive power to charge an energy storage device, and/or providing power to local "capacity," which can represent one or more load and one or more energy storage devices. Examples of market outputs can include, but are not limited to, providing real power to the grid, and/or providing ancillary services.

The ancillary services can include many different services, which are represented generically, even though not all possible services are illustrated. Ancillary services can include grid support, frequency support, regulation up, regulation down, and/or blackstart services, and/or other services. Grid support represents any type of voltage support services to boost or reduce the grid voltage condition at the PCC. Regulation up and regulation down refer to specific frequency support services. Regulation up and regulation down can refer to controlling load interfaces to change a load seen at the PCC. Frequency support represents other types of frequency service, and can include changing an interface to change a flow of energy onto the grid to adjust a frequency of the AC power as seen at the PCC. Blackstart service represents operations performed to ramp a grid up to enable a disconnected portion of the grid to reconnect to the grid network. All ancillary services can include providing capacity that responds to a need by the grid as seen from the PCC.

In general, in one embodiment, a consumer node can include a control node. Typically a control node includes an energy meter and a controller. The controller can be in accordance with aggregator 710 and/or other gateway device. The energy meter and the controller are located on the consumer side of the PCC, and perform operations within the PCC to change an interface as seen from the grid via the PCC. The consumer node includes one or more power converters that change their operation in response to commands or controls from the controller and/or meter. The power converter operation changes the interfaces to the PCC in accordance with decisions made by the controller. Operation by the power converter(s) can change the flow of energy within a grid network at the local node.

Thus, the power converter can respond to aggregation information by changing operation in response to a decision by a controller that determines how to operate based on the aggregation information. The aggregation information can include information from one or more sensors, one or more grid-side controllers or data center, and local power demand and local conditions. The decision-making by the controller can include computing based on the gathered local and grid condition information. In one embodiment, the decision-making includes computing based on rate information. In one embodiment, the decision-making includes computing based on historical information. In one embodiment, the decision-making includes computing by execution logic to generate one or more controls for one or more power converters. The power converters change the flow of energy within the PCC and/or between the PCC and the grid, in accordance with any embodiment described herein. The power converters can control a mix of real and reactive power from a local energy source and/or from the grid, in accordance with any embodiment described herein.

FIG. 8 is a block diagram of an embodiment of a metering device that monitors power at a PCC. Metering device 800 can be a power meter or an energy meter in accordance with any embodiment described herein. In one embodiment, metering device 800 is or is part of a control node in accordance with any embodiment described herein. Device 800 includes hardware components to interconnect to a grid network, connecting upstream and/or connecting to neighboring grid network nodes. In one embodiment, device 800 includes hardware components to interconnect to one or more loads and/or other devices or nodes coupled downstream from the power metering. It will be understood that device 800 can be separate from a meter used by the grid to measure and charge for power delivered from the grid. There can be multiple devices 800 that couple to a single grid meter.

Device 800 includes load interface 820. Load interface 820 provides hardware to interconnect to downstream devices. Device 800 monitors the energy usage of downstream devices. In one embodiment, device 800 includes voltage sense hardware 824 and current sense hardware 822. Current sense hardware 822 can measure current drawn by the loads, and can include hardware capable to measure harmonic components of power demand. Current sense 822 can include magnitude, phase offset (e.g., power factor), frequency, and/or other electrical properties of a current drawn by a load or group of loads. In one embodiment, device 800 can generate energy signatures and compare such energy signature computations to stored energy signatures. Device 800 can also store new energy signatures computed. Voltage sense hardware 824 can measure a voltage including phase, frequency, magnitude, and/or other electrical property of the voltage waveform.

Processor 810 represents control logic or a controller for device 800. Processor 810 can be configured or programmed to perform the energy monitoring. Processor 810 can be configured to perform computations to compute energy signatures and/or compare current and voltage readings to energy signatures. In one embodiment, processor 810 determines how current can be adjusted to compensate for harmonics, a grid condition, or other condition to bring the PCC into compliance, and/or to provide support to compensate for a failure at another control node. Processor 810 can perform operations and include hardware and/or control logic to track energy consumption of the grid network segment below device 800, and determines how to compensate to bring the local grid network segment below it into compliance. While not shown, metering device 800 operates in conjunction with a power converter to provide the needed reactive power indicated by the monitoring.

Device 800 includes external I/O 840 to enable device 800 to connect to other metering devices or control nodes, and to connect to a data center or other central data device. In one embodiment, external I/O 840 enables device 800 to connect to grid management of a traditional utility power grid. In one embodiment, external I/O 840 enables device 800 to send data to and/or to receive data from a central data center. External I/O 840 can receive dispatch information for device 800. External I/O 840 can include any type of communication interfaces, including known wired and/or wireless communication mechanisms. In one embodiment, external I/O 840 includes proprietary and/or customer communication mechanisms, which can include wireline and/or wireless communication platforms, including hardware and software stacks or other processing logic to send and receive communication.

Grid interface 850 represents hardware to enable device 800 to couple to the grid network. In one embodiment, grid interface 850 enables device 800 to determine a condition of a grid at a PCC associated with device 800. In one embodiment, grid interface 850 represents hardware to enable device 800 to couple to a local energy source. In one embodiment grid interface 850 and/or other interface within device 800 enables device 800 to determine what type (how much) energy support can be provided from its downstream devices. For example, device 800 can determine how much energy is being produced by local energy source(s). The power converter adjusts the interface to the grid at the PCC by adjusting its operation, including what current waveform appears at the PCC.

In one embodiment, device 800 includes storage resources, such as memory and/or hard drives or solid state storage. Storage 830 represents memory resources for device 800. In one embodiment, device 800 stores multiple signatures 832 to be used in monitoring and controlling loads. In one embodiment, each signature 832 is a complex current vector representing a condition of a current waveform drawn under various loads. In one embodiment, processor 810 can generate and store signature 832. In one embodiment, signatures 832 are preloaded on device 800. In one embodiment, processor 810 computes composite current waveform information to compare to signatures 832. Depending on matching to the signatures, processor 810 can calculate a current waveform phase and shape that is desired for a given load scenario (power demand) and/or power generation scenario.

In one embodiment, processor 810 accesses one or more items of compliance information 834. In one embodiment, compliance information 834 is stored in storage 830. In one embodiment, compliance information 834 is received via external I/O 840. In one embodiment, processor 810 computes a current waveform phase and shape desired for a given power demand scenario and/or power generation scenario based on compliance information 834. Thus, compliance information 834 can affect how device 800 operates. In one embodiment, external I/O 840 enables device 800 to couple to an associated converter or converters. Based on calculations made by processor 810, device can signal a converter how to operate to achieve the desired current. In one embodiment, device 800 simply indicates the desired current to the converter, which can then separately compute how to generate the current. In one embodiment, device 800 computes specific parameters as input to a converter device to cause it to adjust its operation for the desired current waveform at the PCC.

In one embodiment, metering device 800 is capable of location awareness, in accordance with location awareness mentioned previously. With location awareness, processor 810 can, in one embodiment, determine its location. Thus, based on conditions measured or received for grid interface 850, processor 810 can compute a reactive power needed based on location detection. External I/O 840 can then signal the associated converter(s) to generate the power. Device 800 can detect and determine to provide voltage support upstream towards the generator or central grid network management by causing the control node at the PCC to give negative or lagging-phase reactive support. Device 800 can detect and determine to provide voltage support downstream away from the generator or central grid network management by causing the control node at the PCC to positive or leading-phase reactive support. It will be understood that leading support refers to a current waveform that leads an AC voltage of the grid in phase. Similarly, lagging support refers to a current waveform that lags the AC voltage of the grid in phase.

Signatures 832 represent complex current vectors for one or more loads. The complex current vectors are composite currents that a drawn when a load is active. In one embodiment, each signature has an associated complex current vector, with an apparent power component, and harmonic components that shift the actual power used by the load. In one embodiment, device 800 can track the signatures and cause an associated power converter to operate differently based on detecting specific loads coming online and/or going offline.

In one embodiment, processor 810 includes can perform vector calculations and/or vector analysis of monitored currents. Thus, device 800 can identify and track various energy signatures or current signatures. Signatures 832 can be referred to as current signatures, referring to the fact that when the various loads are active or operational, there will be a specific, identifiable current vector associated with the load coming online. Signatures 832 can be referred to as energy signatures, referring to the fact that the complex vectors themselves are representations of the complex energy usage of the loads when they are active.

Signatures 832 can represent not just the measurable power component of energy for a load, but also include information about the harmonics or harmonic noise as well. Thus, in one embodiment, device 800 can aggregate harmonic information as well as measurable energy usage. The resulting representation of signatures 832 is not a traditional power vector, but includes information about harmonics. In one embodiment, knowledge of harmonics can inform the operation of a converter to adjust an interface to power supply to suppress harmonics.

In one embodiment, an energy signature 832 is unique to one or more loads or load conditions based on measuring and computing a composite current for the loads. In one embodiment, each energy signature 832 represents a load condition (a scenario when various loads are concurrently on), as opposed to identifying a specific device. Device 800 can identify a complex current vector for a load including identifying a real power component and a reactive power component for the primary current, and a real power component, a reactive power component, and an angular displacement relative to the primary current for the harmonics.

Figure 9:
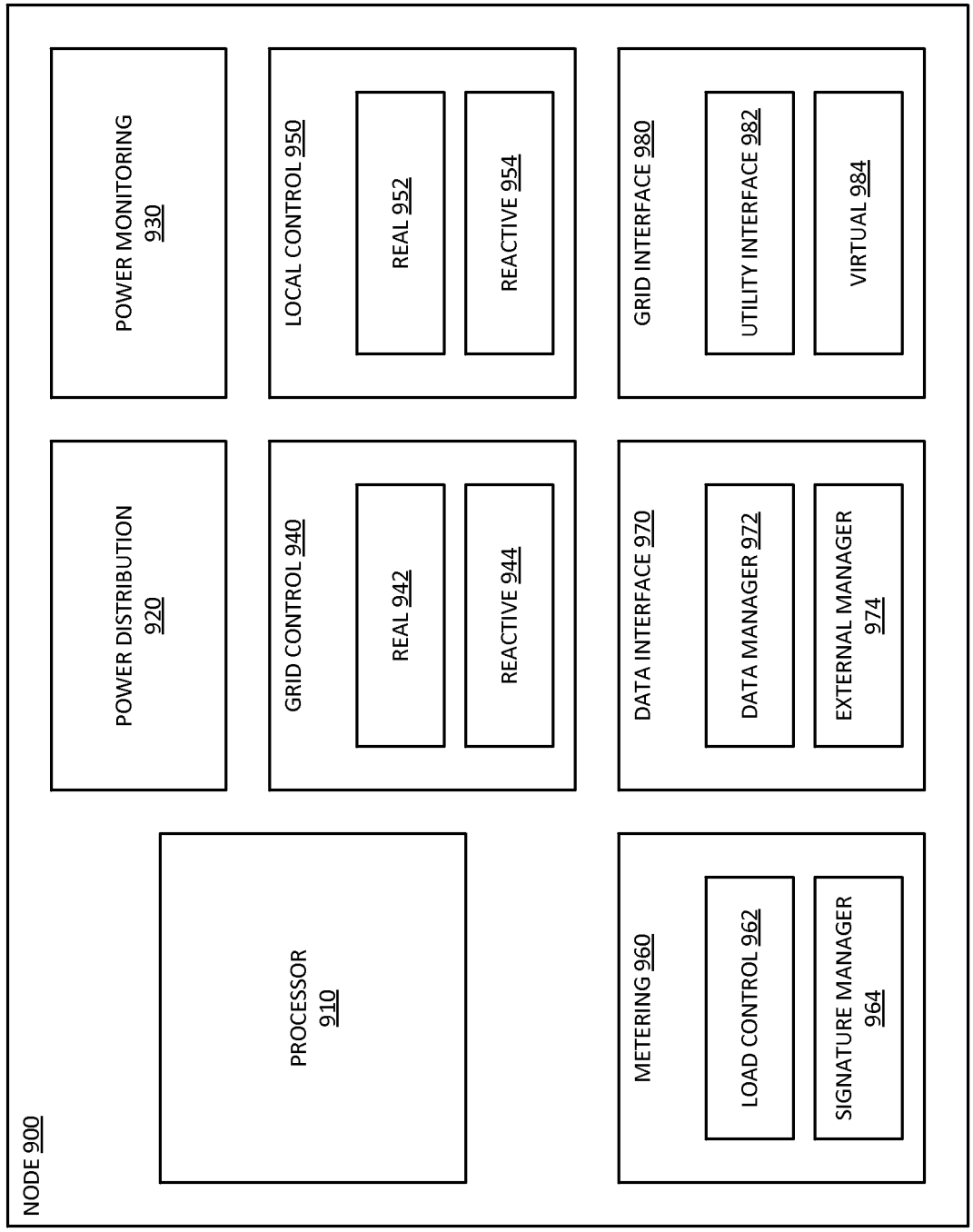
FIG. 9 is a block diagram of an embodiment of a node for a distributed power grid.

FIG. 9 is a block diagram of an embodiment of a node for a distributed power grid. Node 900 represents a control node, and can be an example of a control node in accordance with any embodiment described herein. Node 900 includes various hardware elements to enable its operation. In general, the hardware can be described as processor 910, power distribution hardware 920, and power monitoring hardware 930. Each of these elements can include specific types and functionality of hardware, some of which can be represented by other elements of FIG. 9.

Processor 910 represents one or more controllers or processors within node 900. In one embodiment, node 900 includes a power meter, a power converter, and control hardware to interface the two elements and couple to the grid. In one embodiment, each separate item includes a controller, such as a controller within the metering device, and a controller within the power converter. The power converter can include a power extractor controller, an inverter controller, and another controller to manage them. Thus, controller 910 can represent multiple controllers or elements of control logic that enables node 900 to monitor and distribute power.

Processor 910 manages and controls the operation of hardware within node 900, including any hardware mentioned above. Processor 910 can execute to provide MGI (modern grid intelligence) for node 900. In one embodiment, processor 910 executes logic to provide at least some of the functions described with respect to node 910. To the extent that functions described are provided by hardware, processor 910 can be considered a controller to control the operation of the hardware. In one embodiment, processor 910 executes a control node operating system for node 900. In one embodiment, the operating system is MGIOS (Modern Grid Intelligent Operating System). MGIOS can provide capabilities and benefits including at least some of the following.

The MGIOS can provide computing, and general control over the operation of node 900. In one embodiment, the MGIOS enables the node to collect data and make decisions to send data outside the node. In one embodiment, the MGIOS can use the data to control the local system, such as the local elements coupled to a same side of a PCC. In one embodiment, the MGIOS also sends data for use by external entities, such as a utility manager and/or other nodes in the grid network.

In one embodiment, the MGIOS controls dispatch functionality for node 900. The dispatching can include providing and receiving data and especially alerts used to determine how to distribute power. In one embodiment, the MGIOS can enable autonomous dispatching, which allows the nodes of the grid network to share information among themselves that control the operation of the grid. The autonomous dispatching refers to the fact that a central grid operator does not need to be involved in generating or distributing the dispatch information.

In one embodiment, the MGIOS enables control functionality. The control can be by human, cloud, and/or automated control logic. In one embodiment, the MGIOS enables node 900 to work independently as an individual node and/or work in aggregate with other control nodes in a grid network. The independent operation of each can enable the distributed network to function without a central power plant, and/or with minimal central grid management.

In one embodiment, the MGIOS can enable blackstart operation. Blackstart operation is where node 900 can bring its segment of the grid back up online from an offline state. Such operation can occur autonomously from central grid management, such as by each node 900 of a grid network independently monitoring conditions upstream and downstream in the grid network. Thus, node 900 can come online when conditions permit, without having to wait for a grid operator to control distribution of power down to the node. Node 900 can thus intelligently bring its node segment back up online by controlling flow of power to and from the grid, and can thus, prevent startup issues.

In one embodiment, the MGI enables node 900 to offer multiple line voltages. In one embodiment, grid interface 980, which may be through control logic of processor 910, can be configured for multiple different trip point voltages. Each trip point voltage can provide a different control event. Each control event can cause processor 910 to perform control operations to adjust an interface of the control node. The interface can be an interface to a load and/or an interface to the grid network.

In one embodiment, the MGI can economize interconnects within the grid network. In one embodiment, node 900 controls backflow onto the grid network by limiting the backflow, and/or adjusting output to change a type of power presented to the grid. In one embodiment, node 900 provides utility control functions that are traditionally performed by utility grid management that controls flow of power from a central power plant. Node 900 can provide the grid control functions to enable a distributed power grid.

Power distribution hardware 920 includes power lines, connectors, phase locked loops, error correction loops, interface protection or isolation such as transformers, and/or other hardware that enables the control node to transfer energy from one point to another, to control interfaces to control how power flows throughout the grid, or other operations. In one embodiment, a power converter can be included within the power distribution hardware. A power converter can be a smart inverter or microinverter, and can be in accordance with what is described with respect to systems 1500 and 1600.

Power monitoring hardware 930 includes connectors, signal lines, sampling hardware, feedback loops, computation hardware, and/or other hardware that enables the control node to monitor one or more grid conditions and/or load conditions. The grid conditions can be or include voltage levels, phases, frequencies, and other parameters of the grid operation. The load conditions can be or include voltage, current, phase, frequency, and other parameters of power demand from loads.

In one embodiment, node 900 includes grid control 940. Grid control represents hardware and logic (e.g., such as software/firmware logic, configurations) to control an interface to the grid network. In one embodiment, grid interface 980 represents grid network interfaces. Grid control 940 can include real power control 942 and reactive power control 944. The real and reactive control can be in accordance with any embodiment described herein. In one embodiment, real power control 942 includes logic (hardware and/or software) to provide real power to the grid. In one embodiment, reactive power control 944 includes logic to provide reactive power to the grid. Providing power to the grid can include changing an interface to cause power of the type and mix desired to flow to the grid.

In one embodiment, node 900 includes local control 950. Local control represents hardware and logic (e.g., such as software/firmware logic, configurations) to control an interface to the load or to items downstream from a PCC coupled to a grid network. Local control 950 can include real power control 952 and reactive power control 954. The real and reactive control can be in accordance with any embodiment described herein. In one embodiment, real power control 952 includes logic (hardware and/or software) to provide real power to a load. In one embodiment, reactive power control 954 includes logic to provide reactive power to a load. Providing power to the load can include changing an interface to cause power of the type and mix desired to flow to the load from a local energy source and/or from the grid.

It will be understood that a utility power grid has rate structures that are based on not just the amount of use, but the time of use. For example, a utility grid can have tiered rates. In one embodiment, processor 910 includes rate structure information that enables it to factor in rate structure information when making calculations about how to change an interface with grid control 940 and/or with local control 950. Factoring in rate structure information can include determining what type of power (real or reactive) has more value in a given circumstance. Thus, processor 910 can maximize value of energy production and/or minimize the cost of energy consumption. In an implementation where tiered rate structures exist, processor 910 can instruct grid control 940 and/or local control 950 based on how to keep consumption to the lowest tier possible, and how to provide power at a highest rate possible. In one embodiment, processor 910 takes into account utility or grid network requirements when controlling the operation of grid control 940 and/or local control 950. For example, the grid may have curtailments or other conditions that affect how power should be provided and/or consumed. In one embodiment, node 900 can adjust power output as loads dynamically come online and offline. For example, local control 950 can reduce output when loads go offline, and can increase output when load come online.

Metering 960 represents metering capability of node 900, and can include a meter in accordance with any embodiment described herein. In one embodiment, metering 960 can include load control metering 962. Load control 962 can include logic to monitor load power demand. In one embodiment, metering 960 can include signature manager 964. Signature manager 964 includes logic to create, store, and use energy signatures in monitoring what is happening with loads. More specifically, signature manager 964 can manage energy signatures including complex current vectors in accordance with any embodiment described herein.

Traditionally, a net energy meter was required to connect to the grid. However, newer regulations may prevent connecting to the grid at all unless certain capabilities are met. Metering 960 can enable node 900 to control an inverter or converter to respond to specific loads and/or to specific energy signatures identified on the line. Based on what metering 960 detects, node 900 can provide realtime control over energy production and load consumption.

In one embodiment, node 900 includes data interface 970. In one embodiment, data interface 970 includes data manager 972 to control data that will be sent to a data center or data management, and data that is received from the data center or data management. Data manager 972 can gather data by making a request to a data center or comparable source of data. In one embodiment, data interface 970 includes external manager 974, which can manage the interface with a data center, central grid management, other nodes in the grid network, and/or other data sources. In one embodiment, data manager 972 receives data in response to data sent from a data source. In one embodiment, external manager 974 makes a request for data from a data source. The request can be in accordance with any of a number of standard communication protocols and/or proprietary protocols. The medium for communication can be any medium that communicatively couple node 900 and the data source. In one embodiment, external manager 974 communicates with a data source at regular intervals. In one embodiment, external manager 974 communicates with the data source in response to an event, such as more data becoming available, whether receiving indication of external data becoming available, or whether data manager 972 indicates that local data is ready to send. Data interface 970 can enable realtime data for market use. In one embodiment, data interface 970 provides data collection, which can be used in one embodiment to identify currents for energy signatures.

In one embodiment, node 900 includes grid interface 980. In one embodiment, grid interface 980 includes utility interface 982 to interface with a utility grid. In one embodiment, grid interface 980 includes virtual interface 984 to interface with a distributed grid network. The operation of the grid interface can be referred to as MGI (modern grid intelligence), referring to execution of an MGIOS by processor 910. Grid interface 980 can include any type of interface that couples node 900 to grid infrastructure, whether traditional utility grid infrastructure and/or distributed grid networks. In one embodiment, grid interface 980 can enable node 900 to know a power direction. In one embodiment, the grid network provides dispatch information, such as provide a signal from a feeder to indicate a power direction. Node 900 can manage its operation based on the direction of power flow in the grid network. Grid interface 980 can also dynamically monitor changes in direction of power flow.

In one embodiment, the MGIOS enables node 900 to adjust operation of one or more elements connected downstream from a PCC, to scale back operation of the grid.

Consider an example of air conditioners coupled downstream from a PCC. In one embodiment, the MGIOS can detect that the grid network is experiencing heavy load, and can determine to slow down all air conditioners to relieve the grid for 5 to 10 minutes. Thus, the devices do not need to be stopped, and the grid does not need to shut off power to any segment. Instead, the power can be reduced for a period of time to selected loads to allow the grid can recover itself. Thus, the MGIOS can control the load and/or the sources. Such operation can reduce or prevent brownouts or rolling blackouts, for example, by scaling power demand back instead of completely shutting supply down.

It will be understood that node 900 requires a certain amount of power to operate. The power consumed by node 900 can be referred to as tare loss, which indicates how much power the controlling devices consume when the node is not generating power. In one embodiment, node 900 includes a sleep feature to reduce tare loss. For example, a node that controls a metastable energy source such as solar can sleep when there is no sun, and can wake up when the sun comes up. In one embodiment, the node can default to a low power state and awake in response to a signal from a solar detector, power over Ethernet, or some other external signal trigger to wake it up. In one embodiment, a node can wake up during a sleep cycle at night to perform upgrades or perform other ancillary services.

Figure 10:
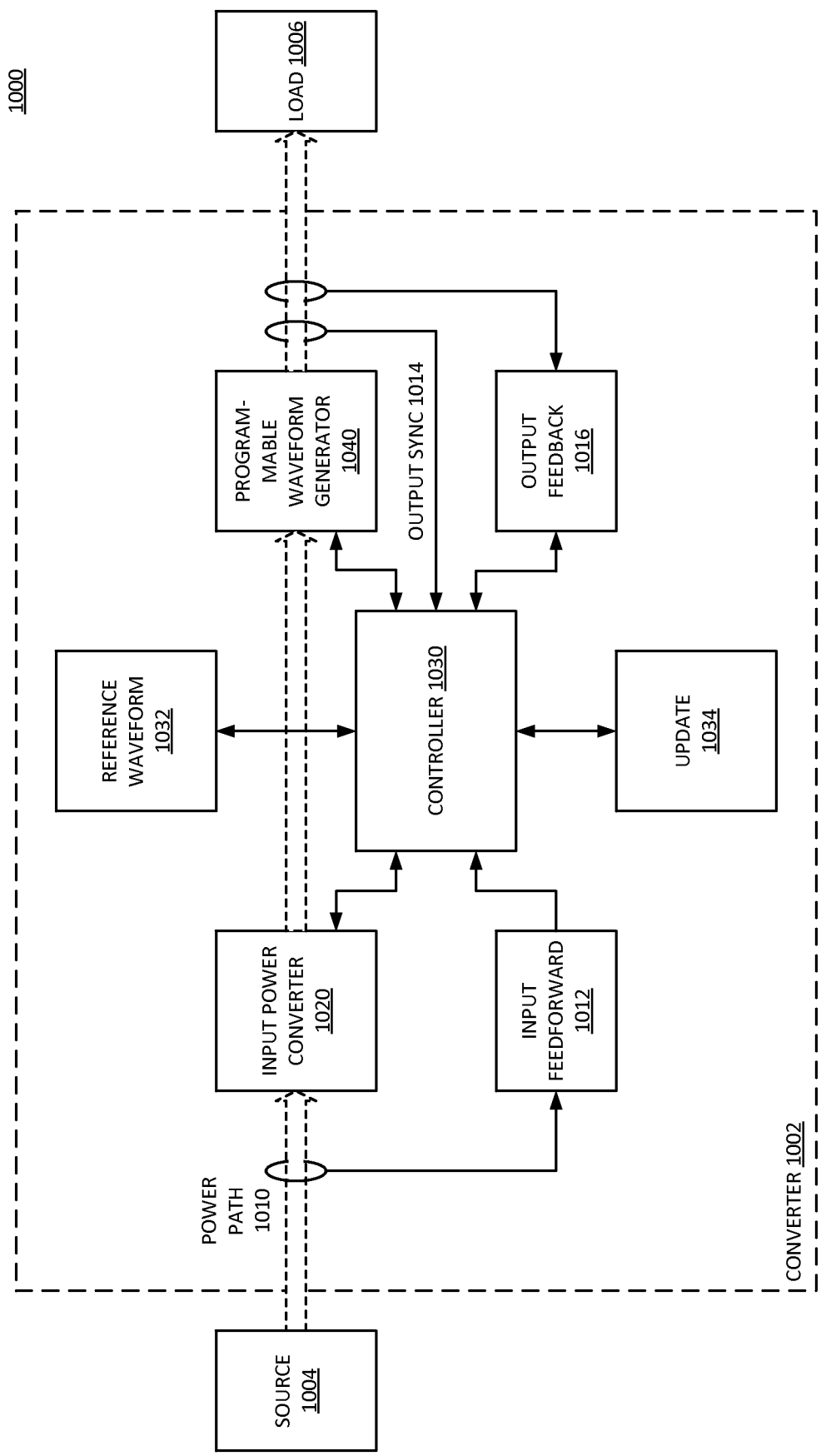
FIG. 10 is a block diagram of an embodiment of a system that controls harmonic distortion with a software feedback control subsystem coupled to a hardware waveform controller.

FIG. 10 is a block diagram of an embodiment of a system that controls harmonic distortion with a software feedback control subsystem coupled to a hardware waveform controller. System 1000 includes power source 1004, load 1006, and converter 1002 to generate output and control of an interface between the source and the load. In one embodiment, converter 1002 is in accordance with what is described in U.S. patent application Ser. No. 12/708,514, entitled "POWER TRANSFER MANAGEMENT FOR LOCAL POWER SOURCES OF A GRID-TIED LOAD," and filed Feb. 18, 2010. In one embodiment, the power conversion can be in accordance with U.S. patent application Ser. No. 11/849,242, entitled "MULTI-SOURCE, MULTI-LOAD SYSTEMS WITH A POWER EXTRACTOR," and filed Aug. 31, 2007. System 1000 can be one example of a system includes a converter for a control node in accordance with any embodiment described herein.

Power path 1010 represents the path of electrical power from source 1004 to load 1006, as controlled by converter 1002. Converter 1002 includes input power converter 1020 to receive input power from source 1004 and convert it to another form (e.g., DC to AC). Input power converter 1020 includes hardware components for receiving a power signal to convert, and may include appropriate power components. In one embodiment, input power converter 1020 implements dynamic impedance matching, which enables the input electronics to transfer maximum power from source 1004. Dynamic impedance matching includes constantly tracking a maximum power point, as well as driving an input power coupler (e.g., a transformer) to maintain as flat a power slope as possible (e.g., slope of zero). Input power converter 1020 may receive control signals or information from controller 1030, as well as providing input to indicate operation of the converter. In one embodiment, dynamic impedance matching includes high-frequency switching of the input power through a transformer or inductor to charge an internal node within converter 1002. The internal node can then act as an energy reservoir for high-frequency switching of an output through another transformer or inductor to allow a load to draw whatever power is needed. Thus, input power converter 1020 can provide unregulated energy transfer from an input to an output.

Input feedforward 1012 provides information (e.g., maximum power value, frequency as appropriate, or other information to control the input power converter hardware) about the source power to controller 1030. Controller 1030 controls input power converter 1020 based on the input information about the input power. Controller 1030 represents any type of processor controller that may be embedded in converter 1002. Controller 1030 may be or include any type of microcontroller, digital signal processor (DSP), logic array, or other control logic. Additionally, controller 1030 may include appropriate memory or storage components (e.g., random access memory, read only memory (ROM), registers, and/or Flash) to store code or values generated or obtained during runtime operation or pre-computed.

Controller 1030 drives programmable waveform generator 1040 to generate the desired output waveform. Generator 1040 also lies on power path 1010, and receives input power from input power converter 1020 to output. While the power may be transferred, it is not necessarily output with the same waveform as it is received. For example, a DC signal may be output as a sinusoidal signal. Other power conversions can similarly be accomplished. In one embodiment, generator 1040 includes a PWM (pulse wave modulator) to generate an output waveform. Generator 1040 receives control signals and information from controller 1030, and may provide status or operations information or feedback to controller 1030. The output waveform may be either current or voltage. In one embodiment, the output is a current having a phase offset and an angular offset with respect to a load voltage waveform to enable harmonic-free output.

Converter 1002 is able to incorporate specific timing, phasing, or other frequency information, into generating the output waveform. Such timing, phasing, or other frequency information may be referred to as "input synchronization data." In one embodiment, such input synchronization data arrives from real-time load information, in which case it may be referred to as "load synchronization input." The load synchronization input or input synchronization data indicates information necessary to determine the synchronization signal discussed above. Such information is indicated in converter 1002 as output sync 1014. In a system where the output is anticipated (e.g., connecting to an electrical grid), certain voltage, timing, or other information may be expected (e.g., 120V at 60 Hz), and an initial estimate programmed in or made by the system at startup. Based on load synchronization data, the initial estimate may be adjusted.

Controller 1030 also measures output feedback 1016 off power path 1010, to determine the actual output generated by generator 1040. The actual output is compared to an ideal reference to determine if the desired output is being generated. In one embodiment, output feedback 1016 is an abstraction to represent output measurement by controller 1030, and does not include separate components in itself. In one embodiment, output feedback 1016 includes a sampling mechanism or other data selection mechanism to compare to the ideal reference signal. The ideal reference signal can be an idealized representation of a desired output waveform. The output converges on the idealized waveform rather than on the target waveform of the load or grid itself. If output feedback 1016 includes components separate from controller 1030, it may be driven by controller 1030, and receive comparison data from controller 1030 and provide error or feedback information. In one embodiment, output feedback 1016 is understood to include at least hardware components necessary for a feedback control process to interface with the output lines. Additionally, output feedback 1016 may include other hardware for performing measurements, computations, and/or performing processing.

Both output sync 1014 and output feedback 1016 may be considered feedback loops. It will be understood that output sync 1014 and output feedback 1016 are not the same thing, and serve different purposes. Output sync 1014 indicates what the ideal reference signal should look like, as stored in reference waveform table 1032. Output feedback 1016 indicates how the actual output varies from the reference signal. Update table 1034 represents data generated in response to output feedback 1016. In one embodiment, output sync 1014 is based on voltage information on the output of power path 1010, while output feedback 1016 is based on output current generated at the output of power path 1010.

Based on output sync 1014 (or based on an initial estimate of the output sync), converter 1002 stores and/or generates reference waveform table 1032, which represents an ideal form of the output waveform desired to be generated by generator 1040. Reference waveform table 1032 may be stored as a table or other set of points (or setpoints) that reflect what the output waveform "should" look like. The reference waveform can be any periodic waveform. In one embodiment, the reference waveform is represented as a series of points that have an amplitude and a position. Thus, converging on the reference waveform can include driving an output waveform generator to match sampled output points to the setpoints representing the reference waveform. Reference waveform table 1032 may alternatively be referred to as a reference waveform source.

Based on output feedback 1016, converter 1002 generates update table 1034. Update table 1034 includes entries or points to indicate how to modify the operation of generator 1040 to provide an output more closely matching the waveform of reference waveform table 1032. While indicated as a table, update table 1034 may be a stored table that is modified at certain intervals (e.g., each entry is updated as necessary to reflect measured error data), or may be generated newly at each update interval. Update table 1034 may alternatively be referred to as an update data source. The "updates" may be modifications of old values, the replacement of values, or may be stored in different locations within a memory accessed by controller 1030. In one embodiment, each value of update table 1034 indicates an "up," "down," or no change for each of a set of points. Such values are applied to the hardware that controls the output of generator 1040 to cause the output signal to converge on the desired ideal waveform.

From one perspective, converter 1002 can be viewed as having five features or components. While these features are depicted in system 1000 via certain block diagrams, it will be understood that different configurations and a variety of different components can be used to implement one or more of these features. For purposes of discussion, and not by way of limitation, these features are described following with references such as "Feature 1," "Feature 2," and so forth. It will be understood that such a convention is merely shorthand to refer to the subject matter of the described feature or component, and does not necessarily indicate anything with respect to order or significance.

Feature 1 may include means for incorporating specific timing, phasing or other frequency information. The means includes hardware and/or software to generate and receive the input synchronization data or load synchronization input referred to above, which is based on output sync 1014.

Feature 2 includes reference waveform table 1032, which may include a table of data or an equation within software that represents the ideal form of output waveform 1008. Feature 3 includes controller 1030, which may be or include a software algorithm that compares the actual output waveform generated by generator 1040 with the ideal tabular representation as represented by reference waveform table 1032. Feature 4 includes an algorithm within controller 1030 that computes or otherwise selects and generates update data represented by update table 1034. Feature 5 includes generator 1040 that uses the update data from update table 1034 to generate output waveform 1008 of the desired shape, proportion, timing, and phase.

With regard to Feature 1, the specific timing, phasing, or other frequency information provides synchronization information to the comparison and update algorithms in controller 1030. The information may come by way of a table, equation, sampling of real-time hardware monitored signals, or other source.

With regard to Feature 2, the data representing the reference waveform, can be of any length and of any format, integer or non-integer, if within a table. Such a table may be generated dynamically at runtime or be hard-coded at compile time. The ideal form of the waveform represented may be sinusoidal or non-sinusoidal. The waveform may be represented by data values evenly spaced in the time domain or non-evenly spaced, forward in time or backward in time or any mix thereof. The waveform could alternatively be represented by data values in the frequency domain, and organized in any fashion. The data may be compressed or non-compressed. The data may be represented by an equation rather than computed data setpoints, or part by an equation and part by a table. In one embodiment, the stored setpoints in a table are the computed results of an equation. The data may be altered during processing at runtime to change the form of the ideal waveform to a different ideal. The values in reference waveform table 1032 can be modified or replaced with different values if altered at runtime. The data may be aligned to be in exact phase with the input waveform or it may be shifted in phase.

With regard to Feature 3, controller 1030 may include any traditional or standard comparison algorithm. A control algorithm compares data values representing the output waveform, sampled by hardware, and transformed into software data values through standard or non-standard sampling techniques. In one embodiment, the controller compares the ideal setpoints of the table or equation computations with the synchronization information, point by point, and generates error data, point by point. In one embodiment, the controller can process multiple points at once instead of point-by-point.

With regard to Feature 4, controller 1030 includes a selection algorithm which creates or generates new data using any standard or non-standard technique. In one embodiment, the selection algorithm involves performing calculations. Alternatively, the selection algorithm may simply select data without performing processing or performing calculations. The selection algorithm may replace data values in a table of setpoints, or leave the data values in the table preferring to use another storage area. The selection algorithm may transform the data from the time domain to the frequency domain and vice-versa as part of its selection process. The algorithm provides an error update mechanism (e.g., algorithm) in that it identifies data values that will correct the output waveform when applied. Thus, the output waveform after application of the data values appears more like the preferred ideal waveform.

With regard to Feature 5, the new data values represented by update table 1034 are applied to hardware in generator 1040 through standard processes to drive the generation of the output waveform. In one embodiment, the new data values are applied via a PWM mechanism or any other mechanism that transforms discrete data values into an analog output form.

Figure 11:
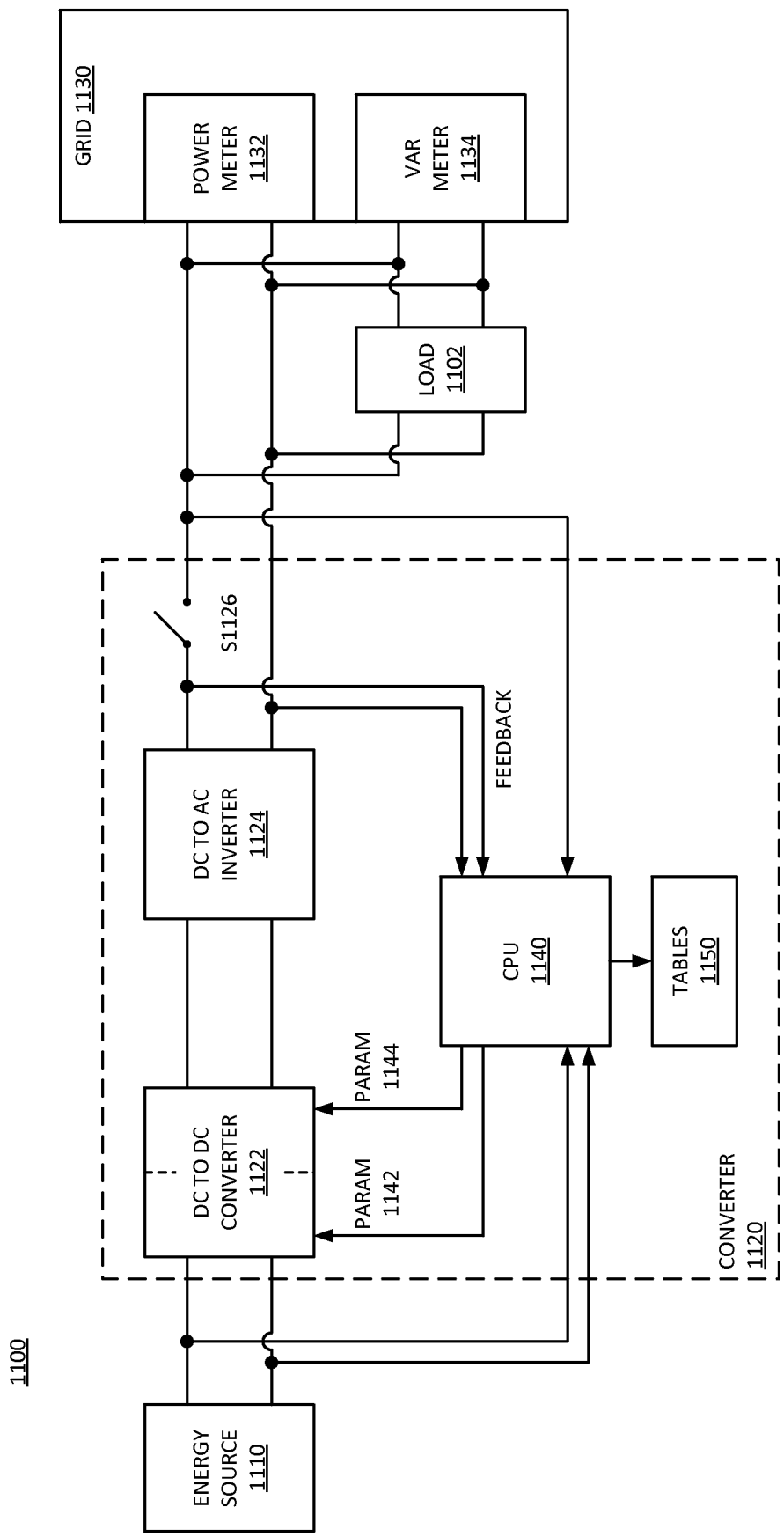
FIG. 11 is a block diagram of an embodiment of a system that transfers power from a local source to a grid-tied load with power factor conditioning.

FIG. 11 is a block diagram of an embodiment of a system that transfers power from a local source to a grid-tied load with power factor conditioning. System 1100 illustrates a grid-tied converter that couples to an energy source, a load, and a grid. Converter 1120 of system 1100 represents a converter for a control node, which can be in accordance with any embodiment described herein. System 1100 represents a power system that includes metastable energy source 1110, converter 1120, load 1102, and utility power grid 1130. Load 1102 represents a consumer tied to grid 1130. Grid 1130 can be any embodiment of a grid network described herein. Metastable source 1110 (e.g., solar cells/array, wind power generator, or other time-varying or green power source) and converter 1120 are local to load 1102, as being on a same side of a PCC, and provide power to the load. In one embodiment, metastable source 1110 produces a variable/unstable source of DC power. The source may be time-varying and/or change in available power due to environmental conditions. Converter 1120 represents a dynamic power extractor and inverter apparatus.

Source 1110 is a variable or unstable power source. System 1100 includes converter 1120, which includes DC/DC converter 1122, coupled to DC/AC inverter 1124, both of which are coupled to and controlled by controller (CPU) 1140. Additionally, switching device S1126 (e.g., a relay) selectively connects the inverter to load 1102 and grid 1130. Under normal operation, DC power is drawn from source 1110, and extracted, inverted, and dynamically treated by converter 1120, to dynamically produce maximum AC current relatively free of harmonic distortion and variability, and at a desired phase with respect an AC voltage signal from grid 1130. Putting the generated AC current in phase with the grid AC voltage produces AC power with a power factor at or near unity to load 1102, meaning that all reactive power drawn by the load comes from grid 1130. If source 1110 produces enough energy to satisfy the real power requirements of load 1102, converter can cause the only AC power drawn from grid 1130 by the load to be exclusively or nearly exclusively reactive power. When source 1110 is unable to produce DC power sufficient to completely satisfy the power demand from load 1102, converter 1120 can adjust an interface to allow real power to flow from grid 1130 to load 1102.

In one embodiment, converter 1120 can generate AC current intentionally out of phase to a certain extent with respect to the AC voltage signal of the grid. Thus, the single converter 1120 can deliver power at any desired power factor to compensate for conditions of power on power grid 1130. In one embodiment, multiple converters 1120 can operate in parallel at the same interface, and each can generate power with the same power factor, or each can be dynamically configured to produce different mixes of real and reactive power.

When energy source 1110 generates sufficient power to satisfy load 1102, the inverter current and the grid current will flow towards grid 1130. In general, power can be given back generally to the grid, and the consumer can be appropriately compensated for power provided to the grid. In one embodiment, a give back scenario can involve providing power to a neighbor consumer, in accordance with any embodiment described herein.

In one embodiment, power meter 1132 represents a meter to measure real power consumed by load 1102. In one embodiment, VAR meter 1134 represents a meter to measure the reactive power consumed by load 1102. In one embodiment, power meter 1132 and VAR meter 1134 can be combined physically and/or functionally by a meter. The meter can be on the side of grid 1130. In one embodiment, the meter (combining meters 1132 and 1134) is located with a PCC to connect to the grid, and is part of a control node with converter 1120. Such a meter can be in accordance with any embodiment described herein. In one embodiment, typically meter 1132 measures the voltage and current and computes power from those measurements. It will be understood that in the case only reactive power is drawn from grid 1130, power meter 1132 will not measure any power usage by load 1102. VAR meter 1134 can measure and compute the reactive power drawn, such as by measuring the phase of the current and voltage of the grid power at the load, and performing calculations based on the measured values.

As discussed, in one embodiment, the power factor delivered by converter 1120 to load 1102 is at or near 1.0 relative to grid 1130. Thus, converter 1120 can perform power factor correction. In one embodiment, converter 1120 can provide harmonic distortion correction. In one embodiment, converter 1120 provides table-based harmonic distortion correction. Previous harmonic distortion techniques use a hardware-based method or Fast Fourier Transform (FFT). The table-based method implemented on a processor or controller reduces cost per inverter and scales better than typical hardware implementations, and can be in accordance with what is described with reference to system 800.

Inverter 1124 of converter 1120 generates output in accordance with a desired power factor (unity or otherwise). In one embodiment, inverter 1134 monitors the operating conditions at the point of connection to load 1102, and provides maximum power from source 1110 dynamically and in real time with changes in the energy source and current load. Thus, if the amount of energy generated by source 1110 changes, converter 1120 can modify the output based on that source in real time. Additionally, if the resistive conditions of load 1102 (e.g., an inductive motor such as a vacuum is turned on), converter can automatically generate changes to power output to track the needs of the load. All such changes can occur in realtime as conditions vary. In one embodiment, converter 1120 can provides output adjustments that provide total harmonic distortion control for harmonic distortion more efficiently than what is required by standards, thus complying with standards and improving performance of the system by dynamically adjusting to variable and unstable power sources, and to a changing load.

It will be understood that if the output voltage and current of converter 1120 are matched in phase with each other and with the voltage on the grid (e.g., through a phase lock loop, or through a power generation sampling and feedback mechanism), any reactive power necessary will be absorbed from the grid. The more real power provided by source 1110, the further out of phase the grid voltage and the grid current will be locally at load 1102. If all real power is provided locally, the current and voltage of the grid will be 90 degrees out of phase locally at load 1102, causing the grid real power contribution to fall to 0 (recall that Preal=(Vmax*Imax/2) cos(Vphase−Iphase)).

In one embodiment, DC to DC converter 1122 of power converter 1120 includes input and output portions, as represented by the dashed line separating the device into two portions. The portion coupled to source 1110 can be referred to as an input portion, and the portion coupled to DC to AC inverter 1124 can be referred to as the output portion. In one embodiment, the operation of converter 1122 is to vary input impedance and output impedance to transfer energy from source 1110 to inverter 1124. In one embodiment, converter 1122 can be referred to as a power extractor.

Converter 1122 can impedance match to change an interface on the input to maximize energy transfer from source 1110 without fixing the voltage or current to specific values. Rather, the input can allow the power to float to whatever voltage is produced by source 1110, and the current will match based on whatever total power is produced. Similarly, on the output, converter 1122 impedance matches to change an output interface to allow the load (in this case, inverter 1124) to draw whatever power is needed at whatever voltage the inverter operates at. Thus, the output of converter 1122 can float to match the voltage of inverter 1124, and generate current to match the total power. Converter 1122 can generate an output current waveform, where the magnitude is determined by how much energy is available, and whatever voltage inverter 1124 is at. Thus, the output floats to match the load, and is not fixed at current or voltage. An internal node within converter 1122 can act as an energy reservoir, where the input impedance matching enables the efficient charging of the internal node, and the output impedance matching enables the load to draw energy from the internal node. The input and output both couple to the internal node via inductors and/or transformers to isolate the input and output from each other and from the internal node.

Controller 1140 can monitor the AC current, which moves out of DC/AC inverter 1124, and the generated voltage of grid 1130, which appears across load 1102. Controller 1140 controls at least one electrical parameter of the interfaces of converter 1122 to control its operation. Parameters 1142 and/or 1144 represent control from controller 1140 to control the operation of converter 1122 within converter 1120. In one embodiment parameters 1142 and/or 1624 may be a duty cycle of a switching signal of the power extraction, which changes input and/or output impedance matching, which in turn controls the charging and drawing from the internal node. The modification of each parameter can be dependent on the quality of the monitored current and voltage. Controller 1140 further controls switching device S1626 to couple the load to power produced (by converter 1122 and inverter 1124 from source 1110), when suitably conditioned power is available for use by load 1102.

In one embodiment, converter 1120 includes tables 1150, which provides a table-based method for controlling power factor, to adjust the operation of converter 1120 to generate reactive power as desired. The tables may include entries that are obtained based on input conditions measured from the system, to achieve a desired mix of real and reactive power. Feedback from the grid-tied node may include voltage zero crossing, voltage amplitude, and current waveform information. With such information, controller 1140 uses tables 1150 to adjust the operation of converter 1122 and/or inverter 1124. The tables may include setpoints that provide idealized output signals the system attempts to create. By matching output performance to an idealized representation of the input power, better system performance is possible than simply attempting to filter and adjust the output in traditional ways.

In one embodiment, system 1100 can be applied without a specific energy source 1110. For example, converter 1120 can be coupled to receive power from grid 1130, and generate an output to load 1102 that provides whatever mix of real and reactive power is needed by load 1102. In one embodiment, converter 1122 can be adjusted to receive AC input. In one embodiment, a connection to converter 1122 can be configured with hardware to generate DC power from the grid, such as an AC to DC converter. However, it will be understood that such conversion cause some inefficiency. In one embodiment, converter 1122 can be implemented with an input transformer that will enable connection between grid power and the internal node.

Figure 12:
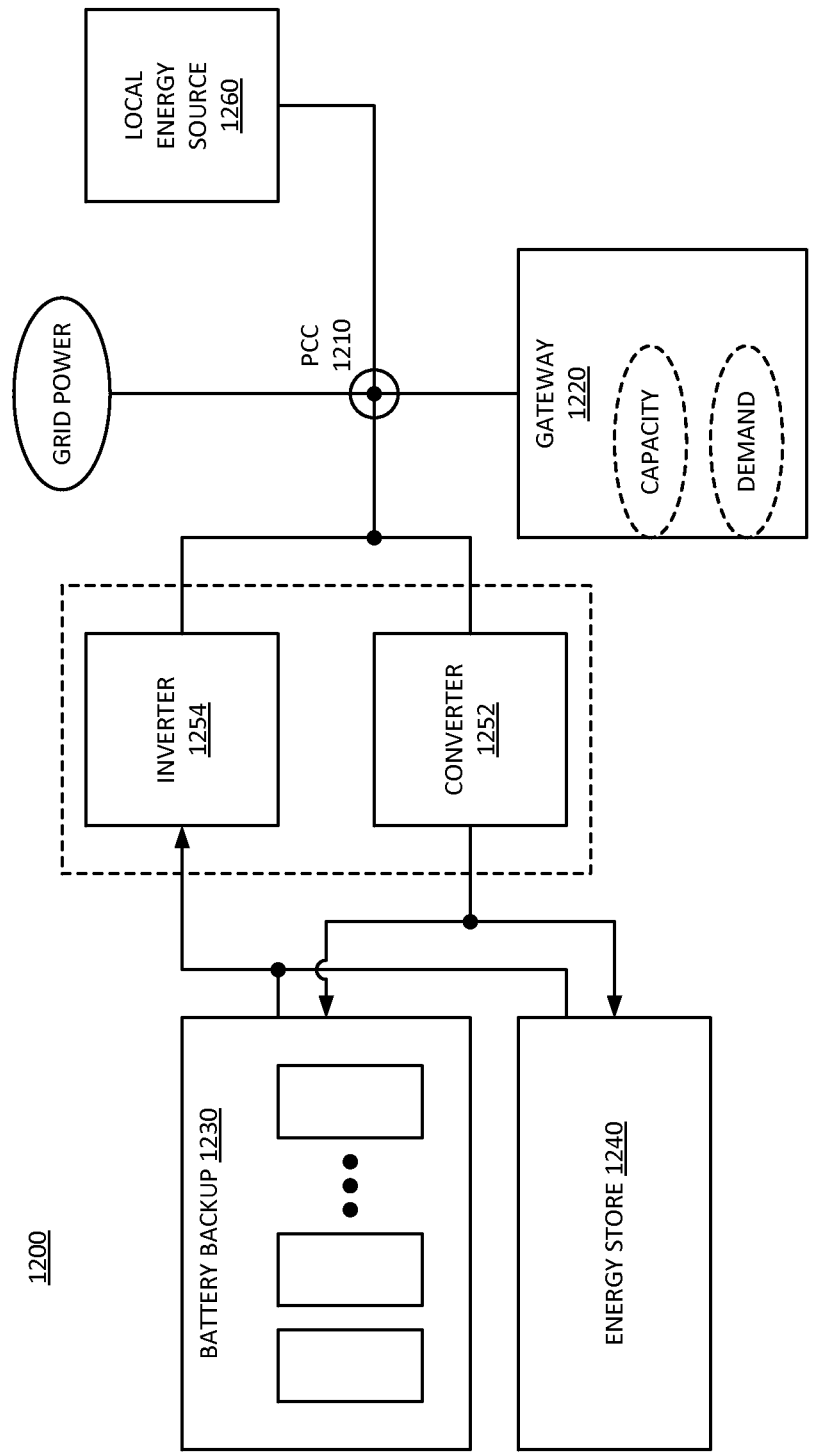
FIG. 12 is a block diagram of an embodiment of a consumer node having intelligent local energy storage.

FIG. 12 is a block diagram of an embodiment of a consumer node having intelligent local energy storage. System 1200 represents a consumer node or an area within a PCC in accordance with any embodiment described herein. System 1200 specifically shows a configuration where local energy storage is combined with local energy generation at a consumer node. System 1200 can be or include a control node in accordance with any embodiment described herein.

PCC 1210 represents an interconnection point to a grid network. Grid power represents power drawn from the grid. In one embodiment, system 1200 includes gateway 1220 to aggregate information and control operation within system 1200 based on the aggregation information. Gateway 1220 can manage the capacity and the demand for system 1200. The capacity refers to the ability of system 1200 to generate power locally. The demand refers to the load demand locally for system 1200, which comes from loads (not specifically shown).

In one embodiment, system 1200 generates capacity with one or more local energy sources 1260. Local energy source 1260 can be any type of energy generation system. In one embodiment, the energy generation mechanisms of local energy source 1260 generate real power. In one embodiment, local energy source 1260 represents an energy generation mechanism with an associated power converter and/or inverter. When source 1260 includes a power converter/inverter, it can be referred to as an energy generation system. Solar power systems are commonly used at customer premises, and source 1260 can be or include a solar power system.

System 1200 includes one or more energy conversion or power converter devices to control the flow of energy within the PCC. In one embodiment, converter 1252 and inverter 1254 represent power converter devices for system 1200. In one embodiment, each inverter includes a power converter. In one embodiment, a power converter represents an energy conversion device that enables efficient coupling between a source and a load, such as what is described in reference to system 1000 and system 1100. Devices 1252 and/or 1254 provide control of the interchange of energy within system 1200. In one embodiment, each energy source includes an inverter and/or converter. Thus, the devices represented in the dashed box represent devices that can be spread throughout system 1200. Each consumer node can include multiple converter devices for the control of energy flow. In one embodiment, each energy storage resource includes an inverter and/or converter.

System 1200 includes one or more energy storage resources. As illustrated, battery backup system 1230 represents a system of commercial batteries to store energy. Energy store 1240 represents a non-battery backup or energy storage device or system, but battery backup will be understood as a specific example of energy store. Examples of non-battery backup can include systems that include a pump or other motorized device that convert active power within system 1200 into kinetic energy. For example, energy store 1240 can pump water or other liquid against gravity, can compress air or other gas, can lift counterweights again gravity, or perform some other function to convert energy into work to store in a system. The stored energy can be retrieved later by using a reverse force (e.g., gravity or decompression) to operate a generator. Thus, the energy storage system can convert the kinetic energy back into active power for system 1200.

In one embodiment, converter 1252 can be used to charge an energy store (e.g., 1230, 1240) when it is depleted or partially depleted. In one embodiment, inverter 1254 can be used to convert energy from the energy store into active power. Gateway 1220 can intelligently control the use of energy storage 1230, 1240. For example, gateway 1220 can monitor grid conditions to know when the least "expensive" time to charge the energy storage is. Sometimes grid power is less expensive and can be converted into stored energy for later use. Sometimes there is excess capacity from energy source 1260 that can be stored locally in energy storage 1230, 1240.

In general, in one embodiment, system 1200 includes local energy source 1260, and local energy store 1230, 1240 on a consumer side of PCC 1210. System 1200 also includes a local energy conversion device such as converter 1252 and/or inverter 1254 to control the flow of energy to and from the energy storage in system 1200. The energy conversion enables system 1200 to access energy from the energy store and/or to charge the energy store. In one embodiment, system 1200 charges energy store 1230, 1240 from grid power. In one embodiment, system 1200 charges energy store 1230, 1240 from energy source 1260. In one embodiment, system 1200 powers a local load to meet local power demand from energy in energy store 1230, 1240. In one embodiment, system 1200 transfers power to the grid from energy store 1230, 1240. The use of stored energy can include the conversion of the energy to any mix of real and reactive power needed for the local load and/or the grid, depending on where the energy is being transferred.

Figure 13:
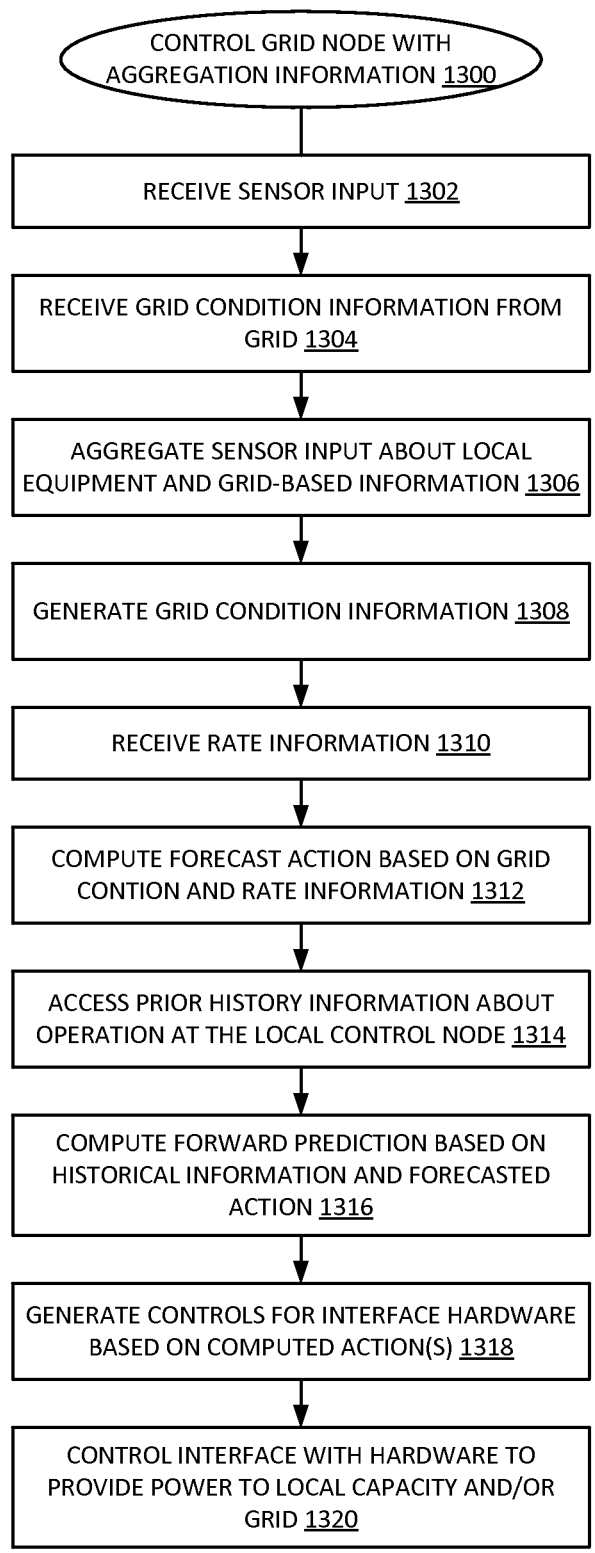
FIG. 13 is a flow diagram of an embodiment of a process for controlling a grid node with data aggregation.

FIG. 13 is a flow diagram of an embodiment of a process for controlling a grid node with data aggregation. Process 1300 for controlling a grid node with aggregation information can be performed by elements of a control node. In one embodiment, the control node includes a gateway device, which can be or include an aggregator. For simplicity, and not by way of limitation, the description of process 1300 refers to operations by an aggregator. The aggregator can be in accordance with any embodiment of an aggregator described herein. In one embodiment, the aggregation information includes information gathered by a local meter that measures local and/or external grid conditions.

In one embodiment, the aggregator interfaces with one or more sensors and can receive data measurements from the sensors, 1302. In one embodiment, the aggregator can receive one or more forms of external information about the grid. The external information is grid condition information that the aggregator can receive, 1304. In one embodiment, the aggregator aggregates sensor information about local equipment with grid-based information to determine one or more conditions to address with power converter operation, 1306. Thus, the aggregator can generate one or more items of grid condition information based on the aggregated data, 1308. In one embodiment, the grid condition information represents a state in a state machine, where the state is determined based on relationships between the condition information, which can include the grid information and the sensor information. In one embodiment, the aggregator includes an aggregation engine that implements a relational database of condition information. For example, the relational database can include tables for conditions and rows that represent specific ranges within the condition, which can then be condition keys for states. In one embodiment, the aggregator generates a state as a "condition" for execution by a power converter or as input for other decision logic.

In one embodiment, the aggregator receives or accesses rate information that indicates a value or price of power, 1310. In one embodiment, the aggregator uses the rate information to forecast a best operation based on the value of power in light of the aggregated condition information, or state previously determined, 1312. In one embodiment, the aggregator access prior history information about the operation or operating conditions of the consumer node or operation of the local control node, 1314. In one embodiment, the aggregator computes a forward looking prediction based on the aggregation information and/or the forecast information in light of the historical information, 1316.

In one embodiment, the aggregator generates one or more controls for interface hardware based on the computed action(s), and/or predictions, 1318. Thus, the aggregator can evaluate grid condition information and local load and operating conditions together, and can modify the evaluation by rate information and/or historical information. The aggregator can control an interface with converter/inverter hardware to provide power to local capacity and/or to the grid in accordance with the operation computed based on the information, 1320. In accordance with the operation, one or more power converters control the flow of power within a node and/or between the node and the grid.

Figure 14:
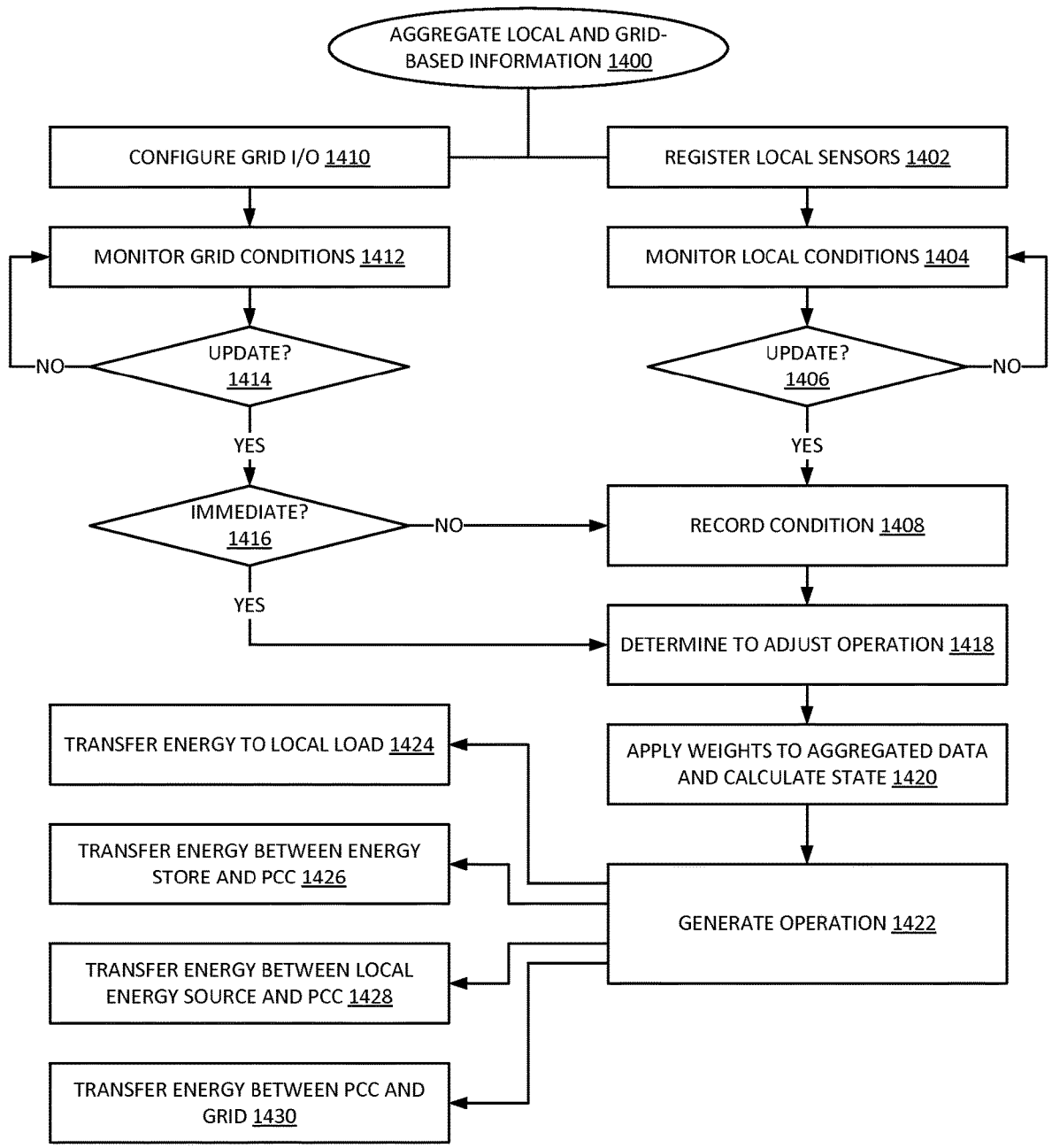
FIG. 14 is a flow diagram of an embodiment of a process for aggregating local and grid-based condition information.

FIG. 14 is a flow diagram of an embodiment of a process for aggregating local and grid-based condition information. Process 1400 for aggregating local and grid-based information to make a decision based on the aggregation of information can be performed by elements of a control node. In one embodiment, the control node includes a gateway device, which can be or include an aggregator. For simplicity, and not by way of limitation, the description of process 1400 refers to operations by an aggregator. The aggregator can be in accordance with any embodiment of an aggregator described herein. In one embodiment, the aggregation information includes information gathered by a local meter that measures local and/or external grid conditions.

In one embodiment, process 1400 includes monitoring for local sensors and monitoring for grid condition information. In one embodiment, local sensors register with the aggregator, 1402. In one embodiment, the aggregator registers the sensors to configure monitoring the data from the sensors, such as frequency of obtaining data from the sensor, and parameters for interconnecting with the sensor. The aggregator can monitor local conditions by data from the sensors, 1404. In one embodiment, the aggregator monitors the sensor until updated information is available. If there is not updated data, 1406 NO branch, the aggregator can continue to monitor the sensor for local conditions, 1404. If there is updated data, 1406 YES branch, in one embodiment, the aggregator records the condition, 1408.

In one embodiment, the aggregator also configures itself for interfacing with grid I/O (input/output), 1410. The grid I/O can enable the aggregator to receive information about grid conditions from outside the local node of which the aggregator is a part. The aggregator can monitor the grid conditions indicated by the grid I/O, 1412. If there is not updated data, 1414 NO branch, the aggregator continues to monitor the grid I/O, 1412. If there is updated data available, 1414 YES branch, in one embodiment, the aggregator determines whether the grid I/O indicates a condition that needs to be addressed immediately. If there is not an immediate need for action, 1416 NO branch, the aggregator can record the grid conditions indicated from the external I/O, 1408.

After recording conditions from the grid and from local sensors, the aggregator can determine to adjust operation at the local control node, 1418. In one embodiment, the aggregator makes a determination based on a schedule. In one embodiment, the aggregator makes a determination of what action to take on each data event, where a data event can be when updated data is available. In one embodiment, if data received from the grid needs immediate attention, 1416 YES branch, the aggregator can determine to adjust the operation of a converter of the control node, 1418.

In one embodiment, the aggregator applies weights to aggregated data and calculates a state or condition, 1420. In one embodiment, the weights can be applied to factor one item of data more than another. In one embodiment where grid information is received requiring immediate attention, the "weight" on that data can be to cause the control node to immediately comply with the request. In one embodiment, the aggregator generates one or more operations to be executed at the consumer node, 1422. In one embodiment, the calculation of state and/or the generation of an operation to execute can include the execution of a heuristics decision algorithm that searches a best match output scenario based on the input conditions.

The operations can be executed by a power converter of the control node, which can be a device of the control node itself, and/or of equipment within the consumer node. In one embodiment, the operations can include one or more of transferring energy to a local load, 1424, transferring energy between a local energy store and the PCC, 1426, transferring energy between the local energy source and the PCC, 1428, and/or transferring energy between the PCC and the grid, 1430. In one embodiment, energy transfer to the local load can include real power, reactive power, and/or a mix of real and reactive power. In one embodiment, the power is generated to offset the complex vector of a load's energy signature. In one embodiment, transferring energy between the energy store and the PCC can include charging the battery or powering a load from the energy store. In one embodiment, the energy transfer between the local energy source and the PCC can include real power, reactive power, or a mix. In one embodiment, the control node can deliver power to the grid via the PCC, which can be real power or ancillary services.

Figure 15:
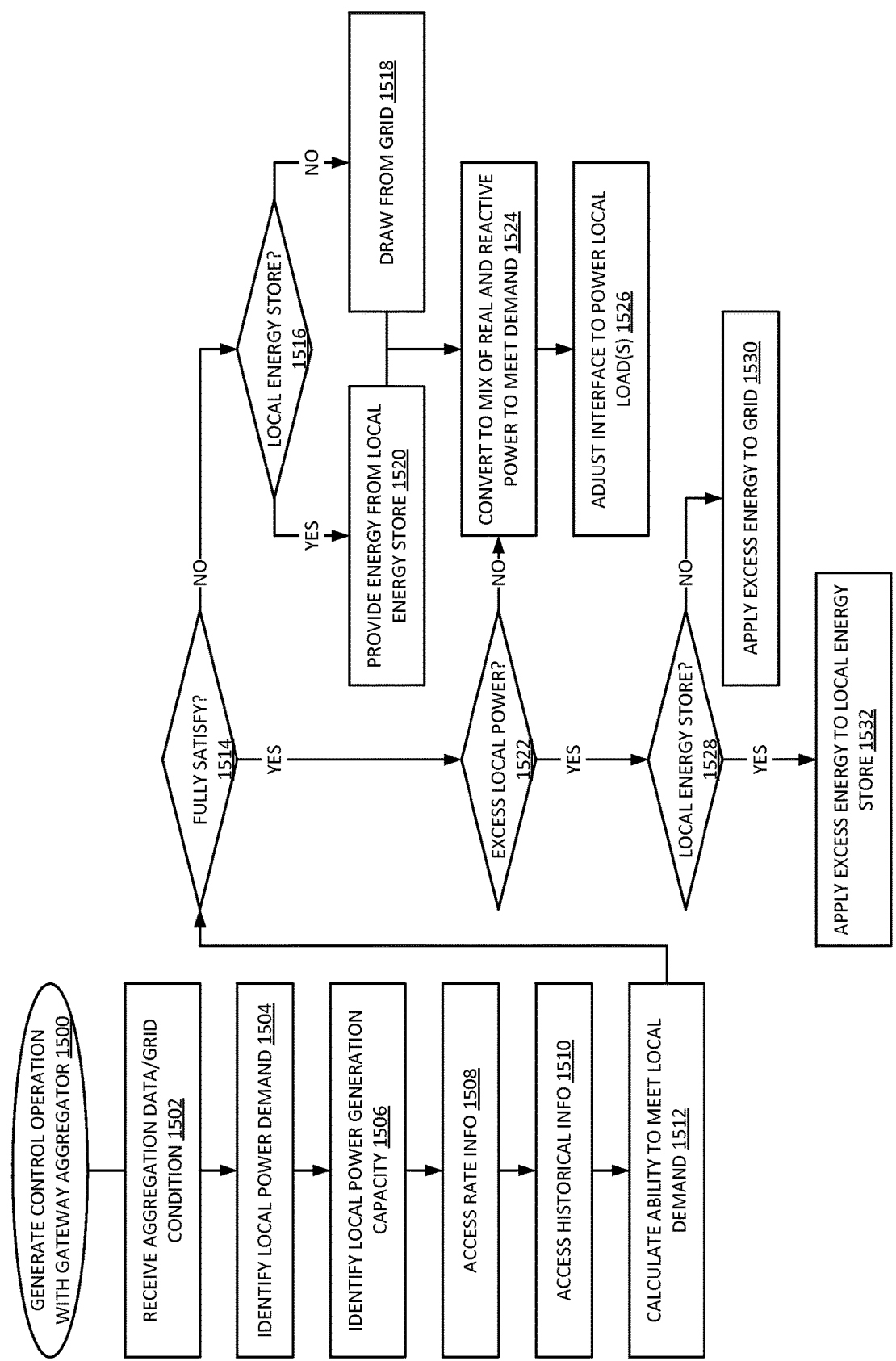
FIG. 15 is a flow diagram of an embodiment of a process for generating a grid control operation with an aggregator gateway.

FIG. 15 is a flow diagram of an embodiment of a process for generating a grid control operation with an aggregator gateway. Process 1500 for generating control operations with a gateway aggregator can be performed by elements of a control node. In one embodiment, the control node includes a gateway device, which can be or include an aggregator. For simplicity, and not by way of limitation, the description of process 1500 refers to operations by an aggregator. The aggregator can be in accordance with any embodiment of an aggregator described herein. In one embodiment, the aggregation information includes information gathered by a local meter that measures local and/or external grid conditions.

In one embodiment, a controller or control logic of an aggregator receives aggregation data, which can include local conditions and grid conditions, 1502. The aggregation data can include or can accompany local load demand. In one embodiment, the aggregator identifies local power demand, 1504. The local power demand can be measured by a local meter in accordance with any embodiment described herein. In one embodiment, the aggregator can also identify local power generation capacity, 1506. Certain local conditions identified by local sensors can include conditions that affect how much power can be generated by the local energy source. For example, solar intensity can determine whether a solar system can provide peak output, or something less based on the conditions.

In one embodiment, the aggregator accesses rate information, 1508. The rate information can include consumer and market pricing information. Based on rate information, the aggregator can forecast a best operation from the perspective of best monetary benefit to the consumer. In one embodiment, the aggregator accesses historical information, 1510. The historical information can indicate previous conditions, which can allow the aggregator to predict what conditions will come next. Based on the historical data, the aggregator can generate an operation that reflects a prediction of what will happen with conditions, rate, or other circumstance, or a combination of these.

In one embodiment the aggregator calculates an ability of local energy generation to meet the power demand of local loads, 1512. In one embodiment, the power from the local energy source can fully satisfy the local power demand, 1514 YES branch. If there is not enough local power to satisfy local demand, 1514 NO branch, in one embodiment, the system can determine if there is local energy storage. Local energy storage can be determined in one embodiment with local sensor data, and part of aggregation data. In one embodiment, if there is not a local energy store, 1516 NO branch, the system draws power from the grid, 1518. In one embodiment, if there is a local energy store, 1516 YES branch, the system can draw energy from the local energy store, assuming there is capacity in the energy store, 1520. The energy drawn from the energy store or the grid can be converted by a power converter to a mix of real and reactive power to meet the local demand, 1524.

If there is enough local energy to satisfy demand, 1514 YES branch, and there is not excess local power, 1522 NO branch, the local power is converted by a power converter to a mix of real and reactive power needed by the load(s), 1524. In one embodiment, if there is excess local power after satisfying the demand of local load(s), 1522 YES branch, the system can determine whether to store the excess energy in a local energy store. In one embodiment, depending on local conditions and grid conditions determined by the aggregator, the system can charge the local energy store without fully satisfying the local power demand. Thus, in one embodiment, determining whether the demand is fully satisfied, 1514, can include determining whether the full demand should be satisfied, or whether the local energy is better used in other ways (e.g., charge a local energy store with local power while drawing grid power for a load.

If the system determines to charge a local energy store with the local power, 1528 YES branch, the system charges the local energy store, 1532. In one embodiment, if the system determines not to charge the local energy store with the local power, 1528 NO branch, the system can apply excess local power to the grid, 1530. Applying the local power to the grid can include determining how to provide the energy to the grid. In one embodiment, the system applies the energy as real power. In one embodiment, the system provides ancillary services to the grid.

Figure 16:
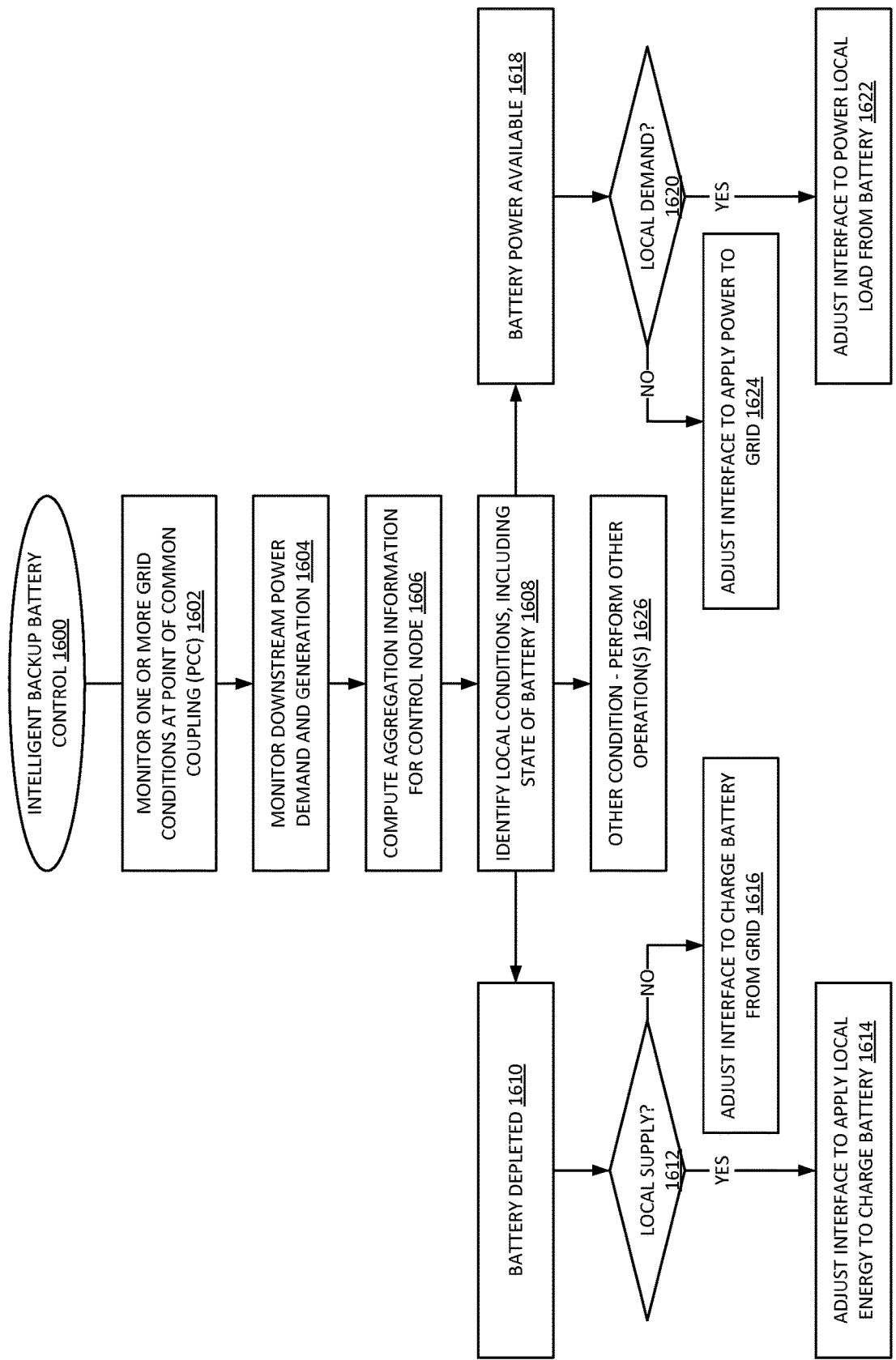
FIG. 16 is a flow diagram of an embodiment of a process for intelligent battery backup control.

FIG. 16 is a flow diagram of an embodiment of a process for intelligent battery backup control. Process 1600 for intelligent backup control can be performed by elements of a control node. In one embodiment, the control node includes a gateway device, which can be or include an aggregator, which can provide aggregation data. The control node and the gateway device can be devices in accordance with any embodiments described herein.

In one embodiment, a control node monitors one or more grid conditions at a PCC, 1602. The grid conditions can include voltage levels, phases, frequencies, or other conditions, or a combination. In one embodiment, the control node monitors downstream power demand and downstream power generation 1604. The downstream power demand represents demand for power by one or more loads, which can include other grid nodes further down a hierarchical grid network. In one embodiment, the downstream power generation represents one or more sources that generate energy. In one embodiment, determining demand can include computing and/or identifying one or more energy signatures.

In one embodiment, the control node computes aggregation information via an aggregator associated with the control node, 1606. In one embodiment, the aggregator and control node can identify local conditions, including a state of a battery or other energy backup system, 1608. While battery is specifically identified, it will be understood that the same descriptions will apply equally well to another energy storage, which can include a non-battery system. In one embodiment, if the state of the battery is that its energy reserves are at least partially depleted, 1610, in one embodiment, the control node can determine if there is local energy supply to charge the battery. If there is local supply to charge the battery, 1612 YES branch, in one embodiment, the control node adjusts an interface within the PCC to apply the local energy to charge the battery, 1614. If the battery is depleted and there is no local energy supply, 1612 NO branch, in one embodiment, the control node can determine to adjust an interface to charge the battery from the grid, 1616. In one embodiment, if there is no local supply of energy available, the control node will not charge the battery unless certain conditions are met, such as time of day, or if the battery is below a predetermined threshold of depletion, or the cost of power from the grid is within a threshold cost, or other condition, or a combination.

In one embodiment, the state of the battery is that there is battery power available, 1618. In one embodiment, the control node can determine how to use the battery power. If there is a local demand for power, 1620 YES branch, in one embodiment, the control node can adjust an interface to power the local load(s) from available battery power, 1622. In one embodiment, if there is no local demand, 1620 NO branch, but there is demand for power or services at the control node, the control node can adjust an interface to apply battery power to the grid, 1624. In one embodiment, a state of the battery can be other than depleted to be charged, and available to be used, such as depleted but not to be charged yet, or available energy to be stored and not used yet, then another condition can exist, and the control node can control operation consistent with the other condition, 1626.

In one aspect, a method for interfacing with a power grid network includes: receiving one or more external grid inputs and one or more local sensor inputs at a meter on a consumer side of a point of common coupling (PCC) to the grid network; identifying power demand for a local load coupled to the consumer side of the PCC; calculating an output power to generate with a local power converter coupled to the consumer side of the PCC, based on the one or more external grid inputs, the one or more local sensor inputs, and the power demand for the local load; and outputting power from the local power converter based on the calculated output power.

In one aspect, a consumer node in a grid network of a power grid system includes: an energy meter on a consumer side of a point of common coupling (PCC) to the grid network, the energy meter to receive one or more external grid inputs and one or more local sensor inputs, and to identify power demand for a local load coupled to the consumer side of the PCC; a local power converter coupled to the consumer side of the PCC, the power converter to control an interface to the PCC to control power flow at the PCC; and a gateway controller coupled to receive information from the energy meter, to calculate a local output power to generate, based on the one or more external grid inputs, the one or more local sensor inputs, and the power demand for the local load, and to request the power converter to output the calculated output power.

In one aspect, a power grid system includes: a local energy source coupled to a consumer side of a point of common coupling (PCC) to a grid network of the power grid system, the local energy source to generate real power; and a control node coupled to the local energy source at the PCC, the control node including an energy meter on a consumer side of a point of common coupling (PCC) to the grid network, the energy meter to receive one or more external grid inputs and one or more local sensor inputs, and to identify power demand for a local load coupled to the consumer side of the PCC; a local power converter coupled to the consumer side of the PCC, the power converter to control an interface to the PCC to control power flow at the PCC; and a gateway controller coupled to receive information from the energy meter, to calculate a local output power to generate, based on the one or more external grid inputs, the one or more local sensor inputs, and the power demand for the local load, and to request the power converter to output the calculated output power, including generating power from the local energy source.

For the method, the consumer node, and/or the power grid system of the preceding three paragraphs, the following embodiments provide examples of embodiments that can apply, and are illustrative, but not limiting. In one embodiment, the grid network comprises a utility power grid. In one embodiment, receiving the external grid inputs comprises receiving one or more of dispatch information from a central grid controller, specific control signals from a grid controller, or grid condition information from other nodes in the grid network. In one embodiment, receiving the local sensor inputs comprises receiving one or more of temperature information, or information regarding one or more conditions that affect an ability of a local energy source to generate energy. In one embodiment, calculating the output power comprises applying a decision algorithm that applies weights to the inputs based on time of day or time of year or both. In one embodiment, calculating the output power comprises applying a heuristics decision algorithm to search a best match output scenario. In one embodiment, outputting power comprises outputting power for consumption by a local load. In one embodiment, outputting power comprises outputting power to charge a local energy storage resource. In one embodiment, outputting power comprises outputting real power to a power grid market for monetary credit. In one embodiment, outputting power comprises outputting power to one or more ancillary services, including real and/or reactive power grid support, frequency support for the grid network, blackstart operation, regulation up operation, regulation down operation, or a combination.

In one aspect, a method for interfacing with a power grid network includes: monitoring local power demand and local energy generation on a consumer side of a point of common coupling (PCC) to the grid network; calculating an interface operation for a local energy storage on the consumer side of the PCC, wherein the interface operation includes accessing energy from the local energy storage or charging the local energy storage, based on the local power demand, and the local energy generation; and triggering a local power converter coupled to the consumer side of the PCC to execute the interface operation with the local energy storage.

In one aspect, a consumer node within a power grid system includes: a local energy source on a consumer side of a point of common coupling (PCC) to the grid network; a local energy store on the consumer side of the PCC; an energy conversion device on the consumer side of the PCC to execute an interface operation, including accessing energy from the local energy store or charging the local energy store, to transfer energy between the local energy store and the PCC.

In one aspect, a power grid system includes: a local energy source coupled to a consumer side of a point of common coupling (PCC) to a grid network of a utility power grid, the local energy source to generate real power; and a local energy store on the consumer side of the PCC; a control node coupled to the local energy source and the local energy store at the PCC, the control node including a metering device to monitor a grid condition on the consumer side of the PCC, wherein the grid condition indicates an electrical condition of the grid network; an energy conversion device to execute an interface operation, including accessing energy from the local energy store or charging the local energy store, to transfer energy between the local energy store and the PCC in response to a condition of the utility power grid.

For the method, the consumer node, and/or the power grid system of the preceding three paragraphs, the following embodiments provide examples of embodiments that can apply, and are illustrative, but not limiting. In one embodiment, the local energy storage comprises a battery. In one embodiment, the local energy storage comprises a non-battery energy storage system. In one embodiment, further comprising monitoring a grid condition on the consumer side of the PCC, wherein the grid condition indicates an electrical condition of the grid network; and wherein calculating the interface operation comprises generating an operation to charge the local energy storage from the grid network. In one embodiment, monitoring the grid condition comprises monitoring one or more of voltage levels, phases, or frequencies, as seen at the PCC. In one embodiment, monitoring the local energy generation comprises monitoring an amount of power generated by a local source coupled to the consumer side of the PCC that generates real power. In one embodiment, calculating the interface operation comprises generating an operation to charge the local energy storage from the grid network. In one embodiment, calculating the interface operation comprises generating an operation to charge the local energy storage from a local energy source. In one embodiment, calculating the interface operation comprises generating an operation to power a local load from the local energy storage. In one embodiment, triggering the power converter to execute the interface operation comprises triggering the power converter to generate a mix of real and reactive power. In one embodiment, calculating the interface operation comprises generating an operation to provide grid support from the local energy storage. In one embodiment, calculating an interface operation further comprises performing calculations based at least in part on aggregation data, the aggregation data including one or more of dispatch information from a central grid controller, specific control signals from a grid controller, grid condition information from other nodes in the grid network, local temperature information, or information regarding one or more local conditions that affect an amount of local energy generation.

In one aspect, a method for interfacing with a power grid network includes: receiving multiple inputs at a meter on a consumer side of a point of common coupling (PCC) to the grid network, the inputs indicating an electrical condition of the grid network and local operating conditions at the PCC; identifying power demand for a local load coupled to the consumer side of the PCC; calculating a mix of real and reactive power to output from a local energy source, based on the multiple inputs and the power demand for the local load; and outputting power from the local energy source based on the calculated output power.

In one aspect, a consumer node in a grid network of a power grid system includes: an energy meter on a consumer side of a point of common coupling (PCC) to the grid network, the energy meter to receive multiple inputs indicating an electrical condition of the grid network and local operating conditions at the PCC, and to identify power demand for a local load coupled to the consumer side of the PCC; a local power converter coupled to the consumer side of the PCC, the power converter to control an interface to the PCC to control power flow at the PCC; and a gateway controller coupled to receive information from the energy meter, to calculate a mix of real and reactive power to output from a local energy source, based on the multiple inputs and the power demand for the local load, and to request the power converter to output the calculated output power.

In one aspect, a power grid system includes: a grid connector to couple a local consumer node to a utility power grid at a consumer side of a point of common coupling (PCC); a local energy source coupled on the consumer side of the PCC; and a control node coupled to the local energy source at the PCC, the control node including an energy meter on a consumer side of a point of common coupling (PCC) to the grid network, the energy meter to receive multiple inputs indicating an electrical condition of the grid network and local operating conditions at the PCC, and to identify power demand for a local load coupled to the consumer side of the PCC; a local power converter coupled to the consumer side of the PCC, the power converter to control an interface to the PCC to control power flow at the PCC; and a gateway controller coupled to receive information from the energy meter, to calculate a mix of real and reactive power to output from the local energy source, based on the multiple inputs and the power demand for the local load, and to request the power converter to output the calculated output power.

For the method, the consumer node, and/or the power grid system of the preceding three paragraphs, the following embodiments provide examples of embodiments that can apply, and are illustrative, but not limiting. In one embodiment, the grid network comprises a utility power grid. In one embodiment, receiving the external grid inputs comprises receiving one or more of dispatch information from a central grid controller, specific control signals from a grid controller, or grid condition information from other nodes in the grid network. In one embodiment, receiving the local sensor inputs comprises receiving one or more of temperature information, or information regarding one or more conditions that affect an ability of a local energy source to generate energy. In one embodiment, calculating the output power further comprises calculating the mix of real and reactive power based at least in part on rate information indicating a value of power generated. In one embodiment, calculating the output power further comprises calculating the mix of real and reactive power based at least in part on extrapolating from historical information indicating a history of how local power demand and local power generation has occurred in the past. In one embodiment, outputting power comprises outputting power for consumption by a local load. In one embodiment, outputting power comprises outputting power to charge a local energy storage resource. In one embodiment, outputting power comprises outputting real power to a power grid market for monetary credit. In one embodiment, outputting power comprises outputting power to one or more ancillary services, including real and/or reactive power grid support, frequency support for the grid network, blackstart operation, regulation up operation, regulation down operation, or a combination.

In one aspect, a method for interfacing with a power grid network includes: receiving grid condition information at a meter on a consumer side of a point of common coupling (PCC) to the grid network, wherein the grid condition information includes an aggregation of multiple inputs indicating an electrical condition of the grid network and local operating conditions at the PCC, including local power demand; accessing rate information for the grid network, the rate information indicating a consumer power price and a market power price; calculating an output power to generate with a local power converter coupled to the consumer side of the PCC, based on the multiple inputs, the local power demand, and the rate information; and outputting power from the local power converter based on the calculated output power.

In one aspect, a consumer node in a grid network of a power grid system includes: an energy meter on a consumer side of a point of common coupling (PCC) to the grid network, the energy meter to receive grid condition information including an aggregation of multiple inputs indicating an electrical condition of the grid network and local operating conditions at the PCC, including local power demand; a local power converter coupled to the consumer side of the PCC, the power converter to control an interface to the PCC to control power flow at the PCC; and a gateway controller coupled to receive information from the energy meter, to calculate an output power to generate with the local power converter, based on the multiple inputs, the local power demand, and the rate information, and to request the power converter to output the calculated output power.

In one aspect, a power grid system includes: a grid connector to couple a local consumer node to a utility power grid at a consumer side of a point of common coupling (PCC) a local energy source coupled on the consumer side of the PCC; and a control node coupled to the local energy source at the PCC, the control node including an energy meter on a consumer side of a point of common coupling (PCC) to the grid network, the energy meter to receive grid condition information including an aggregation of multiple inputs indicating an electrical condition of the grid network and local operating conditions at the PCC, including local power demand; a local power converter coupled to the consumer side of the PCC, the power converter to control an interface to the PCC to control power flow at the PCC; and a gateway controller coupled to receive information from the energy meter, to calculate an output power to generate with the local power converter including power from the local energy source, based on the multiple inputs, the local power demand, and the rate information, and to request the power converter to output the calculated output power.

For the method, the consumer node, and/or the power grid system of the preceding three paragraphs, the following embodiments provide examples of embodiments that can apply, and are illustrative, but not limiting. In one embodiment, receiving the external grid inputs comprises receiving one or more of dispatch information from a central grid controller, specific control signals from a grid controller, or grid condition information from other nodes in the grid network. In one embodiment, receiving the local sensor inputs comprises receiving one or more of temperature information, or information regarding one or more conditions that affect an ability of a local energy source to generate energy. In one embodiment, accessing the rate information comprises obtaining rate information from a realtime market rate source. In one embodiment, accessing the rate information comprises accessing rate information indicating prices for consumer real power and for market real power. In one embodiment, accessing the rate information comprises accessing rate information indicating prices for consumer reactive power and for ancillary markets. In one embodiment, calculating the output power further comprises performing forward prediction based on historical data monitored at the meter. In one embodiment, calculating the output power comprises determining operations to be performed by multiple power converters coupled to the consumer side of the PCC. In one embodiment, outputting power further comprises activating a local energy storage for the calculated output power. In one embodiment, outputting power comprises outputting power for consumption by a local capacity. In one embodiment, outputting power comprises outputting to a power grid market or to one or more ancillary services, including real and/or reactive power grid support, frequency support for the grid network, blackstart operation, regulation up operation, regulation down operation, or a combination.

In one aspect, a method for interfacing with a power grid network includes: receiving grid condition information at a meter on a consumer side of a point of common coupling (PCC) to the grid network, wherein the grid condition information includes an aggregation of multiple inputs indicating an electrical condition of the grid network and local operating conditions at the PCC, including local power demand; accessing operating history for a local control node, the operating history including records of previous power output for various grid conditions and operating conditions at the PCC; calculating an output power to generate with a local power converter coupled to the consumer side of the PCC, based on the multiple inputs, the local power demand, and the operating history; and outputting power from the local power converter based on the calculated output power.

In one aspect, a consumer node in a grid network of a power grid system includes: an energy meter on a consumer side of a point of common coupling (PCC) to the grid network, the energy meter to receive grid condition information including an aggregation of multiple inputs indicating an electrical condition of the grid network and local operating conditions at the PCC, including local power demand; a local power converter coupled to the consumer side of the PCC, the power converter to control an interface to the PCC to control power flow at the PCC; a memory device to store operating history for the consumer node including records of previous power output for various grid conditions and operating conditions at the PCC; and a gateway controller coupled to receive information from the energy meter, to calculate an output power to generate with the local power converter, based on the multiple inputs, the local power demand, and the operating history, and to request the power converter to output the calculated output power.

In one aspect, a power grid system includes: a grid connector to couple a local consumer node to a utility power grid at a consumer side of a point of common coupling (PCC); a local energy source coupled on the consumer side of the PCC; and a control node coupled to the local energy source at the PCC, the control node including an energy meter on a consumer side of a point of common coupling (PCC) to the grid network, the energy meter to receive grid condition information including an aggregation of multiple inputs indicating an electrical condition of the grid network and local operating conditions at the PCC, including local power demand; a local power converter coupled to the consumer side of the PCC, the power converter to control an interface to the PCC to control power flow at the PCC; a memory device to store operating history for the consumer node including records of previous power output for various grid conditions and operating conditions at the PCC; and a gateway controller coupled to receive information from the energy meter, to calculate an output power to generate with the local power converter including from the local energy source, based on the multiple inputs, the local power demand, and the operating history, and to request the power converter to output the calculated output power.

For the method, the consumer node, and/or the power grid system of the preceding three paragraphs, the following embodiments provide examples of embodiments that can apply, and are illustrative, but not limiting. In one embodiment, receiving the external grid inputs comprises receiving one or more of dispatch information from a central grid controller, specific control signals from a grid controller, or grid condition information from other nodes in the grid network. In one embodiment, receiving the local sensor inputs comprises receiving one or more of temperature information, or information regarding one or more conditions that affect an ability of a local energy source to generate energy. In one embodiment, accessing the operating history comprises accessing operating conditions based on time of day. In one embodiment, accessing the operating history comprises accessing operating conditions based on time of year. In one embodiment, calculating the output power further comprises accessing rate information indicating prices for consumer real power, market real power, consumer reactive power, and ancillary markets. In one embodiment, accessing the operating history comprises accessing historical rate information. In one embodiment, calculating the output power comprises determining operations to be performed by multiple power converters coupled to the consumer side of the PCC. In one embodiment, outputting power further comprises activating a local energy storage for the calculated output power. In one embodiment, outputting power comprises outputting power for consumption by a local capacity. In one embodiment, outputting power comprises outputting to a power grid market or to one or more ancillary services, including real and/or reactive power grid support, frequency support for the grid network, blackstart operation, regulation up operation, regulation down operation, or a combination.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for interfacing with a power grid network, comprising:

receiving one or more external grid inputs at an internal meter on a consumer side of a point of common coupling (PCC) to the grid network, the internal meter separate from a grid meter coupled to the PCC on a grid side which measures power delivered by the grid side for a utility to charge a consumer for the power delivered, the external grid inputs to indicate an electrical condition at the PCC as seen from the grid side;

monitoring realtime energy demand and generation on the consumer side of the PCC with the internal meter, including identifying power demand for a local load coupled to the PCC on the consumer side and identifying capacity available from a local energy source coupled to the PCC on the consumer side;

calculating an output power to generate from the local energy source with a local power converter coupled to the consumer side of the PCC, based on the one or more external grid inputs and the capacity available from the local energy source and the power demand for the local load as monitored by the internal meter, the calculating including a determination of a ratio of real and reactive power for power downstream from the PCC as seen from the consumer side; and outputting power from the local power converter based on the calculated output power to generate reactive power to provide downstream from the PCC to satisfy reactive power demand for the local load.

2. The method of claim 1, wherein the grid network comprises a utility power grid.

3. The method of claim 1, wherein receiving the external grid inputs comprises receiving one or more of dispatch information from a central grid controller, specific control signals from a grid controller, or grid condition information from other nodes in the grid network.

4. The method of claim 1, further comprising receiving local sensor inputs at the internal meter including one or more of temperature information, or information regarding one or more conditions that affect an ability of a local energy source to generate energy.

5. The method of claim 1, wherein calculating the output power comprises applying a decision algorithm that applies weights to the inputs based on time of day or time of year or both.

6. The method of claim 1, wherein calculating the output power including the determination comprises applying a heuristics decision algorithm to search a best match output scenario.

7. The method of claim 1, wherein outputting power comprises outputting power for consumption by the local load.

8. The method of claim 1, wherein outputting power comprises outputting power to charge a local energy storage resource.

9. The method of claim 1, wherein outputting power comprises outputting real power to a power grid market for monetary credit.

10. The method of claim 1, wherein outputting power comprises outputting power to one or more ancillary services, including real and/or reactive power grid support, frequency support for the grid network, blackstart operation, regulation up operation, regulation down operation, or a combination.

11. A consumer node in a grid network of a power grid system, comprising:

an energy meter on a consumer side of a point of common coupling (PCC) to the grid network, the energy meter separate from a grid meter coupled to the PCC on a grid side which measures power delivered by the grid side for a utility to charge a consumer for the power delivered, the energy meter to receive one or more external grid inputs, and to monitor realtime energy demand and generation on the consumer side of the PCC with the internal meter, including identification of power demand for a local load coupled to the PCC on the consumer side and identification of capacity available from a local energy source coupled to the PCC on the consumer side;

a local power converter coupled to the PCC on the consumer side, the power converter to control power flow at the PCC from the consumer side; and a gateway controller coupled to receive information from the energy meter, to calculate a local output power to generate from the local energy source, based on the one or more external grid inputs and the capacity available from the local energy source and the power demand for the local load as monitored by the internal meter, and to request the power converter to output the calculated output power to generate reactive power to provide downstream from the PCC to satisfy reactive power demand for the local load, the calculation including a determination of a ratio of real and reactive power for power downstream from the PCC as seen from the consumer side.

12. The consumer node of claim 11, wherein the energy meter is to receive one or more of dispatch information from a central grid controller, specific control signals from a grid controller, or grid condition information from other nodes in the grid network as the external grid inputs.

13. The consumer node of claim 11, wherein the energy meter is to receive local sensor inputs including one or more of temperature information, or information regarding one or more conditions that affect an ability of a local energy source to generate energy as the local sensor inputs.

14. The consumer node of claim 11, wherein the power converter is to output power for local capacity.

15. The consumer node of claim 11, wherein the power converter is to output power to a power grid market, or to one or more ancillary services, including real and/or reactive power grid support, frequency support for the grid network, blackstart operation, regulation up operation, regulation down operation, or a combination.

16. A power grid system, comprising:

a local energy source coupled to a consumer side of a point of common coupling (PCC) to a grid network of the power grid system, the local energy source to generate real power; and a control node coupled to the local energy source at the PCC, the control node including an energy meter on a consumer side of a point of common coupling (PCC) to the grid network, the energy meter separate from a grid meter coupled to the PCC on a grid side which measures power delivered by the grid side for a utility to charge a consumer for the power delivered, the energy meter to receive one or more external grid inputs, and to monitor realtime energy demand and generation on the consumer side of the PCC with the internal meter, including identification of power demand for a local load coupled to the PCC on the consumer side and identification of capacity available from a local energy source coupled to the PCC on the consumer side;

a local power converter coupled to the PCC on the consumer side, the power converter to control power flow at the PCC from the consumer side; and a gateway controller coupled to receive information from the energy meter, to calculate a local output power to generate from the local energy source, based on the one or more external grid inputs and the capacity available from the local energy source and the power demand for the local load as monitored by the internal meter, and to request the power converter to output the calculated output power to generate reactive power to provide downstream from the PCC to satisfy reactive power demand for the local load, the calculation including a determination of a ratio of real and reactive power for power downstream from the PCC as seen from the consumer side.

17. The power grid system of claim 16, wherein the energy meter is to receive one or more of dispatch information from a central grid controller, specific control signals from a grid controller, or grid condition information from other nodes in the grid network as the external grid inputs.

18. The consumer node of claim 11, wherein the energy meter is to receive local sensor inputs including one or more of temperature information, or information regarding one or more conditions that affect an ability of a local energy source to generate energy as the local sensor inputs.

19. The power grid system of claim 16, wherein the power converter is to output power for local capacity.

20. The power grid system of claim 16, wherein the power converter is to output power to a power grid market, or to one or more ancillary services, including real and/or reactive power grid support, frequency support for the grid network, blackstart operation, regulation up operation, regulation down operation, or a combination.

\* \* \* \* \*